(12) United States Patent
Fife

(10) Patent No.: US 12,086,744 B2
(45) Date of Patent: Sep. 10, 2024

(54) MACHINE LEARNING OF ELECTRICAL SYSTEM BEHAVIOR, AND RELATED SYSTEMS, APPARATUSES, AND METHODS

(71) Applicant: Enel X North America, Inc., Boston, MA (US)

(72) Inventor: John Michael Fife, Bend, OR (US)

(73) Assignee: Enel X North America, Inc., Boston, MA (US)

( * ) Notice: Subject to any disclaimer, the term of this patent is extended or adjusted under 35 U.S.C. 154(b) by 229 days.

(21) Appl. No.: 17/447,263

(22) Filed: Sep. 9, 2021

(65) Prior Publication Data

US 2022/0138653 A1    May 5, 2022

Related U.S. Application Data

(63) Continuation of application No. 16/565,214, filed on Sep. 9, 2019, now Pat. No. 11,144,858, which is a
(Continued)

(51) Int. Cl.
*G06Q 10/0631*    (2023.01)
*G01R 31/367*    (2019.01)
(Continued)

(52) U.S. Cl.
CPC ..... *G06Q 10/06313* (2013.01); *G01R 31/367* (2019.01); *G01R 31/392* (2019.01);
(Continued)

(58) Field of Classification Search
CPC ....... G06Q 10/06313; G06Q 10/06315; G06Q 30/0206; G06Q 50/06; G01R 31/367;
(Continued)

(56) References Cited

U.S. PATENT DOCUMENTS

| 4,475,685 A | 10/1984 | Grimado et al. |
| 5,644,173 A | 7/1997 | Elliason et al. |

(Continued)

FOREIGN PATENT DOCUMENTS

JP    2015-090709 A    5/2015

OTHER PUBLICATIONS

International Search Report and Written Opinion dated Jul. 11, 2017for PCT/US2017/024948.
(Continued)

*Primary Examiner* — Ziaul Karim
(74) *Attorney, Agent, or Firm* — Foley & Lardner LLP

(57) ABSTRACT

The present disclosure is directed to machine learning of electrical power system behavior, and related systems, apparatuses, and methods. A controller of an electrical power system includes a data storage device configured to store model data indicating a model load power consumed by loads of the electrical power system. The controller also includes a processor configured to determine current data including current load power consumed by the loads, modify the model data by aggregating the model data with the current data, and determine a set of control values for a set of control variables to effectuate a change to operation of the electrical power system based, at least in part, on the model data.

18 Claims, 26 Drawing Sheets

Related U.S. Application Data continuation of application No. 15/474,729, filed on Mar. 30, 2017, now Pat. No. 10,410,153.

(60) Provisional application No. 62/328,476, filed on Apr. 27, 2016, provisional application No. 62/317,372, filed on Apr. 1, 2016.

(51) Int. Cl.
| | |
|---|---|
| *G01R 31/392* | (2019.01) |
| *G05B 13/02* | (2006.01) |
| *G05B 13/04* | (2006.01) |
| *G05B 17/02* | (2006.01) |
| *G05F 1/66* | (2006.01) |
| *G06Q 30/0201* | (2023.01) |
| *G06Q 50/06* | (2012.01) |
| *H02J 3/00* | (2006.01) |
| *H02J 3/14* | (2006.01) |
| *H02J 3/28* | (2006.01) |
| *H02J 3/46* | (2006.01) |
| *H02J 7/00* | (2006.01) |
| *H02J 13/00* | (2006.01) |

(52) U.S. Cl.
CPC ....... *G05B 13/021* (2013.01); *G05B 13/0265* (2013.01); *G05B 13/041* (2013.01); *G05B 13/048* (2013.01); *G05B 17/02* (2013.01); *G05F 1/66* (2013.01); *G06Q 10/06315* (2013.01); *G06Q 30/0206* (2013.01); *G06Q 50/06* (2013.01); *H02J 3/00* (2013.01); *H02J 3/004* (2020.01); *H02J 3/14* (2013.01); *H02J 3/28* (2013.01); *H02J 3/46* (2013.01); *H02J 13/00* (2013.01); *H02J 13/00028* (2020.01); *H02J 7/0025* (2020.01); *H02J 13/00001* (2020.01); *H02J 2203/20* (2020.01); *H02J 2310/64* (2020.01); *Y02B 10/30* (2013.01); *Y02B 70/3225* (2013.01); *Y04S 20/222* (2013.01)

(58) Field of Classification Search
CPC .............. G01R 31/392; G05B 13/021; G05B 13/0265; G05B 13/041; G05B 13/048; G05B 17/02; G05F 1/66; H02J 3/00; H02J 3/004; H02J 3/14; H02J 3/28; H02J 3/46; H02J 13/00; H02J 13/00028; H02J 7/0025; H02J 13/00001; H02J 2203/20; H02J 2310/64; H02J 3/003; Y02B 10/30; Y02B 70/3225; Y04S 20/222; Y04S 50/10; Y04S 10/14

See application file for complete search history.

(56) References Cited

U.S. PATENT DOCUMENTS

| | | | |
|---|---|---|---|
| 5,873,251 A | 2/1999 | Iino | |
| 7,797,062 B2 | 9/2010 | Discenzo et al. | |
| 8,019,445 B2 | 9/2011 | Marhoefer | |
| 8,212,527 B2 | 7/2012 | Zhang et al. | |
| 8,600,511 B2 | 12/2013 | Yared et al. | |
| 8,600,571 B2 | 12/2013 | Dillon et al. | |
| 8,886,361 B1 | 11/2014 | Harmon et al. | |
| 9,020,800 B2 | 4/2015 | Shelton et al. | |
| 9,436,179 B1 | 9/2016 | Turney et al. | |
| 9,865,024 B2 | 1/2018 | Mokhtari et al. | |
| 10,395,196 B2 | 8/2019 | Fife | |
| 2003/0208113 A1* | 11/2003 | Mault | G16H 40/63 600/316 |
| 2005/0065674 A1 | 3/2005 | Houpt et al. | |
| 2006/0276938 A1* | 12/2006 | Miller | H02J 3/008 705/412 |
| 2007/0088534 A1* | 4/2007 | MacArthur | G05B 13/0295 703/17 |
| 2008/0058997 A1 | 3/2008 | Timblin | |
| 2009/0048716 A1 | 2/2009 | Marhoefer | |
| 2009/0319090 A1 | 12/2009 | Dillon et al. | |
| 2010/0100248 A1 | 4/2010 | Minto et al. | |
| 2010/0174643 A1 | 7/2010 | Schaefer et al. | |
| 2010/0179704 A1 | 7/2010 | Ozog | |
| 2010/0198421 A1 | 8/2010 | Fahimi et al. | |
| 2011/0071695 A1 | 3/2011 | Kouroussis et al. | |
| 2011/0106328 A1 | 5/2011 | Zhou et al. | |
| 2011/0231320 A1 | 9/2011 | Irving | |
| 2012/0296482 A1 | 11/2012 | Steven et al. | |
| 2012/0302092 A1 | 11/2012 | Kaps et al. | |
| 2012/0303300 A1 | 11/2012 | McDonald et al. | |
| 2012/0319642 A1 | 12/2012 | Suyama et al. | |
| 2012/0323389 A1 | 12/2012 | Shelton et al. | |
| 2013/0013121 A1 | 1/2013 | Henze et al. | |
| 2013/0030590 A1 | 1/2013 | Prosser | |
| 2013/0079939 A1 | 3/2013 | Darden et al. | |
| 2013/0158755 A1 | 6/2013 | Tang et al. | |
| 2013/0166081 A1 | 6/2013 | Sanders et al. | |
| 2013/0166084 A1 | 6/2013 | Sedighy et al. | |
| 2013/0166234 A1 | 6/2013 | Chou et al. | |
| 2013/0226358 A1 | 8/2013 | Rudkevich et al. | |
| 2013/0226637 A1 | 8/2013 | Bozchalui et al. | |
| 2013/0253718 A1* | 9/2013 | Meagher | G05B 17/02 700/291 |
| 2013/0253898 A1 | 9/2013 | Meagher et al. | |
| 2013/0261817 A1 | 10/2013 | Detmers et al. | |
| 2013/0261823 A1 | 10/2013 | Krok et al. | |
| 2013/0274935 A1 | 10/2013 | Deshpande et al. | |
| 2013/0346139 A1 | 12/2013 | Steven et al. | |
| 2014/0006331 A1 | 1/2014 | Bai et al. | |
| 2014/0018971 A1 | 1/2014 | Ellis et al. | |
| 2014/0039965 A1 | 2/2014 | Steven et al. | |
| 2014/0058572 A1 | 2/2014 | Stein et al. | |
| 2014/0136178 A1* | 5/2014 | Meagher | G06N 20/00 703/18 |
| 2014/0167705 A1 | 6/2014 | Chang et al. | |
| 2014/0167750 A1 | 6/2014 | Akieda et al. | |
| 2014/0236369 A1 | 8/2014 | Kearns et al. | |
| 2014/0244193 A1 | 8/2014 | Balasingam et al. | |
| 2014/0266054 A1 | 9/2014 | Faries et al. | |
| 2014/0277797 A1 | 9/2014 | Mokhtari et al. | |
| 2014/0281645 A1* | 9/2014 | Sen | H02J 3/003 713/340 |
| 2014/0350743 A1 | 11/2014 | Asghari et al. | |
| 2014/0365022 A1 | 12/2014 | Ghosh et al. | |
| 2015/0002105 A1 | 1/2015 | Kelly | |
| 2015/0115710 A1 | 4/2015 | Tuerk et al. | |
| 2015/0127425 A1 | 5/2015 | Greene et al. | |
| 2015/0268307 A1 | 9/2015 | Inguva et al. | |
| 2015/0317589 A1 | 11/2015 | Anderson et al. | |
| 2015/0355655 A1 | 12/2015 | Wang et al. | |
| 2016/0011274 A1 | 1/2016 | Morita et al. | |
| 2016/0034835 A1 | 2/2016 | Levi et al. | |
| 2016/0041575 A1 | 2/2016 | Tadano | |
| 2016/0047862 A1 | 2/2016 | Shimizu et al. | |
| 2016/0177681 A1 | 6/2016 | Smith et al. | |
| 2016/0377686 A1 | 12/2016 | Uchida et al. | |
| 2017/0003150 A1 | 1/2017 | Noboa et al. | |
| 2017/0099056 A1 | 4/2017 | Vickery et al. | |
| 2017/0103483 A1 | 4/2017 | Drees et al. | |
| 2017/0285111 A1 | 10/2017 | Fife | |
| 2017/0285587 A1 | 10/2017 | Fife | |
| 2017/0285678 A1 | 10/2017 | Fife | |
| 2017/0286882 A1 | 10/2017 | Fife | |
| 2017/0288399 A1 | 10/2017 | Fife | |
| 2017/0288455 A1* | 10/2017 | Fife | G01R 31/392 |
| 2019/0042992 A1 | 2/2019 | Fife | |
| 2019/0340555 A1 | 11/2019 | Fife | |

(56) References Cited

U.S. PATENT DOCUMENTS

2020/0169116 A1  5/2020  Fife et al.
2020/0303300 A1  9/2020  Kato

OTHER PUBLICATIONS

Dufo-Lopez, R., 'Optimisation of size and control of grid-connected storage under real time electricity pricing conditions', Applied Energy, 2015, vol. 140, pp. 395-408, DOI: 10.1016/j.apenergy.2014.12.012.

Koller, M. et al., 'Defining a degradation cost function for optimal control of a battery energy storage system', 2013 IEEE Grenoble Conference, 2013, pp. 1-6, DOI: 10.1109/PTC.2013.6652329.

Lee, et al., "Optimized Control Strategy for Hybrid Energy System", Jun. 2015, 9th International Conference on Power Electronics-ECCE Asia, p. 2496-2500 IEEE Transactions on Industrial Informatics, vol. 7, No (Year 2015).

Palensky, et al., "Demand Side Management: Demand Response, Intelligent Energy Systems, and Smart Loads", Aug. 2011, IEEE Transactions on Industrial Information, vol. 7, No. 3, p. 381-388 (Year: 2011).

\* cited by examiner b) Control Diagram

MACHINE LEARNING OF ELECTRICAL SYSTEM BEHAVIOR, AND RELATED SYSTEMS, APPARATUSES, AND METHODS

RELATED APPLICATIONS

This application is a continuation of U.S. application Ser. No. 16/565,214 titled "Machine Learning of Electrical Power System Behavior, and Related Systems, Apparatuses, and Methods," filed Sep. 9, 2019, which is a continuation of U.S. application Ser. No. 15/474,729 titled "Machine Learning of Electrical Power System Behavior, and Related Systems, Apparatuses, and Methods," filed Mar. 30, 2017, which claims benefit of priority under 35 U.S.C. 119(e) to U.S. Provisional Patent Application No. 62/317,372, titled "Economically Optimal Control of Electrical Systems," filed Apr. 1, 2016, and U.S. Provisional Patent Application No. 62/328,476, titled "Demand Charge Reduction using Simulation-Based Demand Setpoint Determination," filed Apr. 27, 2016. The subject matter of each of the foregoing applications is hereby incorporated herein by reference to the extent such subject matter is not inconsistent herewith.

TECHNICAL FIELD

The present disclosure is directed to systems and methods for control of an electrical system, and more particularly to controllers and methods of controllers for controlling an electrical system.

BACKGROUND

Electricity supply and delivery costs continue to rise, especially in remote or congested areas. Moreover, load centers (e.g., population centers where electricity is consumed) increasingly demand more electricity. In the U.S. energy infrastructure is such that power is mostly produced by resources inland, and consumption of power is increasing at load centers along the coasts. Thus, transmission and distribution (T&D) systems are needed to move the power from where it's generated to where it's consumed at the load centers. As the load centers demand more electricity, additional T&D systems are needed, particularly to satisfy peak demand. However, a major reason construction of additional T&D systems is unwise and/or undesirable is because full utilization of this infrastructure is really only necessary during relatively few peak demand periods, and would otherwise be unutilized or underutilized. Justifying the significant costs of constructing additional T&D resources may make little sense when actual utilization may be relatively infrequent.

Distributed energy storage is increasingly seen as a viable means for minimizing rising costs by storing electricity at the load centers for use during the peak demand times. An energy storage system (ESS) can enable a consumer of energy to reduce or otherwise control a net consumption from an energy supplier. For example, if electricity supply and/or delivery costs are high at a particular time of day, an ESS, which may include one or more batteries or other storage devices, can generate/discharge electrical energy at that time when costs are high in order to reduce the net consumption from the supplier. Likewise, when electricity rates are low, the ESS may charge so as to have reserve energy to be utilized in a later scenario as above when supply and/or delivery costs are high.

Presently available automatic controllers of electrical systems utilize rule sets and iteration to find an operating command that in its simplest form can be a single scalar value that specifies the charge (or discharge) power setting of a battery. The main drawbacks of this existing approach are that it doesn't necessarily provide economically optimal control considering all costs and benefits, rule sets become complex quickly, even for just two value streams (which makes the algorithm difficult to build and maintain), and this approach is not easily scalable to new rate tariffs or other markets or value streams (rule sets must be rewritten).

An economically optimizing automatic controller may be beneficial and may be desirable to enable intelligent actions to be taken to more effectively utilize controllable components of an electrical system, and without the aforementioned drawbacks.

BRIEF DESCRIPTION OF THE DRAWINGS

Additional aspects and advantages will be apparent from the following detailed description of preferred embodiments, which proceeds with reference to the accompanying drawings, in which.

DETAILED DESCRIPTION

As electricity supply and delivery costs increase, especially in remote or congested areas, distributed energy storage is increasingly seen as a viable means for reducing those costs. The reasons are numerous, but primarily an energy storage system (ESS) gives a local generator or consumer the ability to control net consumption and delivery of electrical energy at a point of interconnection, such as a building's service entrance in example implementations where an ESS is utilized in an apartment building or office building. For example, if electricity supply and/or delivery costs (e.g., charges) are high at a particular time of day, an ESS can generate/discharge electrical energy from a storage system at that time to reduce the net consumption of a consumer (e.g., a building), and thus reduce costs to the consumer. Likewise, when electricity rates are low, the ESS may charge its storage system which may include one or more batteries or other storage devices; the lower-cost energy stored in the ESS can then be used to reduce net consumption and thus costs to the consumer at times when the supply and/or delivery costs are high. There are many ways an ESS can provide value.

Figure 24:
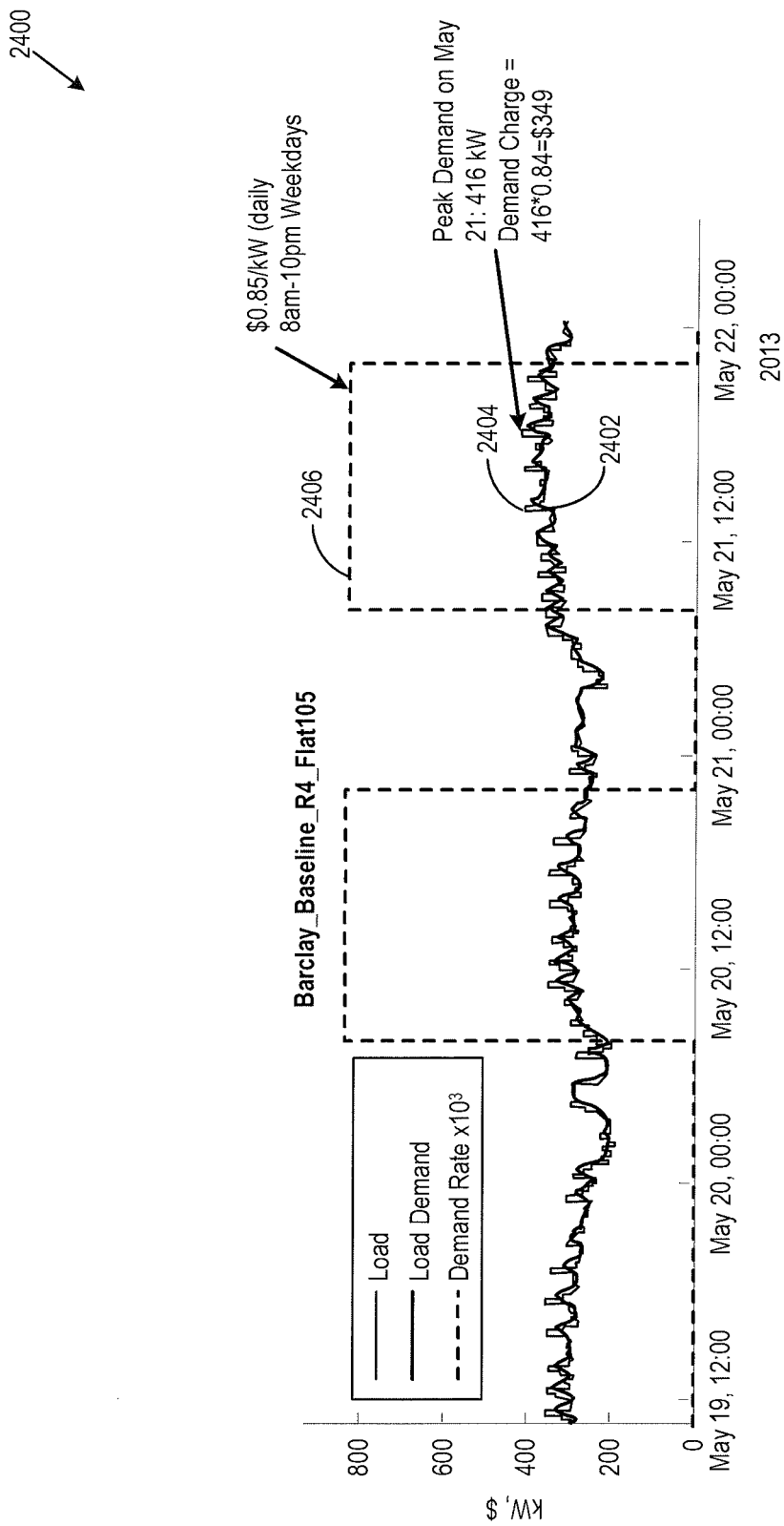
FIG. 24 is a graph illustrating how demand charges impact energy costs of a customer.

One possible way in which ESSs can provide value (e.g., one or more value streams) is by reducing time-of-use (ToU) supply charges. ToU supply charges are typically pre-defined in a utility's tariff document by one or more supply rates and associated time windows. ToU supply charges may be calculated as the supply rate multiplied by the total energy consumed during the time window. ToU supply rates in the United States may be expressed in dollars per kilowatt-hour ($/kWh). The ToU supply rates and time windows may change from time to time, for example seasonally, monthly, daily, or hourly. Also, multiple ToU supply rates and associated time windows may exist and may overlap. ToU supply rates are time-varying which makes them different from "flat" supply rates that are constant regardless of time of use. An example of ToU charges and the impact on customer energy costs is illustrated in FIG. 24 and described more fully below with reference to the same. An automatic controller may be beneficial and may be desirable to enable intelligent actions to be taken as frequently as may be needed to utilize an ESS to reduce ToU supply charges.

Another possible way in which ESSs can provide value is by reducing demand charges. Demand charges are electric utility charges that are based on the rate of electrical energy consumption (also called "demand") during particular time windows (which we will call "demand windows"). A precise definition of demand and the formula for demand charges may be defined in a utility's tariff document. For example, a tariff may specify that demand be calculated at given demand intervals (e.g., 15-minute intervals, 30-minute intervals, 40-minute intervals, 60-minute intervals, 120-minute intervals, etc.). The tariff may also define demand as being the average rate of electrical energy consumption over a previous period of time (e.g., the previous 15 minutes, 30 minutes, 40 minutes, etc.). The previous period of time may or may not coincide with the demand interval. Demand may be expressed in units of power such as kilowatts (kW) or megawatts (MW). The tariff may describe one or more demand rates, each with an associated demand window (e.g., a period of time during which a demand rate applies). The demand windows may be contiguous or noncontiguous and may span days, months, or any other total time interval per the tariff. Also, one or more demand window may overlap which means that, at a given time, more than one demand rate may be applicable. Demand charges for each demand window may be calculated as a demand rate multiplied by the maximum demand during the associated demand window. Demand rates in the United States may be expressed in dollars per peak demand ($/kW). An example of demand charges is shown in FIG. 24 and described more fully below with reference to the same. As can be appreciated, demand tariffs may change from time to time, or otherwise vary, for example annually, seasonally, monthly, or daily. An automatic controller may be beneficial and may be desirable to enable intelligent actions to be taken as frequently as may be needed to utilize an ESS to reduce demand charges.

Another possible way in which ESSs can provide value is through improving utilization of local generation by: (a) maximizing self-consumption of renewable energy, or (b) reducing fluctuations of a renewable generator such as during cloud passage on solar photovoltaic (PV) arrays. An automatic controller may be beneficial and may be desirable to enable intelligent actions to be taken to effectively and more efficiently utilize locally generated power with an ESS.

Another possible way in which ESSs can provide value is through leveraging local contracted or incentive maneuvers. For example New York presently has available a Demand Management Program (DMP) and a Demand Response Program (DRP). These programs, and similar programs, offer benefits (e.g., a statement credit) or other incentives for consumers to cooperate with the local utility(ies). An automatic controller may be beneficial and may be desirable to enable intelligent actions to be taken to utilize an ESS to effectively leverage these contracted or incentive maneuvers.

Still another possible way in which ESSs can provide value is through providing reserve battery capacity for backup power in case of loss of supply. An automatic controller may be beneficial and may be desirable to enable intelligent actions to be taken to build and maintain such reserve battery backup power with an ESS.

As can be appreciated, an automatic controller that can automatically operate an electrical system to take advantage of any one or more of these value streams using an ESS may be desirable and beneficial.

Controlling Electrical Systems

An electrical system, according to some embodiments, may include one or more electrical loads, generators, and ESSs. An electrical system may include all three of these components (loads, generators, ESSs), or may have varying numbers and combinations of these components. For example, an electrical system may have loads and an ESS, but no local generators (e.g., photovoltaic, wind). The electrical system may or may not be connected to an electrical utility distribution system (or "grid"). If not connected to an electrical utility distribution system, it may be termed "off-grid."

An ESS of an electrical system may include one or more storage devices and any number of power conversion devices. The power conversion devices are able to transfer energy between an energy storage device and the main electrical power connections that in turn connect to the electrical system loads and, in some embodiments, to the grid. The energy storage devices may be different in different implementations of the ESS. A battery is a familiar example of a chemical energy storage device. For example, in one embodiment of the present disclosure, one or more electric vehicle batteries is connected to an electrical system and can be used to store energy for later use by the electrical system. A flywheel is an example of a mechanical energy storage device.

Figure 1:
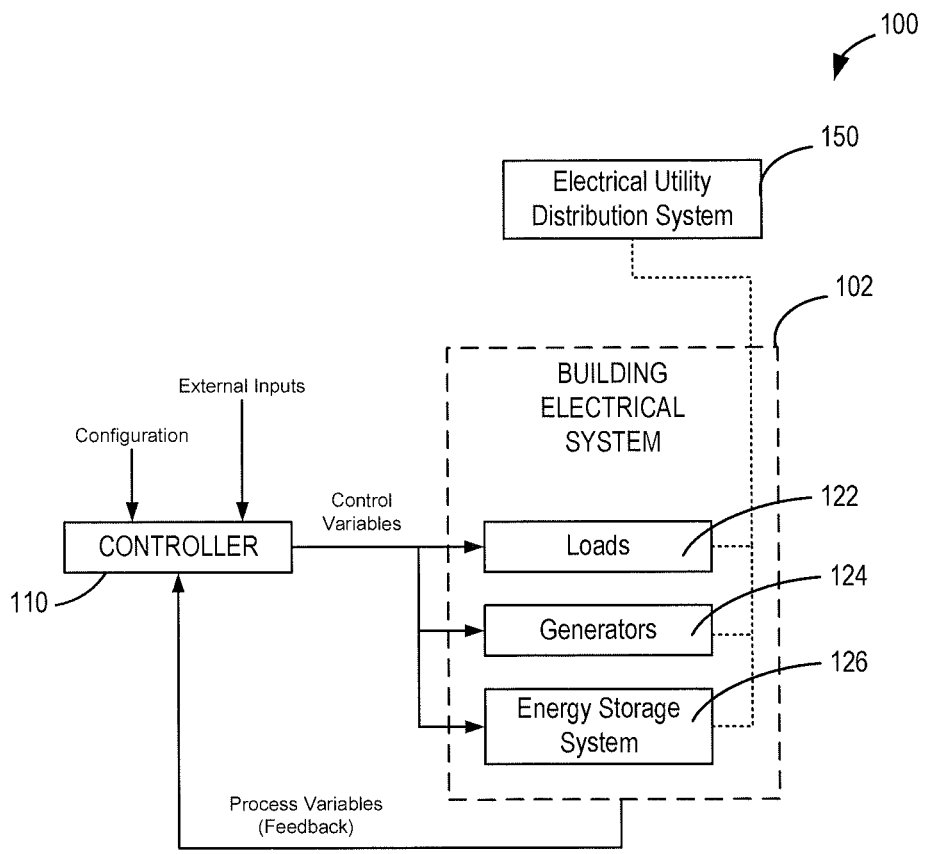
FIG. 1 is a block diagram illustrating a system architecture of a controllable electrical system, according to one embodiment of the present disclosure.

FIG. 1 is a control diagram of an electrical system 100, according to one embodiment of the present disclosure. Stated otherwise, FIG. 1 is a representative diagram of a system architecture of an electrical system 100 including a controller 110, according to one embodiment. The electrical system 100 comprises a building electrical system 102 that is controlled by the controller 110. The building electrical system 102 includes one or more loads 122, one or more generators 124, and an energy storage system (ESS) 126. The building electrical system 102 is coupled to an electrical utility distribution system 150, and therefore may be considered on-grid. Similar electrical systems exist for other applications such as a photovoltaic generator plant and an off-grid building.

In the control diagram of FIG. 1, the controller 110 is shown on the left-hand side and the building electrical system 102, sometimes called the "plant," is on the right-hand side. The controller 110 may include electronic hardware and software in one embodiment. In one example arrangement, the controller 110 includes one or more processors and suitable storage media, which stores programming in the form of executable instructions which are executed by the processors to implement the control processes. In some embodiments, the building electrical system 102 is the combination of all local loads 122, local generators 124, and the ESS 126.

Loads are consumers of electrical energy within an electrical system. Examples of loads are air conditioning systems, motors, electric heaters, etc. The sum of the loads' electricity consumption rates can be measured in units of power (e.g. kW) and simply called "load" (e.g., a building load).

Generators may be devices, apparatuses, or other means for generating electrical energy within an electrical system. Examples are solar photovoltaic systems, wind generators, combined heat and power (CHP) systems, and diesel generators or "gen-sets." The sum of electric energy generation rates of the generators 124 can be measured in units of power (e.g., kW) and simply referred to as "generation."

As can be appreciated, loads may also generate at certain times. An example may be an elevator system that is capable of regenerative operation when the carriage travels down.

Unadjusted net power may refer herein to load minus generation in the absence of active control by a controller described herein. For example, if at a given moment a building has loads consuming 100 kW, and a solar photovoltaic system generating at 25 kW, the unadjusted net power is 75 kW. Similarly, if at a given moment a building has loads consuming 70 kW, and a solar photovoltaic system generating at 100 kW, the unadjusted net power is −30 kW. As a result, the unadjusted net power is positive when the load energy consumption exceeds generation, and negative when the generation exceeds the load energy consumption.

ESS power refers herein to a sum of a rate of electric energy consumption of an ESS. If ESS power is positive, an ESS is charging (consuming energy). If ESS power is negative, an ESS is generating (delivering energy).

Adjusted net power refers herein to unadjusted net power plus the power contribution of any controllable elements such as an ESS. Adjusted net power is therefore the net rate of consumption of electrical energy of the electrical system considering all loads, generators, and ESSs in the system, as controlled by a controller described herein.

Unadjusted demand is demand defined by the locally applicable tariff, but only based on the unadjusted net power. In other words, unadjusted demand does not consider the contribution of any ESS.

Adjusted demand or simply "demand" is demand as defined by the locally applicable tariff, based on the adjusted net power, which includes the contribution from any and all controllable elements such as ESSs. Adjusted demand is the demand that can be monitored by the utility and used in the demand charge calculation.

Referring again to FIG. 1, the building electrical system 102 may provide information to the controller 110, such as in a form of providing process variables. The process variables may provide information, or feedback, as to a status of the building electrical system 102 and/or one or more components (e.g., loads, generators, ESSs) therein. For example, the process variable may provide one or more measurements of a state of the electrical system. The controller 110 receives the process variables for determining values for control variables to be communicated to the building electrical system 102 to effectuate a change to the building electrical system 102 toward meeting a controller objective for the building electrical system 102. For example, the controller 110 may provide a control variable to adjust the load 122, to increase or decrease generation by the generator 124, and to utilize (e.g., charge or discharge) the ESS 126. The controller 110 may also receive a configuration (e.g., a set of configuration elements), which may specify one or more constraints of the electrical system 102. The controller 110 may also receive external inputs (e.g., weather reports, changing tariffs, fuel costs, event data), which may inform the determination of the values of the control variables. A set of external inputs may be received by the controller 110. The set of external inputs may provide indication of one or more conditions that are external to the controller and the electrical system.

As noted, the controller 110 may attempt to meet certain objectives by changing a value associated with one or more control variables, if necessary. The objectives may be predefined, and may also be dependent on time, on any external inputs, on any process variables that are obtained from the building electrical system 102, and/or on the control variables themselves. Some examples of controller objectives for different applications are:

Minimize demand (kW) over a prescribed time interval;

Minimize demand charges ($) over a prescribed time interval;

Minimize total electricity charges ($) from the grid;

Reduce demand (kW) from the grid by a prescribed amount during a prescribed time window; and Maximize the life of the energy storage device.

Objectives can also be compound—that is, a controller objective can be comprised of multiple individual objectives. One example of a compound objective is to minimize demand charges while maximizing the life of the energy storage device. Other compound objectives including different combinations of the individual objectives are possible.

The inputs that the controller 110 may use to determine (or otherwise inform a determination of) the control variables can include configuration, external inputs, and process variables.

Process variables are typically measurements of the electrical system state and are used by the controller 110 to, among other things, determine how well its objectives are being met. These process variables may be read and used by the controller 110 to generate new control variable values. The rate at which process variables are read and used by the controller 110 depends upon the application but typically ranges from once per millisecond to once per hour. For battery energy storage system applications, the rate is often between 10 times per second and once per 15 minutes. Examples of process variables may include:

Unadjusted net power

Unadjusted demand

Adjusted net power

Demand

Load (e.g., load energy consumption for one or more loads)

Generation for one or more loads

Actual ESS charge or generation rate for one or more ESS

Frequency

Energy storage device state of charge (SoC) (%) for one or more ESS

Energy storage device temperature (deg. C.) for one or more ESS

Electrical meter outputs such as kilowatt-hours (kWh) or demand.

A configuration received by the controller 110 (or input to the controller 110) may include or be received as one or more configuration elements (e.g., a set of configuration elements). The configuration elements may specify one or more constraints associated with operation of the electrical system. The configuration elements may define one or more cost elements associated with operation of the electrical system 102. Each configuration element may set a status, state, constant or other aspect of the operation of the electrical system 102. The configuration elements may be values that are typically constant during the operation of the controller 110 and the electrical system 102 at a particular location. The configuration elements may specify one or more constraints of the electrical system and/or specify one or more cost elements associated with operation of the electrical system.

Examples of configuration elements may include:

ESS type (for example if a battery: chemistry, manufacturer, and cell model)

ESS configuration (for example, if a battery: number of cells in series and parallel) and constraints (such as maximum charge and discharge powers)

ESS efficiency properties

ESS degradation properties (as a function of SoC, discharge or charge rate, and time)

Electricity supply tariff (including ToU supply rates and associated time windows)

Electricity demand tariff (including demand rates and associated time windows)

Electrical system constraints such as minimum power import

ESS constraints such as SoC limits or power limits

Historic data such as unadjusted net power or unadjusted demand, weather data, and occupancy Operational constraints such as a requirement for an ESS to have a specified minimum amount of energy at a specified time of day.

External inputs are variables that may be used by the controller 110 and that may change during operation of the controller 110. Examples are weather forecasts (e.g., irradiance for solar generation and wind speeds for wind generation) and event data (e.g., occupancy predictions). In some embodiments, tariffs (e.g., demand rates defined therein) may change during the operation of the controller 110, and may therefore be treated as an external input.

The outputs of the controller 110 are the control variables that can affect the electrical system behavior. Examples of control variables are:

ESS power command (kW or %). For example, an ESS power command of 50 kW would command the ESS to charge at a rate of 50 kW, and an ESS power command of −20 kW would command the ESS to discharge at a rate of 20 kW.

Building or subsystem net power increase or reduction (kW or %)

Renewable energy increase or curtailment (kW or %). For example a photovoltaic (PV) system curtailment command of −100 kW would command a PV system to limit generation to no less than −100 kW. Again, the negative sign is indicative of the fact that that the value is generative (non-consumptive).

In some embodiments, control variables that represent power levels may be signed, e.g., positive for consumptive or negative for generative.

In one illustrative example, consider that an objective of the controller 110 may be to reduce demand charges while preserving battery life. In this example, only the ESS may be controlled. To accomplish this objective, the controller should have knowledge of a configuration of the electrical system 102, such as the demand rates and associated time windows, the battery capacity, the battery type and arrangement, etc. Other external inputs may also be used to help the controller 110 meet its objectives, such as a forecast of upcoming load and/or forecast of upcoming weather (e.g., temperature, expected solar irradiance, wind). Process variables from the electrical system 102 that may be used may provide information concerning a net electrical system power or energy consumption, demand, a battery SoC, an unadjusted building load, and an actual battery charge or discharge power. In this one illustrative example, the control variable may be a commanded battery ESS's charge or discharge power. In order to more effectively meet the objective, the controller 110 may continuously track the peak net building demand (kW) over each applicable time window, and use the battery to charge or generate at appropriate times to limit the demand charges. In one specific example scenario, the ESS may be utilized to attempt to achieve substantially flat (or constant) demand from the electrical utility distribution system 150 (e.g., the grid) during an applicable time window when a demand charge applies.

Figure 2:
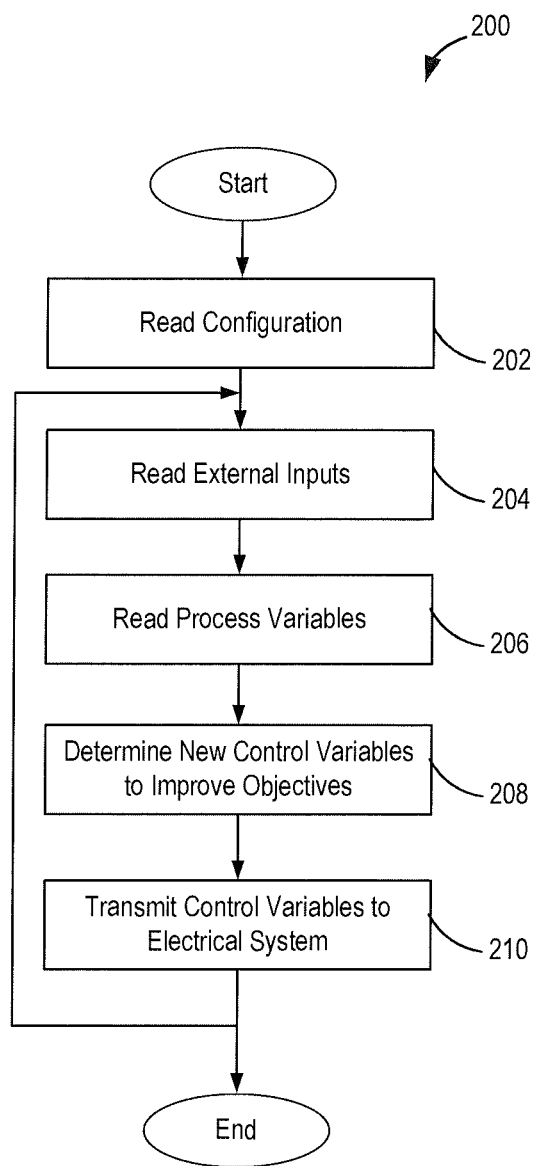
FIG. 2 is a flow diagram of a method or process of controlling an electrical system, according to one embodiment of the present disclosure.

FIG. 2 is a flow diagram of a method 200 or process of controlling an electrical system, according to one embodiment of the present disclosure. The method 200 may be implemented by a controller of an electrical system, such as the controller 110 of FIG. 1 controlling the building electrical system 102 of FIG. 1. The controller may read 202 or otherwise receive a configuration (e.g., a set of configuration elements) of the electrical system.

The controller may also read 204 or otherwise receive external inputs, such as weather reports (e.g., temperature, solar irradiance, wind speed), changing tariffs, event data (e.g., occupancy prediction, sizeable gathering of people at a location or venue), and the like.

The controller may also read 206 or otherwise receive process variables, which may be measurements of a state of the electrical system and indicate, among other things, how well objectives of the controller are being met. The process variables provide feedback to the controller as part of a feedback loop.

Using the configuration, the external inputs, and/or the process variables, the controller determines 208 new control variables to improve achievement of objectives of the controller. Stated differently, the controller determines 208 new values for each control variable to effectuate a change to the electrical system toward meeting one or more controller objectives for the electrical system. Once determined, the control variables (or values thereof) are transmitted 210 to the electrical system or components of the electrical system. The transmission 210 of the control variables to the electrical system allows the electrical system to process the control variables to determine how to adjust and change state, which thereby can effectuate the objective(s) of the controller for the electrical system.

Optimization

In some embodiments, the controller uses an algorithm (e.g., an optimization algorithm) to determine the control variables, for example, to improve performance of the electrical system. Optimization can be a process of finding a variable or variables at which a function f(x) is minimized or maximized. An optimization may be made with reference to such global extrema (e.g., global maximums and/or minimums), or even local extrema (e.g., local maximums and/or minimums). Given that an algorithm that finds a minimum of a function can generally also find a maximum of the same function by negating it, this disclosure will sometimes use the terms "minimization," "maximization," and "optimization," interchangeably.

An objective of optimization may be economic optimization, or determining economically optimal control variables to effectuate one or more changes to the electrical system to achieve economic efficiency (e.g., to operate the electrical system at as low a cost as may be possible, given the circumstances). As can be appreciated, other objectives may be possible as well (e.g., prolong equipment life, system reliability, system availability, fuel consumption, etc.).

The present disclosure includes embodiments of controllers that optimize a single parameterized cost function (or objective function) for effectively utilizing controllable components of an electrical system in an economically optimized manner. Various forms of optimization may be utilized to economically optimize an electrical system.

Continuous Optimization

A controller according to some embodiments of the present disclosure may use continuous optimization to determine the control variables. More specifically, the controller may utilize a continuous optimization algorithm, for example, to find economically optimal control variables to effectuate one or more changes to the electrical system to achieve economic efficiency (e.g., to operate the electrical system at as low a cost as may be possible, given the circumstances). The controller, in one embodiment, may operate on a single objective: optimize overall system economics. Since this approach has only one objective, there can be no conflict between objectives. And by specifying system economics appropriately in the cost function (or objective function), all objectives and value streams can be considered simultaneously based on their relative impact on a single value metric. The cost function may be continuous in its independent variables x, and optimization can be executed with a continuous optimization algorithm that is effective for continuous functions. Continuous optimization differs from discrete optimization, which involves finding the optimum value from a finite set of possible values or from a finite set of functions.

As can be appreciated, in another embodiment, the cost function may be discontinuous in x (e.g., discrete or finite) or piecewise continuous in x, and optimization can be executed with an optimization algorithm that is effective for discontinuous or piecewise continuous functions.

Constrained Optimization

In some embodiments, the controller utilizes a constrained optimization to determine the control variables. In certain embodiments, the controller may utilize a constrained continuous optimization to find a variable or variables $x_{opt}$ at which a continuous function f(x) is minimized or maximized subject to constraints on the allowable x.

Figure 3:
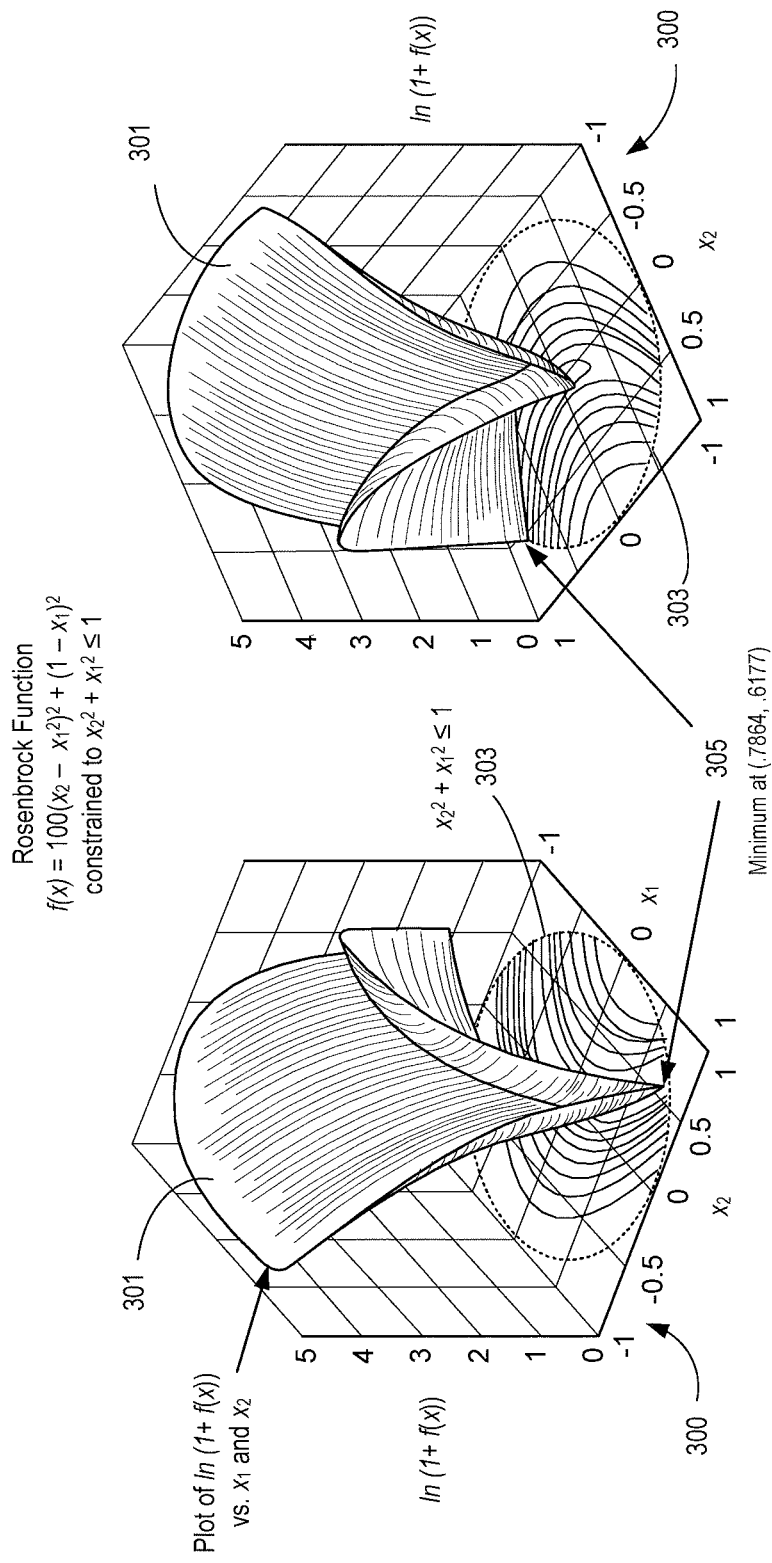
FIG. 3 is a graph illustrating an example of nonlinear continuous optimization to determine a minimum or maximum of an equation given specific constraints.
Figure 4:
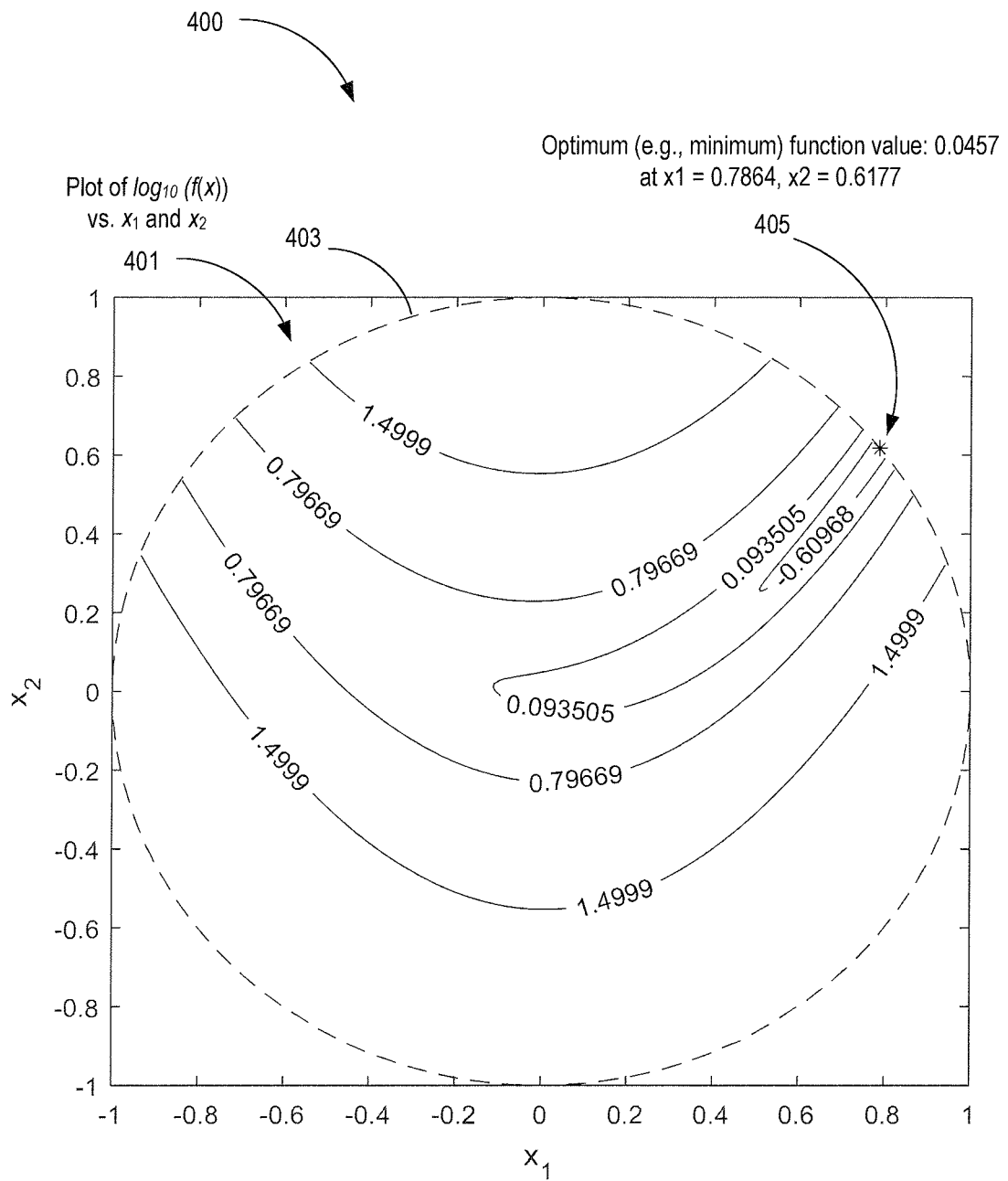
FIG. 4 is a contour plot illustrating an example of nonlinear continuous optimization of FIG. 3 to determine a minimum or maximum of an equation given specific constraints.

FIGS. 3 and 4 show a graph 300 and a contour plot 400 illustrating an example of a constrained continuous optimization to determine a minimum or maximum of an equation given specific constraints. Possible constraints may be an equation or inequality. FIGS. 3 and 4 consider an equation:

$$f(x)=100(x_2-x_1^2)^2+(1-x_1)^2.$$

The set x includes the independent variables $x_1$, $x_2$. Constraints are defined by the equation:

$$x_2^2+x_1^2 \leq 1.$$

FIG. 3 illustrates a curve 301 of ln(1+f(x)) vs. $x_1$ and $x_2$ and illustrates the constraint within an outlined unit disk 303. A minimum 305 is at (0.7864, 0.6177).

FIG. 4 illustrates a contour plot 401 of $\log_{10}(f(x))$, which also shows the constraints within the outlined unit disk 403 and a minimum 405 is at (0.7864, 0.6177).

Constrained continuous optimization algorithms are useful in many areas of science and engineering to find a "best" or "optimal" set of values that affect a governing of a process. They are particularly useful in cases where a single metric is to be optimized, but the relationship between that metric and the independent (x) variables is so complex that a "best" set of x values cannot easily be found symbolically in closed form. For example, consider a malignant tumor whose growth rate over time is dependent upon pH and on the concentration of a particular drug during various phases of growth. The equation describing growth rate as a function of the pH and drug concentration is known and can be written down but may be complex and nonlinear. It might be very difficult or impossible to solve the equation in closed form for the best pH and drug concentration at various stages of growth. It may also depend on external factors such as temperature. To solve this problem, pH and drug concentration at each stage of growth can be combined into an x vector with two elements. Since the drug concentration and pH may have practical limits, constraints on x can be defined. Then the function can be minimized using constrained continuous optimization. The resulting x where the growth rate is minimized contains the "best" pH and drug concentration to minimize growth rate. Note this approach can find the optimum pH and drug concentration (to machine precision) from a continuum of infinite possibilities of pH and drug concentration, not just from a predefined finite set of possibilities.

Generalized Optimization

A controller according to some embodiments of the present disclosure may use generalized optimization to determine the control variables. More specifically, the controller may utilize a generalized optimization algorithm, for example, to find economically optimal control variables to effectuate one or more changes to the electrical system to achieve economic efficiency (e.g., to operate the electrical system at as low a cost as may be possible, given the circumstances).

An algorithm that can perform optimization for an arbitrary or general real function f(x) of any form may be called a generalized optimization algorithm. An algorithm that can perform optimization for a general continuous real function f(x) of a wide range of possible forms may be called a generalized continuous optimization algorithm. Some generalized optimization algorithms may be able to find optimums for functions that may not be continuous everywhere, or may not be differentiable everywhere. Some generalized optimization algorithms are available as pre-written software in many languages including Java®, C++, and MATLAB®. They often use established and well-documented iterative approaches to find a function's minimum.

As can be appreciated, a generalized optimization algorithm may also account for constraints, and therefore be a generalized constrained optimization algorithm.

Nonlinear Optimization

A controller according to some embodiments of the present disclosure may use nonlinear optimization to determine the control variables. More specifically, the controller may utilize a nonlinear optimization algorithm, for example, to find economically optimal control variables to effectuate one or more changes to the electrical system to achieve economic efficiency (e.g., to operate the electrical system at as low a cost as may be possible, given the circumstances).

Nonlinear continuous optimization or nonlinear programming is similar to generalized continuous optimization and describes methods for optimizing continuous functions that may be nonlinear, or where the constraints may be nonlinear.

Multi-Variable Optimization

A controller according to some embodiments of the present disclosure may use multi-variable optimization to determine the control variables. More specifically, the controller may utilize a multivariable optimization algorithm, for example, to find economically optimal control variables to effectuate one or more changes to the electrical system to achieve economic efficiency (e.g., to operate the electrical system at as low a cost as may be possible, given the circumstances).

In the examples of FIGS. 3 and 4, the considered equation $$f(x)=100(x_2-x_1^2)^2+(1-x_1)^2$$

is a multi-variable equation. In other words, x is a set comprised of more than one element. Therefore, the optimization algorithm is "multivariable." A subclass of optimization algorithms is the multivariable optimization algorithm that can find the minimum of f(x) when x has more than one element. Thus, the example of FIGS. 3 and 4 may illustrate solving for a generalized constrained continuous multi-variable optimization problem.

Economically Optimizing Electrical System Controller

A controller, according to one embodiment of the present disclosure, will now be described to provide an example of using optimization to control an electrical system. An objective of using optimization may be to minimize the total electrical system operating cost during a period of time. For example, the approach of the controller may be to minimize the operating cost during an upcoming time domain, or future time domain, which may extend from the present time by some number of hours (e.g., integer numbers of hours, fractions of hours, or combinations thereof). As another example, the upcoming time domain, or future time domain, may extend from a future time by some number of hours. Costs included in the total electrical system operating cost may include electricity supply charges, electricity demand charges, a battery degradation cost, equipment degradation cost, efficiency losses, etc. Benefits, such as incentive payments, which may reduce the electrical system operating cost, may be incorporated (e.g., as negative numbers or values) or otherwise considered. Other cost may be associated with a change in energy in the ESS such that adding energy between the beginning and the end of the future time domain is valued. Other costs may be related to reserve energy in an ESS such as for backup power purposes. All of the costs and benefits can be summed into a net cost function, which may be referred to as simply the "cost function."

In certain embodiments, a control parameter set X can be defined (in conjunction with a control law) that is to be applied to the electrical system, how they should behave, and at what times in the future time domain they should be applied. In some embodiments, the cost function can be evaluated by performing a simulation of electrical system operation with a provided set X of control parameters. The control laws specify how to use X and the process variables to determine the control variables. The cost function can then be prepared or otherwise developed to consider the control parameter set X.

For example, a cost $f_c(X)$ may consider the control parameter values in X and return the scalar net cost of operating the electrical system with those control parameter values. All or part of the control parameter set X can be treated as a variable set $X_x$ (e.g., x as described above) in an optimization problem. The remaining part of X, $X_{logic}$, may be determined by other means such as logic (for example logic based on constraints, inputs, other control parameters, mathematical formulas, etc.). Any constraints involving $X_x$ can be defined, if so desired. Then, an optimization algorithm can be executed to solve for the optimal $X_x$. We can denote $X_{opt}$ as the combined $X_x$ and $X_{logic}$ values that minimize the cost function subject to the constraints, if any. Since $X_{opt}$ represents the control parameters, this example process fully specifies the control that will provide minimum cost (e.g., optimal) operation during the future time domain. Furthermore, to the limits of computing capability, this optimization can consider the continuous domain of possible $X_x$ values, not just a finite set of discrete possibilities. This example method continuously can "tune" possible control sets until an optimal set is found. As shorthand notation, we may refer to these certain example embodiments of an economically optimizing electrical system controller (EOESC).

Some of the many advantages of using an EOESC, according to certain embodiments, compared to other electrical system controllers are significant:

1) Any number of value streams may be represented in the cost function, giving the EOESC an ability to optimize on all possible value streams and costs simultaneously. As an example, generalized continuous optimization can be used to effectively determine the best control given both ToU supply charge reduction and demand charge reduction simultaneously, all while still considering battery degradation cost.

2) With a sufficiently robust optimization algorithm, only the cost function, control law, and control parameter definitions need be developed. Once these three components are developed, they can be relatively easily maintained and expanded upon.

3) An EOESC can yield a true economically optimum control solution to machine or processor precision limited only by the cost function, control laws, and control parameter definitions.

4) An EOESC may yield not only a control to be applied at the present time, but also the planned sequence of future controls. This means one execution of an EOESC can generate a lasting set of controls that can be used into the future rather than a single control to be applied at the present. This can be useful in case a) the optimization algorithm takes a significant amount of time to execute, or b) there is a communication interruption between the processor calculating the control parameter values and the processor interpreting the control parameters and sending control variables to the electrical system.

Figure 5:
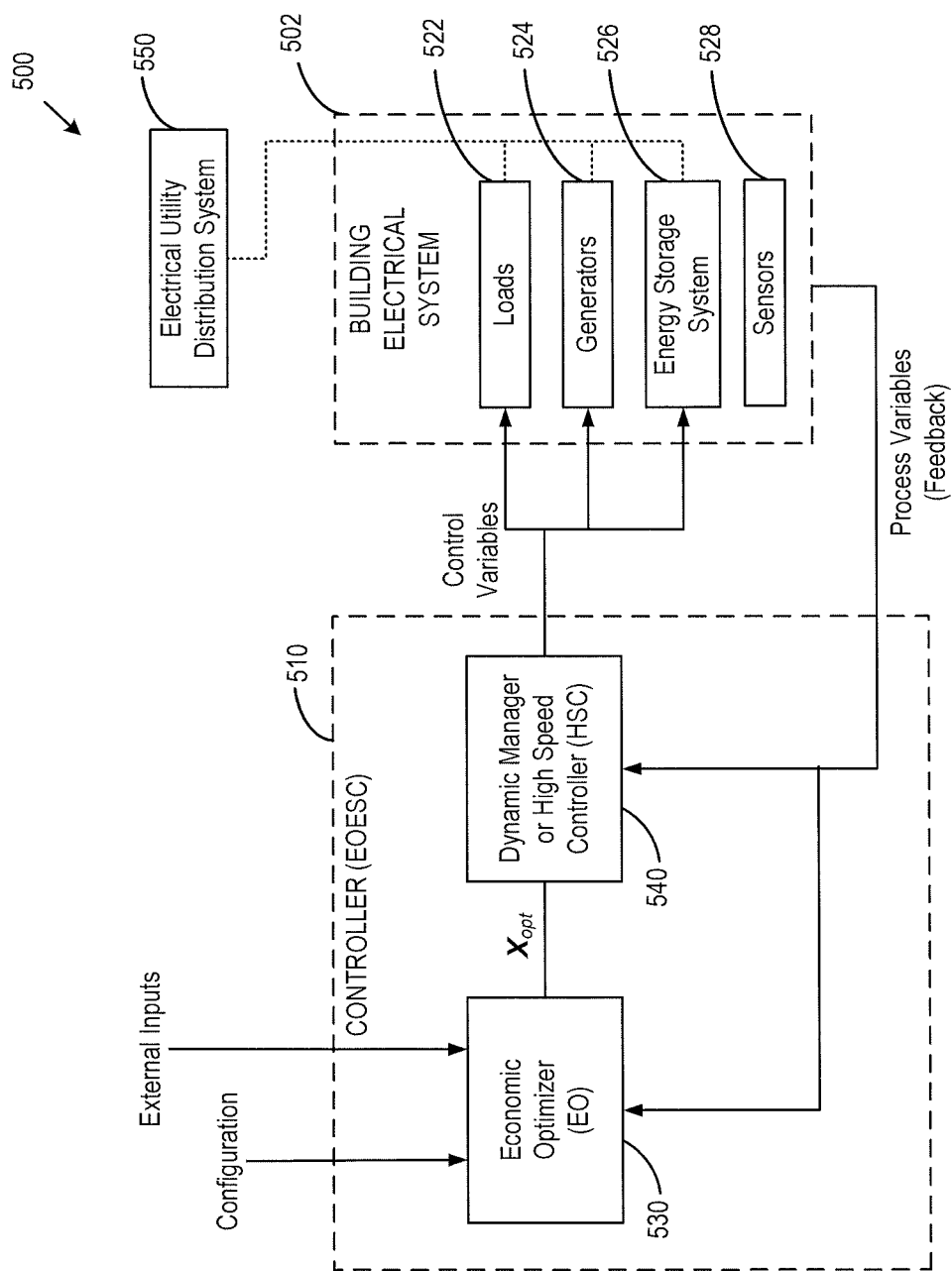
FIG. 5 is a block diagram illustrating a system architecture of a controllable electrical system, according to one embodiment of the present disclosure.

FIG. 5 is a control diagram of an electrical system 500, according to one embodiment of the present disclosure, including an EOESC 510. Stated otherwise, FIG. 5 is a diagram of a system architecture of the electrical system 500 including the EOESC 510, according to one embodiment. The electrical system 500 comprises a building electrical system 502 that is controlled by the EOESC 510. The building electrical system 502 includes one or more loads 522, one or more generators 524, an energy storage system (ESS) 526, and one or more sensors 528 (e.g., meters) to provide measurements or other indication(s) of a state of the building electrical system 502. The building electrical system 502 is coupled to an electrical utility distribution system 550, and therefore may be considered on-grid. Similar diagrams can be drawn for other applications such as a photovoltaic generator plant and an off-grid building.

The EOESC 510 receives or otherwise obtains a configuration of the electrical system, external inputs, and process variables and produces control variables to be sent to the electrical system 502 to effectuate a change to the electrical system toward meeting a controller objective for economical optimization of the electrical system, for example during an upcoming time domain. The EOESC 510 may include electronic hardware and software to process the inputs (e.g., the configuration of the electrical system, external inputs, and process variables) to determine values for each of the control variables. The EOESC 510 may include one or more processors and suitable storage media which stores programming in the form of executable instructions which are executed by the processors to implement the control processes.

In the embodiment of FIG. 5, the EOESC 510 includes an economic optimizer (EO) 530 and a dynamic manager 540 (or high speed controller (HSC)). The EO 530 according to some embodiments is presumed to have ability to measure or obtain a current date and time. The EO 530 may determine a set of values for a control parameter set X and provide the set of values and/or the control parameter set X to the HSC 540. The EO 530 uses a generalized optimization algorithm to determine an optimal set of values for the control parameter set $X_{opt}$. The HSC 540 utilizes the set of values for the control parameter set X (e.g., an optimal control parameter set $X_{opt}$) to determine the control variables to communicate to the electrical system 502. The HSC 540 in some embodiments is also presumed to have ability to measure or obtain a current date and time. The two part approach of the EOESC 510, namely the EO 530 determining control parameters and then the HSC 540 determining the control variables, enables generation of a lasting set of controls, or a control solution (or plan) that can be used into the future rather than a single control to be applied at the present. Preparing a lasting control solution can be useful if the optimization algorithm takes a significant amount of time to execute. Preparing a lasting control solution can also be useful if there is a communication interruption between the calculating of the control parameter values and the processor interpreting the control parameters and sending control variables to the electrical system 502. The two part approach of the EOESC 510 also enables the EO 530 to be disposed or positioned at a different location from the HSC 540. In this way, intensive computing operations that optimization may require can be performed by resources with higher processing capability that may be located remote from the building electrical system 502. These intensive computing operations may be performed, for example, at a data center or server center (e.g., in the cloud).

In some embodiments, a future time domain begins at the time the EO 530 executes and can theoretically extend any amount of time. In certain embodiments, analysis and experimentation suggest that a future time domain extent of 24 to 48 hours generates sufficiently optimal solutions in most cases.

As can be appreciated, the EOESC 510 of FIG. 5 may be arranged and configured differently from that shown in FIG. 5, in other embodiments. For example, instead of the EO 530 passing the control parameter set $X_{opt}$ (the full set of control parameters found by a generalized optimization algorithm of the EO 530) to the HSC 540, the EO 530 can pass a subset of $X_{opt}$ to the HSC 540. Similarly, the EO 530 can pass $X_{opt}$ and additional control parameters to the HSC 540 that are not contained in $X_{opt}$. Likewise, the EO 530 can pass modified elements of $X_{opt}$ to the HSC 540. In one embodiment, the EO 530 finds a subset $X_x$ of the optimal X, but then determines additional control parameters $X_{logic}$, and passes $X_{logic}$ together with $X_x$ to the HSC 540. In other words, in this example, the $X_x$ values are to be determined through an optimization process of the EO 530 and the $X_{logic}$ values can be determined from logic. An objective of the EO 530 is to determine the values for each control parameter whether using optimization and/or logic.

For brevity in this disclosure, keeping in mind embodiments where X consists of independent ($X_x$) parameters and dependent ($X_{logic}$) parameters, when describing optimization of a cost function versus X, what is meant is variation of the independent variables $X_x$ until an optimum (e.g., minimum) cost function value is determined. In this case, the resulting $X_{opt}$ will consist of the combined optimum $X_x$ parameters and associated $X_{logic}$ parameters.

In one embodiment, the EOESC 510 and one or more of its components are executed as software or firmware (for example stored on non-transitory media, such as appropriate memory) by one or more processors. For example, the EO 530 may comprise one or more processors to process the inputs and generate the set of values for the control parameter set X. Similarly, the HSC 540 may comprise one or more processors to process the control parameter set X and the process variables and generate the control variables. The processors may be computers, microcontrollers, CPUs, logic devices, or any other digital or analog device that can operate on pre-programmed instructions. If more than one processor is used, they can be connected electrically, wirelessly, or optically to pass signals between one another. In addition, the control variables can be communicated to the electrical system components electrically, wirelessly, or optically or by any other means. The processor has the ability to store or remember values, arrays, and matrices, which can be viewed as multi-dimensional arrays, in some embodiments. This storage may be performed using one or more memory devices, such as read access memory (RAM, disk drives, etc.).

Figure 6:
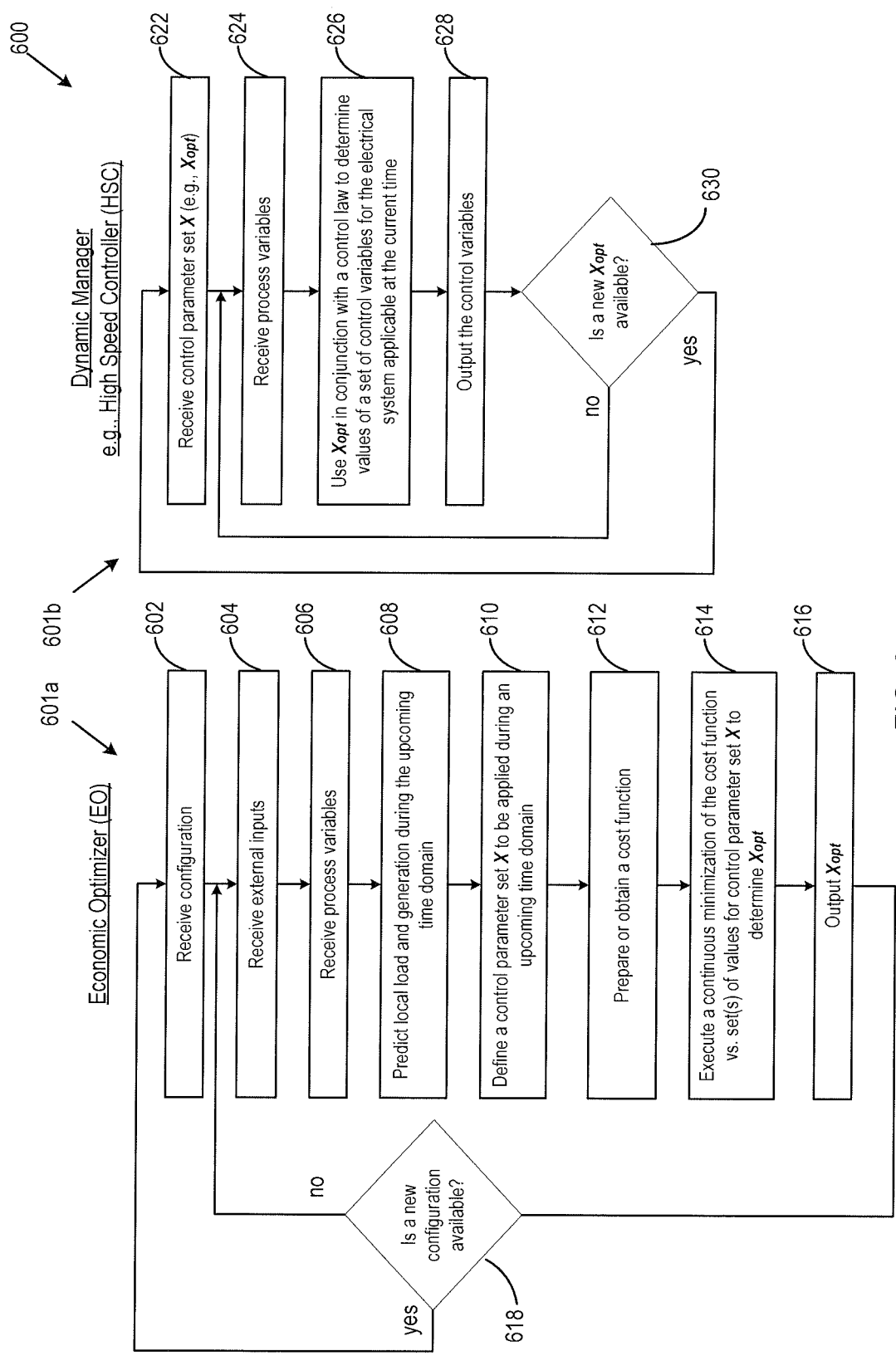
FIG. 6 is a flow diagram of a method or process of controlling an electrical system, according to one embodiment of the present disclosure.

FIG. 6 is a flow diagram of a method 600 of controlling an electrical system, according to one embodiment of the present disclosure. The method 600 includes two separate processes, namely an economic optimizer (EO) process 601*a* and a high speed controller (HSC) process 601*b*. The HSC process 601*b* may also be referred to herein as a dynamic manager process 601*b*. The HSC process 601*b* may utilize a control parameter set X determined by the EO process 601*a*. Nevertheless, the HSC process 601*b* may execute separate from, or even independent from the EO process 601*a*, based on a control parameter set X determined at an earlier time by the EO process 601*a*. Because the EO process 601*a* can run separate and distinct from the HSC process 601*b*, the execution of these processes 601*a*, 601*b* may be collocated on a single system or isolated on remote systems.

The EO process 601*a* may be a computer-implemented process executed by one or more computing devices, such as the EO 530 of FIG. 5. The EO process 601*a* may receive 602 a configuration, or a set of configuration elements, of the electrical system. The configuration may specify one or more constraints of the electrical system. The configuration may specify one or more constants of the electrical system. The configuration may specify one or more cost elements associated with operation of the electrical system. The cost elements may include one or more of an electricity cost (e.g., an electricity supply charge, an electricity demand charge), a battery degradation cost, equipment degradation cost, a tariff definition (e.g., an electricity supply tariff providing ToU supply rates and associated time windows, or an electricity demand tariff providing demand rates and associated time windows), a cost of local generation, penalties associated with deviation from an operating plan (e.g., a prescribed operating plan, a contracted operating plan), costs or benefits associated with a change in energy in the ESS such that adding energy between the beginning and the end of the future time domain is valued, costs or benefits (e.g., a payment) for contracted maneuvers, costs or benefits associated with the amount of energy stored in an ESS as a function of time, a value of comfort that may be a function of other process variables such as building temperature.

In certain embodiments, the set of configuration elements define the one or more cost elements by specifying how to calculate an amount for each of the one or more cost elements. For example, the definition of a cost element may include a formula for calculating the cost element.

In certain embodiments, the cost elements specified by the configuration elements may include one or more incentives associated with operation of the electrical system. An incentive may be considered as a negative cost. The one or more incentives may include one or more of an incentive revenue, a demand response revenue, a value of reserve energy or battery capacity (e.g., for backup power as a function of time), a contracted maneuver, revenue for demand response opportunities, revenue for ancillary services, and revenue associated with deviation from an operating plan (e.g., a prescribed operating plan, a contracted operating plan).

In other embodiments, the configuration elements may specify how to calculate an amount for one or more of the cost elements. For example, a formula may be provided that indicates how to calculate a given cost element.

External inputs may also be received 604. The external inputs may provide indication of one or more conditions that are external to the controller and/or the electrical system. For example, the external inputs may provide indication of the temperature, weather conditions (e.g., patterns, forecasts), and the like.

Process variables are received 606. The process variables provide one or more measurements of a current state of the electrical system. The set of process variables can be used to determine progress toward meeting an objective for economical optimization of the electrical system. The process variables may be feedback in a control loop for controlling the electrical system.

The EO process 601*a* may include predicting 608 a local load and/or generation during an upcoming time domain. The predicted local load and/or local generation may be stored for later consideration. For example, the predicted load and/or generation may be used in a later process of evaluating the cost function during a minimization of the cost function.

A control parameter set X may be defined 610 to be applied during an upcoming time domain. In defining the control parameter set X, the meaning of each element of X is established. A first aspect in defining 610 the control parameter set X may include selecting a control law. Then, for example, X may be defined 610 as a matrix of values such that each column of X represents a set of control parameters for the selected control law to be applied during a particular time segment of the future time domain. In this example, the rows of X represent individual control parameters to be used by the control law. Further to this example, the first row of X can represent the nominal ESS power during a specific time segment of the future time domain. Likewise, X may be further defined such that the second row of X is the maximum demand limit (e.g., a maximum demand setpoint). A second aspect in defining 610 may include splitting the upcoming time domain into sensible segments and selecting the meaning of the control parameters to use during each segment. The upcoming future time domain may be split into different numbers of segments depending on what events are coming up during the future time domain. For example if there are no supply charges, and there is only one demand period, the upcoming time domain may be split into a few segments. But if there is a complicated scenario with many changing rates and constraints, the upcoming time domain may be split into many segments. Lastly, in defining 610 the control parameters X, some control parameters $X_x$ may be marked for determination using optimization, and others $X_{logic}$ may be marked for determination using logic (for example logic based on constraints, inputs, other control parameters, mathematical formulas, etc.).

The EO process 601a may also prepare 612 or obtain a cost function. Preparing 612 the cost function may be optional and can increase execution efficiency by pre-calculating certain values that will be needed each time the cost function is evaluated. The cost function may be prepared 612 (or configured) to include or account for any constraints on the electrical system.

With the control parameter set X defined 610 and the cost function prepared 612, the EO process 601a can execute 614 a minimization or optimization of the cost function resulting in the optimal control parameter set $X_{opt}$. For example, a continuous optimization algorithm may be used to identify an optimal set of values for the control parameter set $X_{opt}$ (e.g., to minimize the cost function) in accordance with the one or more constraints and the one or more cost elements. The continuous optimization algorithm may be one of many types. For example, it may be a generalized continuous optimization algorithm. The continuous optimization algorithm may be a multivariable continuous optimization algorithm. The continuous optimization algorithm may be a constrained continuous optimization algorithm. The continuous optimization algorithm may be a Newton-type algorithm. It may be a stochastic-type algorithm such as Covariance Matrix Adaption Evolution Strategy (CMAES). Other algorithms that can be used are BOBYQA (Bound Optimization by Quadratic Approximation) and COBYLA (Constrained Optimization by Linear Approximation).

To execute the optimization of the cost function, the cost function may be evaluated many times. Each time, the evaluation may include performing a simulation of the electrical system operating during the future time domain with a provided control parameter set X, and then calculating the cost associated with that resulting simulated operation. The cost function may include or otherwise account for the one or more cost elements received 602 in the configuration. For example, the cost function may be a summation of the one or more cost elements (including any negative costs, such as incentive, revenues, and the like). In this example, the optimization step 614 would find $X_{opt}$ that minimizes the cost function. The cost function may also include or otherwise account for the one or more constraints on the electrical system. The cost function may include or otherwise account for any values associated with the electrical system that may be received 602 in the configuration.

The cost function may also evaluate another economic metric such as payback period, internal rate of return (IRR), return on investment (ROI), net present value (NPV), or carbon emission. In these examples, the function to minimize or maximize would be more appropriately termed an "objective function." In case the objective function represents a value that should be maximized such as IRR, ROI, or NPV, the optimizer should be set up to maximize the objective function when executing 614, or the objective function could be multiplied by −1 before minimization. Therefore, as can be appreciated, elsewhere in this disclosure, "minimizing" the "cost function" may also be more generally considered for other embodiments as "optimizing" an "objective function."

The continuous optimization algorithm may execute the cost function (e.g., simulate the upcoming time domain) a plurality of times with various parameter sets X to identify an optimal set of values for the control parameter set $X_{opt}$ to minimize the cost function. The cost function may include a summation of the one or more cost elements and evaluating the cost function may include returning a summation of the one or more cost elements incurred during the simulated operation of the control system over the upcoming time domain.

The optimal control parameter set $X_{opt}$ is then output 616. In some embodiments, the output 616 of the optimal control parameter set $X_{opt}$ may be stored locally, such as to memory, storage, circuitry, and/or a processor disposed local to the EO process 601a. In some embodiments, the outputting 616 may include transmission of the optimal control parameter set $X_{opt}$ over a communication network to a remote computing device, such as the HSC 540 of FIG. 5.

The EO process 601a repeats for a next upcoming time domain (a new upcoming time domain). A determination 618 is made whether a new configuration is available. If yes, then the EO process 601a receives 602 the new configuration. If no, then the EO process 601a may skip receiving 602 the configuration and simply receive 604 the external inputs.

As can be appreciated, in other embodiments an EO process may be configured differently, to perform operations in a differing order, or to perform additional and/or different operations. In certain embodiments, an EO process may determine values for a set of control variables to provide to the electrical system to effectuate a change to the electrical system toward meeting the controller objective for economical optimization of the electrical system during an upcoming time domain, rather than determining values for a set of control parameters to be communicated to a HSC process. The EO process may provide the control variables directly to the electrical system, or to an HSC process for timely communication to the electrical system at, before, or during the upcoming time domain.

The HSC process 601b may be a computer-implemented process executed by one or more computing devices, such as the HSC 540 of FIG. 5. The HSC process 601b may receive 622 a control parameter set X, such as the optimal control parameter set $X_{opt}$ output 616 by the EO process 601a. Process variables are also received 624 from the electrical system. The process variables include information, or feedback, about a current state or status of the electrical system and/or one or more components therein.

The HSC process 601b determines 626 values for a set of control variables for controlling one or more components of the electrical system at the current time. The HSC process 601b determines 626 the values for the control variables by using the optimal control parameter set $X_{opt}$ in conjunction with a control law. The control laws specify how to determine the control variables from X (or $X_{opt}$) and the process variables. Stated another way, the control law enforces the definition of X. For example, for a control parameter set X defined such that a particular element, $X_i$, is an upper bound on demand to be applied at the present time, the control law may compare process variables such as the unadjusted demand to $X_i$. If unadjusted building demand exceeds $X_i$, the control law may respond with a command (in the form of a control variable) to instruct the ESS to discharge at a rate that will make the adjusted demand equal to or less than $X_i$.

The control variables (including any newly determined values) are then output 628 from the HSC process 601b. The control variables are communicated to the electrical system and/or one or more components therein. Outputting 628 the control variables may include timely delivery of the control variables to the electrical system at, before, or during the upcoming time domain and/or applicable time segment thereof. The timely delivery of the control variables may include an objective to effectuate a desired change or adjustment to the electrical system during the upcoming time domain.

A determination 630 is then made whether a new control parameter set X (and/or values thereof) is available. If yes, then the new control parameter set X (or simply the values thereof) is received 622 and HSC process 601b repeats. If no, then the HSC process 601b repeats without receiving 622 a new control parameter set X, such as a new optimal control parameter set $X_{opt}$.

As can be appreciated, in other embodiments an HSC process may be configured differently, to perform operations in a differing order, or to perform additional and/or different operations. For example, in certain embodiments, an HSC process may simply receive values for the set of control variables and coordinate timely delivery of appropriate control variables to effectuate a change to the electrical system at a corresponding time segment of the upcoming time domain.

The example embodiment of a control 510 in FIG. 5 and a control method 600 in FIG. 6 illustrate a two-piece or staged controller, which split a control problem into two pieces (e.g., a low speed optimizer and a high speed dynamic manager (or high speed controller (HSC)). The two stages or pieces of the controller, namely an optimizer and a dynamic manager, are described more fully the sections below. Nevertheless, as can be appreciated, in certain embodiments a single stage approach to a control problem may be utilized to determine optimal control values to command an electrical system.

Economic Optimizer (EO)

Greater detail will now be provided about some elements of an EO, according to some embodiments of the present disclosure.

Predicting a Load/Generation of an Upcoming Time Domain

In many electrical system control applications, a load of the electrical system (e.g., a building load) changes over time. Load can be measured as power or as energy change over some specified time period, and is often measured in units of kW. As noted above with reference to FIG. 6, an EO process 601a may predict 608 a local load and/or generation during an upcoming time domain.

Figure 7:
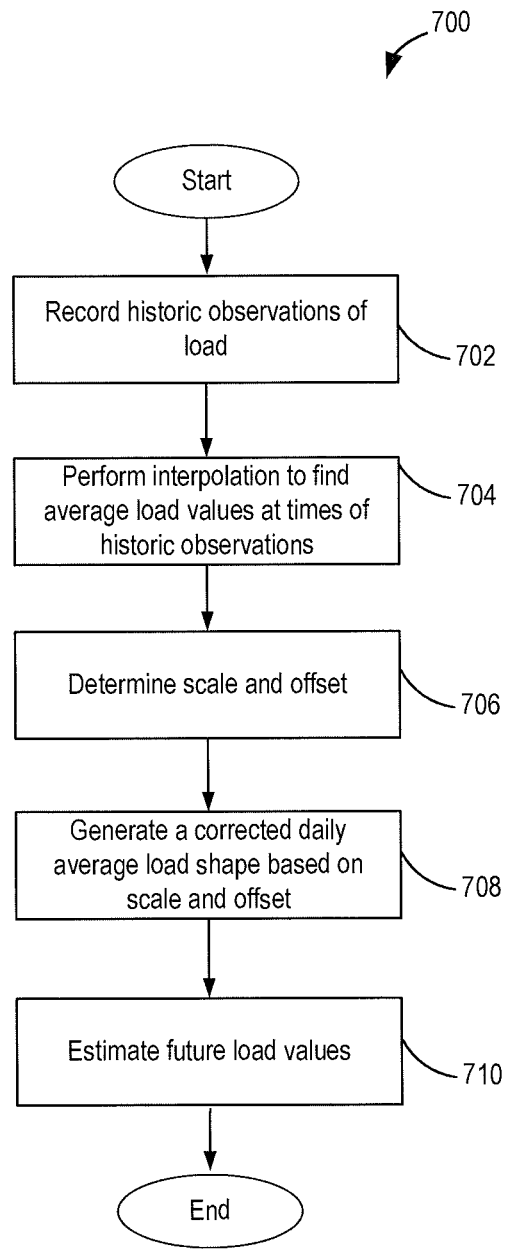
FIG. 7 is a flow diagram of a method of predicting load and/or generation of an electrical system during an upcoming time domain, according to one embodiment of the present disclosure.

FIG. 7 is a flow diagram of a method 700 of predicting load and/or generation of an electrical system during an upcoming time domain. A controller, according to some embodiments of the present disclosure, may have the ability to predict the changing load that may be realized during an upcoming time domain. These load and generation predictions may be used when the cost function is evaluated. To account for and reap a benefit from some types of value streams such as demand charge reduction, an accurate estimate of the upcoming load can be important. An accurate projection of a load during an upcoming time domain enables an EO to make better control decisions to capitalize on value streams such as demand charge reduction.

A method of predicting load, according to one embodiment of the present disclosure, may perform a load prediction considering historic periodic trends or shapes such as a daily trend or shape. The load prediction can execute every time an EO executes an EO process, or it can execute more or less frequently. The load prediction may be executed by performing a regression of a parameterized historic load shape against historic load data (typically less than or equal to 24 hours) in one embodiment. Regression algorithms such as least squares may be used. A compilation of historic trends may be recorded as a historic average (or typical) profile or an average load shape. The historic average profile or average load shape may be a daily (24-hour) historic average profile that represents a typical day. The compilation of historic observations and/or historic average profile may be received from another system, or may be gathered and compiled (or learned) as part of the method of predicting load, as will be explained below with reference to FIG. 8.

Referring to FIG. 7, historic observations of load are recorded 702. For example, the last h hours of historic observations of load may be continuously recorded and stored in memory, each measurement having a corresponding time of day at which time it was measured in an array pair historic_load_observed and historic_load_observed_time_of_day. The last h hours can be any amount of time, but in one embodiment, it is between 3 and 18 hours.

Assume for now a daily average load shape array or vector is in memory named avg_load_shape, each with a corresponding array avg_load_shape_time_of_day of the same length. The avg_load_shape and avg_load_shape_time_of_day represents a historic average profile and/or historic trends. The time domain of avg_load_shape_time_of_day is 24 hours, and the time interval of discretization of avg_load_shape_time_of_day could be any value. Between 5 and 120 minutes may be used, depending on the application, in some embodiments. As an example, if the interval of discretization is chosen to be 30 minutes, there will be 48 values comprising avg_load_shape and 48 values comprising avg_load_shape_time_of_day.

An interpolation is performed 704 to find the avg_load_shape values at each of the times in historic_load_observed_time_of_day. Call this new interpolated array avg_load_shape_interpolated. Consider mathematically avg_load_shape_interpolated with a scale and offset defined as: average_load_shape_interpolated_p=avg_load_shape_interpolated*scale+offset. In some embodiments, the interpolation is a linear interpolation. In other embodiments, the interpolation is a nonlinear interpolation.

A scale and offset are determined 706. For example, the method 700 may perform a least squares regression to determine 706 scale and offset that minimize the sum of the squares of the error between average_load_shape_interpolated_p and historic_load_observed. Call these resulting scale and offset values scale_fit and offset_fit. In some embodiments, the determining 706 of scale and offset can utilize weighted least squares techniques that favor more recent observations.

A corrected daily average load shape is generated 708 based on the scale and/or offset. For example a corrected load shape may be generated 708 for a full day as avg_load_shape_fit=avg_load_shape*scale_fit+offset_fit.

The future load values can then be estimated 710, such as by interpolating. A future load value at any time of day in the future time domain can now be estimated by interpolating 710 to that time of day from the pair of arrays avg_load_shape_fit and avg_load_shape_time_of_day.

Figure 8:
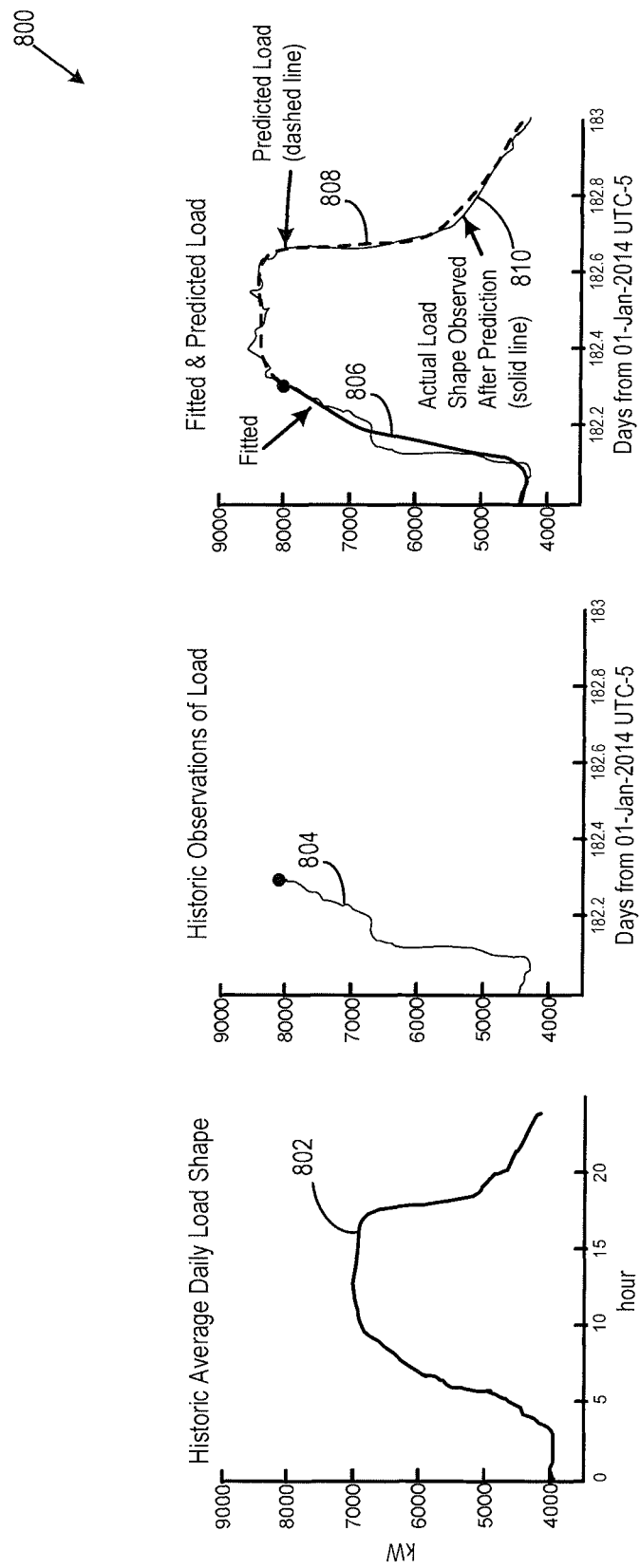
FIG. 8 is a graphical representation 800 of predicting load and/or generation of an electrical system during an upcoming time domain.

FIG. 8 provides a graphical representation 800 of predicting load and/or generation of an electrical system during an upcoming time domain, according to one embodiment. The graphical representation may track the method 700 of FIG. 7. A historic average daily load shape 802 is generated or learned. Historic observations of load 804 are generated. A fitted current day historic load shape 806 is generated. A predicted load shape 808 can then be generated. The predicted load shape 808 is fairly accurate based on an actual load shape observed 810.

One advantage of a method of predicting load and/or generation of an electrical system during an upcoming time domain, such as previously described, compared to other methods, is that such method can adapt to changes in load scale and offset while still conforming to the general expected average daily load shape.

In other embodiments, the predicted load can be further modified after it has been calculated with the above method. For example, the predicted load may be modified to bring it closer to the daily average historic load as the prediction time becomes farther away from the time the prediction was made.

As mentioned previously, in certain embodiments, a method of predicting load may include compiling or otherwise gathering historic trends to determine a historic average profile or an average load shape on a typical day. One possible method for load learning (e.g., determining and updating avg_load_shape) is as follows:

1) Create arrays avg_load_shape and avg_load_shape_time_of_day which are defined as above. Initialize avg_load_shape to some reasonable value such as a constant load equal to the current load, or to an initial load shape provided in the configuration information.

2) Begin recording load observations and storing each along with its associated time of day in historic_load_observed_2 and historic_load_observed_time_of_day_2.

3) After at least one full day of load observations has been stored in historic_load_observed_2 and historic_load_observed_time_of_day_2, assign a last 24 hours of load data in historic_load_observed_2 to a temporary array in memory named avg_load_shape_last_24_hr which has the same number of elements as avg_load_shape, and whose associated time of day vector is also avg_load_shape_time_of_day. To perform this operation, a number of well-known approaches can be used including regression and interpolation, linear weighted averaging, and nearest neighbor.

4) Assign avg_load_shape_last_24_hr to avg_load_shape.

5) Wait for a new 24-hour period of data to be recorded in historic_load_observed_2 and historic_load_observed_time_of_day_2.

6) Again assign the last 24 hours of load data in historic_load_observed_2 to a temporary array in memory named avg_load_shape_last_24_hr which has the same number of elements as avg_load_shape, and whose associated time of day vector is also avg_load_shape_time_of_day. Again to perform this operation, a number of well-known approaches can be used including regression and interpolation, linear weighted averaging, and nearest neighbor.

7) Update each element k of avg_load_shape by performing a digital filter operation with it and avg_load_shape_last_24_hr. In one embodiment, this digital filter operation is performed as a first order infinite impulse response (IIR) filter with the inputs being elements k of avg_load_shape_last_24_hr and the original avg_load_shape, and the output being a modified element k of avg_load_shape. In one embodiment, the time constant of the first-order IIR filter is set to between 2 and 60 days. Other types of digital filters including low pass digital filters may be used.

8) Return to 5 above.

Some unique advantages of this embodiment of learning and predicting load and/or generation are obtained. For example, previous load information to construct an average daily load shape is not required. It learns the average daily load shape day-by-day as it observes the actual load. It requires very little memory: only enough for 24-hours of observed load, the load shape itself (24-hours), and supporting arrays and scalar values. Due to the filtering described above, it allows the load shape to change seasonally as seasonal changes occur and are observed. In other words, it is adaptive.

The method of FIG. 7 and illustration of FIG. 8 describe one embodiment of a method for predicting load. If a local generator is present in an electrical system, the same or a similar method can be applied for predicting generation. Instead of a "load shape," a "generation shape" can be stored in memory. For generators where the generation is known at a particular time (such as a photovoltaic generator which would be expected to have nearly zero generation at nighttime), the prediction and generation shape can be constrained to specific values at specific times of the day. In this case, instead of using regression to determine both scale and offset, perhaps only scale may be needed.

Another aspect of this embodiment of a method to predict load and/or generation is the ability to incorporate external inputs to modify the prediction of load or generation. In one embodiment, the prediction is made as already described, then the prediction is modified with the use of external information such as a weather forecast or building occupancy forecast.

By having a pre-determined differential relationship for load (or generation) vs. input data, the prediction can be modified in one example as follows:

1) An external input is read which contains a forecasted variable $x_{input,forecast}$.

2) From configuration information, a value of the differential $$\left[\frac{d(\text{load})}{d(x_{input})}\right]_{x_{nom}}$$

is available which is valid near some nominal $x_{input}$ value of $x_{nom}$.

3) The predicted load can be modified to account for the difference between the input $x_{input}$ and $x_{nom}$:

$$load_{predicted,modified} = load_{predicted} + (x_{input,forecast} - x_{nom}) \times \left[\frac{d(\text{load})}{d(x_{input})}\right]_{x_{nom}}$$

The same approach can be used for modifying a generation prediction by replacing "load" with "generation" in the formula above.

Define the Control Parameter Set X

Defining the Control Parameter Set X involves defining or otherwise specifying times at which each control parameter is to be applied during a future time domain, and the control law(s) that are to be applied at each time in the future time domain.

An EO, according to certain embodiments of the present disclosure, is configured to define the control parameter set X. While there are many ways to define a control parameter set X, three possible approaches are:

1. a single set of parameters of a control law to be applied during the entire upcoming time domain;

2. a sequence of parameter sets that are each to be applied to a single control law at different contiguous sequential time intervals throughout the upcoming time domain; and 3. a sequence of parameters that specifies different control laws to be applied at different contiguous sequential time intervals throughout the future time domain.

An example of Approach 1 above of a single set of parameters of the control parameter set X (and example values) for a four-parameter control law is shown in Table 1.

TABLE 1

| Parameter | Description | Example Value |
|---|---|---|
| $P_{nom}$ | Nominal ESS power (or discharge power if negative) to be applied in the absence of other constraints or rules (such as those related to UB, $UB_0$, or LB below). | −40 W |
| UB | Upper bound on adjusted demand (e.g., an upper setpoint). Not to be exceeded unless the ESS is incapable of discharging at sufficient power. | 100 kW |
| $UB_0$ | Upper bound on electrical system adjusted demand (e.g., an upper setpoint) not to be actively exceeded (e.g., electrical system adjusted demand may exceed this value only with ESS power less than or equal to 0). | 80 kW |
| LB | Lower bound on adjusted net power (e.g., a lower setpoint). Sometimes referred to as "minimum import," or, if 0, "zero export." Adjusted net power will be kept above this value unless the ESS is incapable of charging at sufficient power and generators cannot be throttled sufficiently. | 0 kW |

Approaches 2 and 3 above utilize segmentation of the future time domain.

Figure 9:
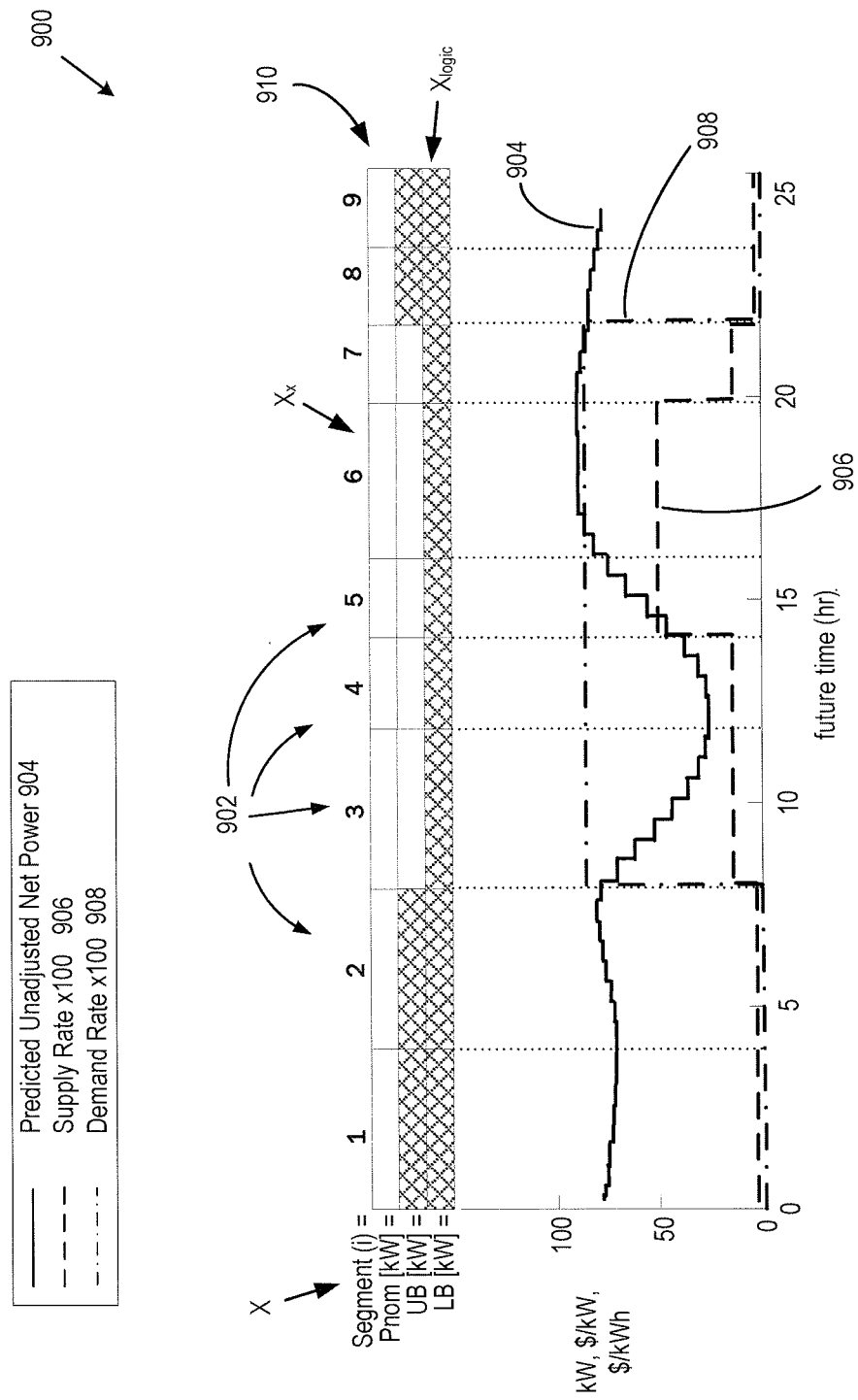
FIG. 9 is a graph illustrating one example of segmenting an upcoming time domain into multiple time segments.

FIG. 9 is a graph 900 illustrating one example of segmenting an upcoming time domain into a plurality of time segments 902. A plot 904 of predicted unadjusted net power (kW) versus future time (e.g., of an upcoming time domain) is provided. A plot 906 of energy supply rate ($/kWh) versus future time is also provided. A plot 908 of a demand rate ($/kW) versus future time is also provided. A 25-hour future time domain is segmented into nine discrete sequential time segments 902 (e.g., i=1, 2, 3, 4, 5, 6, 7, 8, 9). Each segment 902 will be assigned a single set of one or more parameters from the control parameter set X to be applied during that time segment.

Segmentation of the future time domain can be done in many ways. In one embodiment, segmentation is performed such that:

i. the electric rates (both supply and demand) are constant within each time segment, ii. the number of segments is minimized but large enough to provide a different segment for each region of the future time domain that is expected to have significantly different operating behavior or conditions, and iii. the segment length does not exceed a prescribed maximum segment length.

In cases where rates are changing very frequently (every hour for example), some minimum time segment length can be specified (every four hours for example) to reduce the number of time segments while still maintaining acceptable computational fidelity. Likewise, a maximum segment length (for example six hours) may also be prescribed to increase computational fidelity.

Smaller numbers of segments are less burdensome on the EO processor computationally, while large numbers of segments provide higher fidelity in the final optimized solution. A desirable segment length of between 0.5 and 6 hours in some embodiments has been found to provide a good balance between these criteria.

The time segments of the upcoming time domain may be defined such that one or more of supply rate cost elements and delivery rate cost elements are constant during each time segment. The time segments of the upcoming time domain may be defined such that one or more of contracted maneuvers, demand response maneuvers, and ancillary service maneuvers are continuous during each time segment.

FIG. 9 also illustrates a representation 910 of an example of control parameter set X that includes multiple sets of parameters. The control parameter set X is for a three-parameter control law, which may be defined similar to the set illustrated above in Table 1, but without $UB_0$. The values for the parameters are not initialized, but the cells of the table X in FIG. 9 represent a parameter for which a value may be associated. In this example, the un-shaded values ($X_x$) are to be determined through an optimization process of the EO and the shaded values ($X_{logic}$) can be determined from logic. An objective of the EO is to fill in the values for each control parameter that minimizes the cost of operating the electrical system during the future time domain.

In some instances, it may make sense for an EO (or an EOESC) to operate with a single control parameter (e.g., a single set with a single element in X, such as $P_{nom}$) or with multiple control parameters (a single set of multiple elements in X, such as $P_{nom}$, UB, and LB) to be applied during the entire future time domain. In these two cases, the future time domain would be segmented into only one time segment 902. Correspondingly, the EO would only consider control parameters that are constant over the whole future time domain in this example.

Prepare the Cost Function

An EO, according to certain embodiments of the present disclosure, prepares or otherwise obtains a cost function. As already mentioned, the cost function $f_c(X)$ is a function that considers particular control parameters (e.g., control parameter set X) and returns the scalar net cost of operating the electrical system with X during the future time domain.

Figure 10:
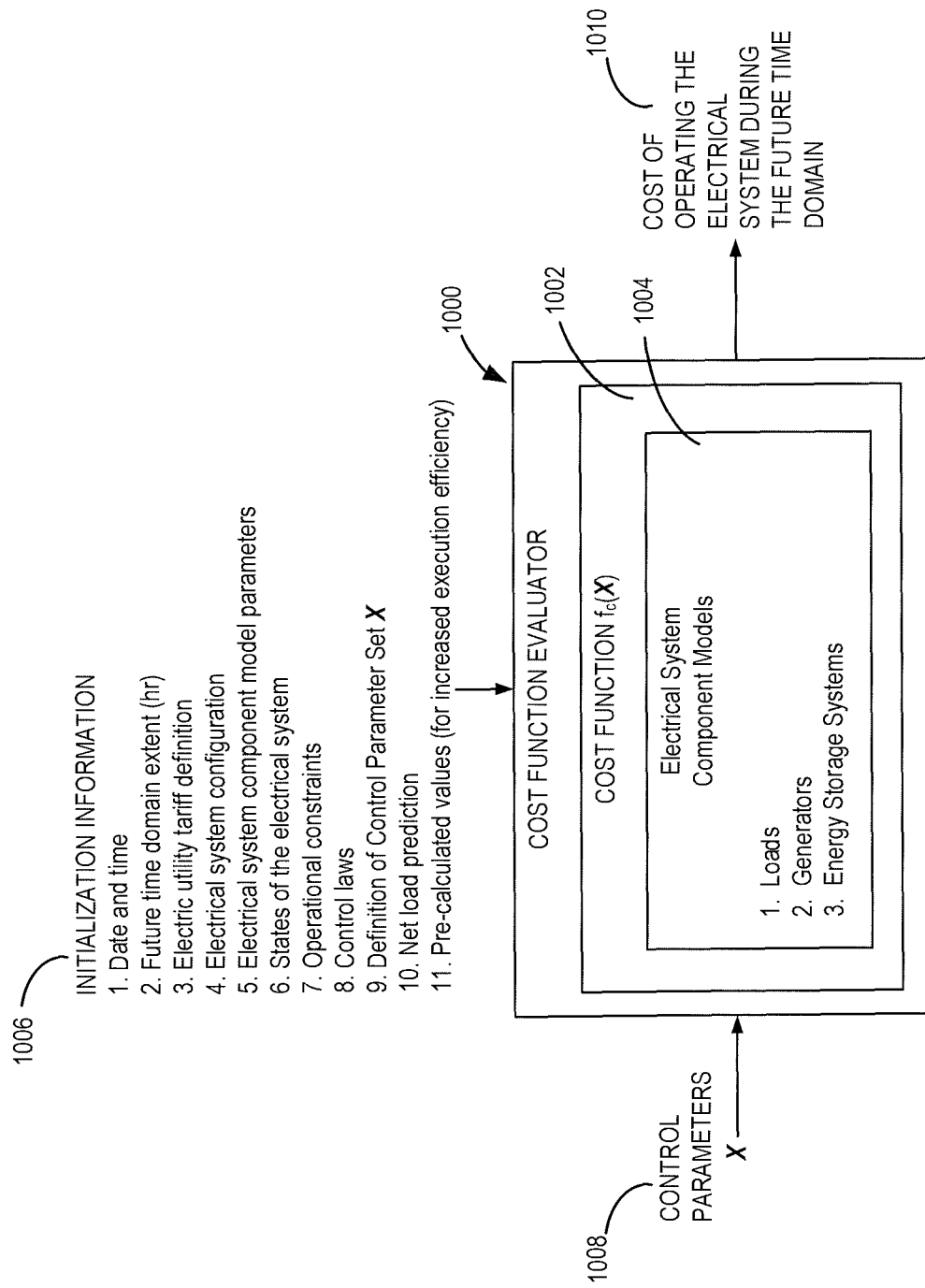
FIG. 10 is a diagrammatic representation of a cost function evaluation module, according to one embodiment of the present disclosure.

FIG. 10 is a diagrammatic representation of a cost function evaluation module 1000 (or cost function evaluator) that implements a cost function $f_c(X)$ 1002 that includes models 1004 for one or more electrical system components (e.g., loads, generators, ESSs). The cost function $f_c(X)$ 1002 receives as inputs initialization information 1006 and control parameters 1008 (e.g., a control parameter set X). The cost function $f_c(X)$ 1002 provides as an output a scalar value 1010 representing a cost of operating the electrical system during the future time domain.

The scalar value 1010 representing the cost, which is the output of the cost function $f_c(X)$ 1002, can have a variety of different units in different examples. For example, it can have units of any currency. Alternately, the cost can have units of anything with an associated cost or value such as electrical energy or energy credits. The cost can also be an absolute cost, cost per future time domain, or a cost per unit time such as cost per day. In one embodiment, the units of cost are U.S. dollars per day.

Prior to using the cost function, several elements of it can be initialized. The initialization information that is provided in one embodiment is:

Date and time. For determining the applicable electric utility rates.

Future time domain extent. For defining the time extent of the cost calculation.

Electric utility tariff definition. This is a set of parameters that defines how the electrical utility calculates charges.

Electrical system configuration. These configuration elements specify the sizes and configuration of the components of the electrical system. An example for a battery energy storage system is the energy capacity of the energy storage device.

Electrical system component model parameters. These model parameters work in conjunction with analytic or numerical models to describe the physical and electrical behavior and relationships governing the operation of electrical components in the electrical system. For battery energy storage systems, a "battery model" is a component, and these parameters specify the properties of the battery such as its Ohmic efficiency, Coulombic efficiency, and degradation rate as a function of its usage.

States of the electrical system. This is information that specifies the state of components in the electrical system that are important to the economic optimization. For battery energy storage systems, one example state is the SoC of the energy storage device.

Operational constraints. This information specifies any additional operational constraints on the electrical system such as minimum import power.

Control law(s). The control law(s) associated with the definition of X.

Definition of control parameter set X. The definition of the control parameter set X may indicate the times at which each control parameter is to be applied during a future time domain. The definition of the control parameter set X may indicate which control law(s) are to be applied at each time in the future time domain.

Net load (or power) prediction. Predicted unadjusted net load (or predicted unadjusted net power) during the future time domain.

Pre-calculated values. While segments are defined, many values may be calculated that the cost function can use to increase execution efficiency (help it "evaluate" faster). Pre-calculation of these values may be a desirable aspect of preparing the cost function $f_c(X)$ 1002 to enable the cost function to be evaluated more efficiently (e.g., faster, with fewer resources).

Preparing the cost function $f_c(X)$ 1002 can increase execution efficiency of the EO because values that would otherwise be re-calculated each time the cost function is evaluated (possible 1000s of times per EO iteration) are pre-calculated a single time.

Figure 11:
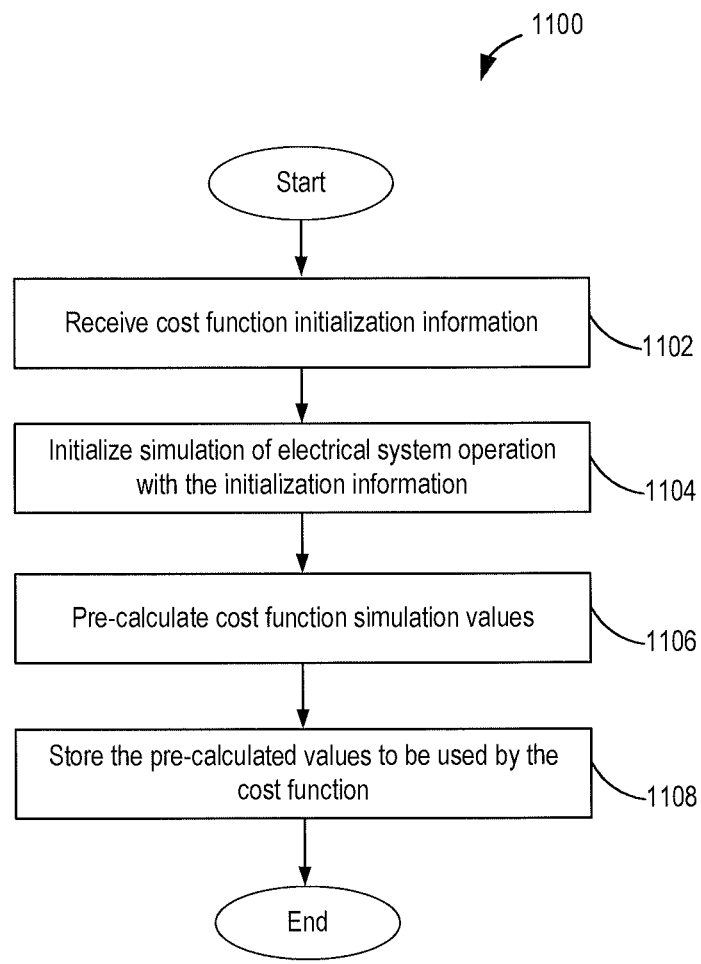
FIG. 11 is a flow diagram of a method of preparing a cost function $f_c(X)$, according to one embodiment of the present disclosure.

FIG. 11 is a flow diagram of a process 1100 of preparing a cost function $f_c(X)$, according to one embodiment of the present disclosure. Cost function initialization information may be received 1102. A simulation of electrical system operation is initialized 1104 with the received 1102 cost function initialization information. Cost function values may be pre-calculated 1106. The pre-calculated values may be stored 1100 for later use during evaluation of the cost function.

In certain embodiments, defining a control parameter set X and preparing a cost function $f_c(X)$ may be accomplished in parallel.

Evaluation of the Cost Function

During execution of an EO, according to some embodiments of the present disclosure, the cost function is evaluated. During evaluation of the cost function, operation of the electrical system with the control parameter set X is simulated. The simulation may be an aspect of evaluating the cost function. Stated otherwise, one part of evaluating the cost function for a given control parameter set X may be simulating operation of the electrical system with that given control parameter set X. In the simulation, the previously predicted load and generation are applied. The simulation takes place on the future time domain. As time advances through the future time domain in the simulation, costs and benefits (as negative costs) can be accumulated. What is finally returned by the simulation is a representation of how the electrical system state may evolve during the future time domain with control X, and what costs may be incurred during that time.

In some embodiments, the cost function, when evaluated, returns the cost of operating the electrical system with some specific control parameter set X. As can be appreciated, the cost of operating an electrical system may be very different, depending on X. So evaluation of the cost function includes a simulated operation of the electrical system with X first. The result of the simulation can be used to estimate the cost associated with that scenario (e.g., the control parameter set X).

As noted previously, some of the costs considered by the cost function in one embodiment are:

1. Electricity supply charges (both flat rates and ToU rates)
2. Electricity demand charges
3. Battery degradation cost
4. Reduction of energy stored in the energy storage system
5. Incentive maneuver benefits (as a negative number)

Electricity supply and demand charges have already been described. For monthly demand charges, the charge may be calculated as an equivalent daily charge by dividing the charge by approximately 30 days, or by dividing by some other number of days, depending on how many days are remaining in the billing cycle. Battery degradation cost is described in a later section. Reduction in energy stored in an ESS accounts for the difference in value of the storage energy at the beginning of the future time domain compared to the end. Incentive maneuver benefits such as demand response can be calculated as the benefit on a per day basis, but as a negative number.

During the cost function's electrical system simulation, several variables can be tracked and stored in memory. These include control variables, electrical power consumed by or supplied from various electrical systems, and the states of charge of any energy storage systems. Other variables can also be tracked and stored to memory. Any of the variables stored to memory can be output by the cost function.

Figure 12:
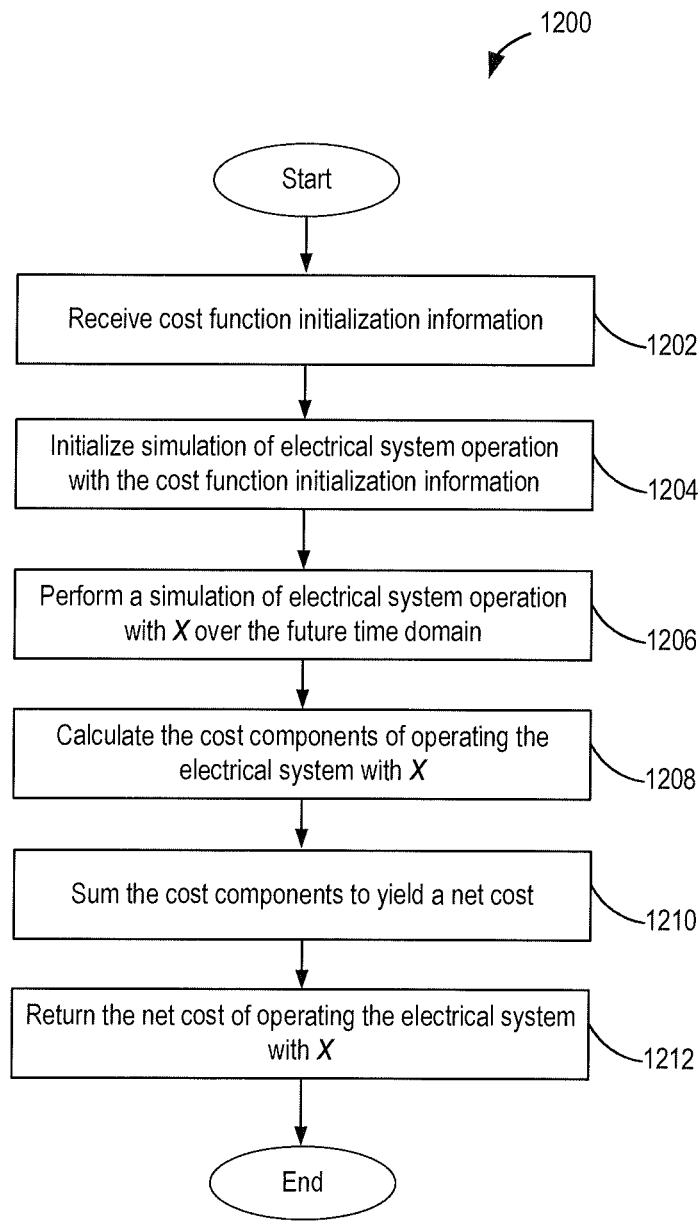
FIG. 12 is a flow diagram of a method of evaluating a cost function that is received from an external source or otherwise unprepared, according to one embodiment of the present disclosure.

FIG. 12 is a flow diagram of a method 1200 of evaluating a cost function that is received from an external source or otherwise unprepared, according to one embodiment of the present disclosure. Cost function initialization information may be received 1202. A simulation of electrical system operation is initialized 1204 with the received 1202 cost function initialization information. The simulation is performed 1206 of the electrical system operation with X over the future time domain. A calculation 1208 of the cost components of operating the electrical system with X is performed. The cost components are summed 1210 to yield a net cost of operating the electrical system with X. The net cost of operating the electrical system with X is returned 1212 or otherwise output.

Figure 13:
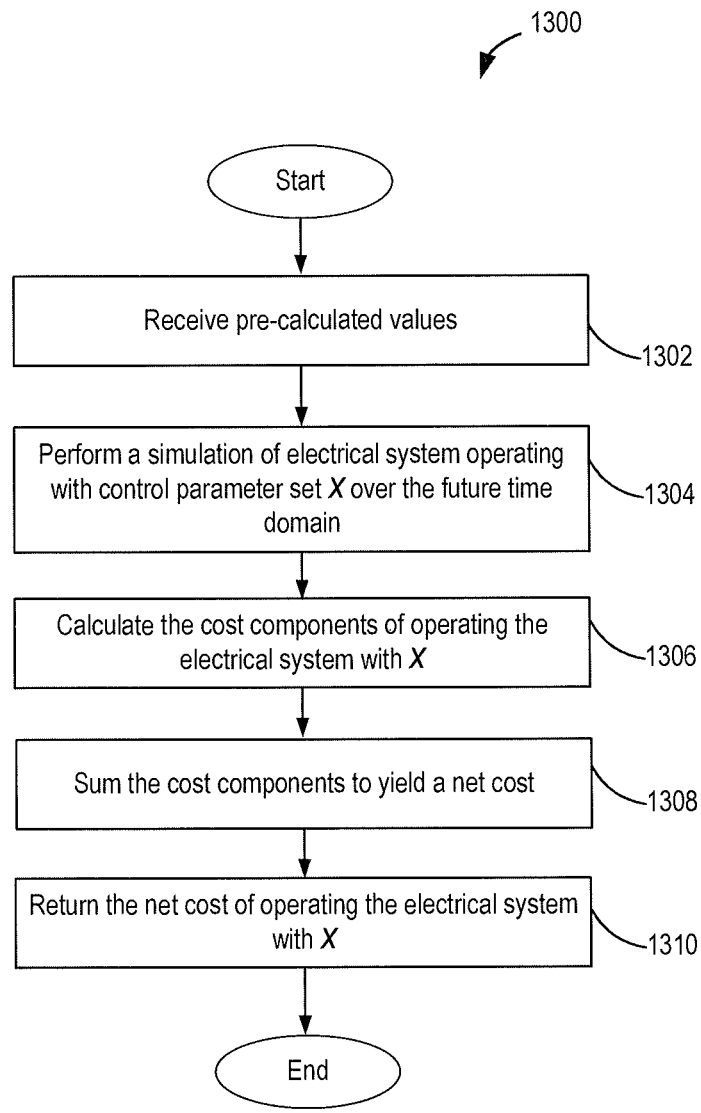
FIG. 13 is a flow diagram of a method of evaluating a prepared cost function, according to one embodiment of the present disclosure.

FIG. 13 is a flow diagram of a method 1300 of evaluating a prepared cost function, according to one embodiment of the present disclosure. The cost function may be prepared according to the method of FIG. 11. Pre-calculated values are received 1302 as inputs to the method 1300. The values may be pre-calculated during an operation to prepare the cost function, such as the process of FIG. 11. A simulation is performed 1304 of the electrical system operating with X over the future time domain. A calculation 1306 of the cost components of operating the electrical system with X is performed. The cost components are summed 1308 to yield a net cost of operating the electrical system with X. The net cost of operating the electrical system with X is returned 1310 or otherwise output.

In some embodiments, rather than returning the net cost of operating the electrical system with X during the future time domain, what is returned is the net cost of operating the electrical system with X as a cost per unit time (such as an operating cost in dollars per day). Returning a per day cost can provide better normalization between the different cost elements that comprise the cost function. The cost per day for example can be determined by multiplying the cost of operating during the future time domain by 24 hours and dividing by the length (in hours) of the future time domain.

Execute Continuous Minimization of the Cost Function

With a prediction of load and generation made, the control parameter set X defined, and the cost function obtained and initialized and/or prepared, minimization of cost can be performed.

Minimization of the cost function may be performed by an optimization process or module that is based on an optimization algorithm. Minimization (or optimization) may include evaluating the cost function iteratively with different sets of values for the control parameter set X (e.g., trying different permutations from an initial value) until a minimum cost (e.g., a minimum value of the cost function) is determined. In other words, the algorithm may iteratively update or otherwise change values for the control parameter set X until the cost function value (e.g. result) converges at a minimum (e.g., within a prescribed tolerance). The iterative updating or changing of the values may include perturbing or varying one or more values based on prior one or more values.

Termination criteria (e.g., a prescribed tolerance, a delta from a prior value, a prescribed number of iterations) may aid in determining when convergence at a minimum is achieved and stopping the iterations in a finite and reasonable amount of time. The number of iterations that may be performed to determine a minimum could vary from one optimization cycle to a next optimization cycle. The set of values of the control parameter set X that results in the cost function returning the lowest value may be determined to be the optimal control parameter set $X_{opt}$.

In one embodiment, a numerical or computational generalized constrained nonlinear continuous optimization (or minimization) algorithm is called (e.g., executed) by a computing device.

Figure 14:
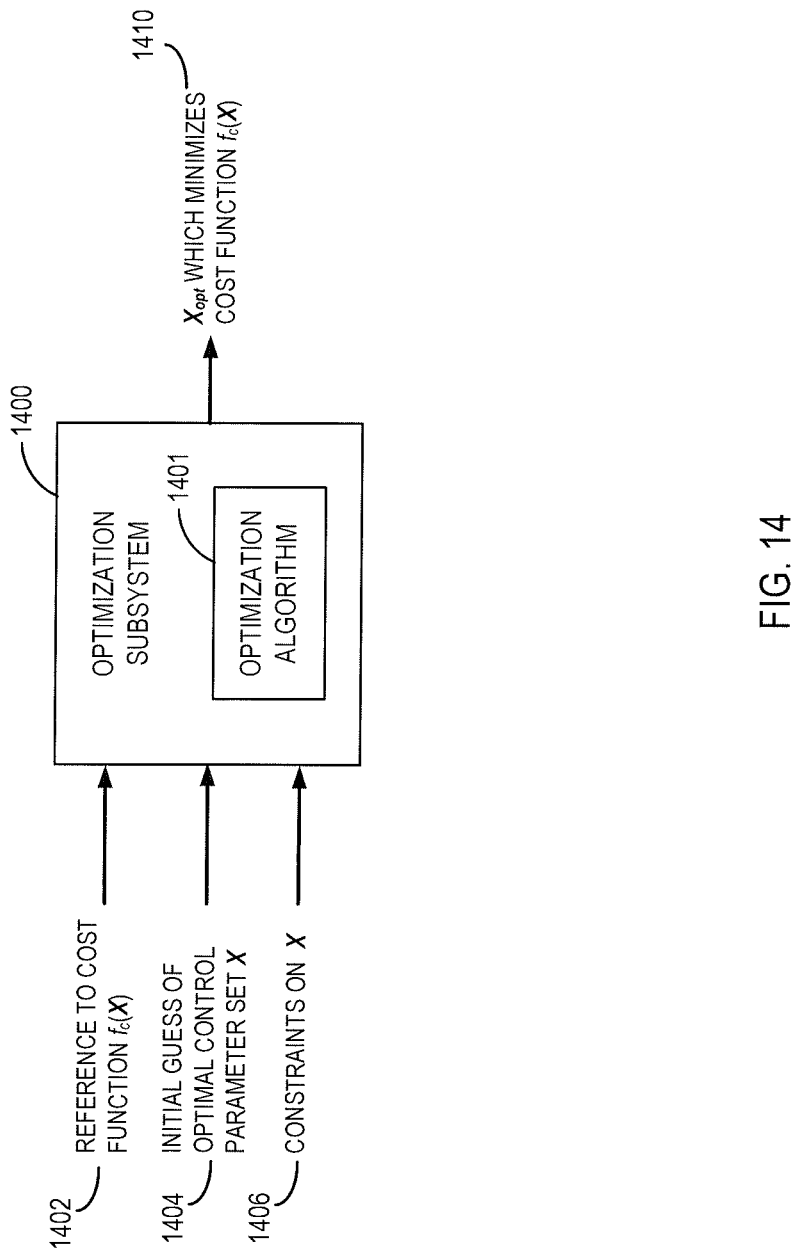
FIG. 14 is a diagrammatic representation of an optimizer that utilizes an optimization algorithm to determine an optimal control parameter set.

FIG. 14 is a diagrammatic representation of an optimization subsystem 1400 that utilizes or otherwise implements an optimization algorithm 1401 to determine an optimal control parameter set $X_{opt}$ 1410, which minimizes the cost function $f_c(X)$. In the embodiment of FIG. 14, the optimization algorithm 1401 utilized by the optimization subsystem 1400 may be a generalized constrained multivariable continuous optimization (or minimization) algorithm. A reference 1402 is provided for the cost function $f_c(X)$.

The optimization algorithm can be implemented in software, hardware, firmware, or any combination of these. The optimization algorithm may be implemented based on any approach from descriptions in literature, pre-written code, or developed from first principles. The optimization algorithm implementation can also be tailored to the specific problem of electrical system economic optimization, as appropriate in some embodiments.

Some algorithms for generalized constrained multivariable continuous optimization include:
Trust-region reflective
Active set
SQP
Interior Point
Covariance Matrix Adaption Evolution Strategy (CMAES)
Bound Optimization by Quadratic Approximation (BOBYQA)
Constrained Optimization by Linear Approximation (COBYLA)

The optimization algorithm may also be a hybrid of more than one optimization algorithm. For example, the optimization algorithm may use CMAES to find a rough solution, then Interior Point to converge tightly to a minimum cost. Such hybrid methods may produce robust convergence to an optimum solution in less time than single-algorithm methods.

Regardless of the algorithm chosen, it may be useful to make an initial guess of the control parameter set X 1404. This initial guess enables an iterative algorithm such as those listed above to more quickly find a minimum. In one embodiment, the initial guess is derived from the previous EO execution results.

Any constraints 1406 on X can also be defined or otherwise provided. Example constraints include any minimum or maximum control parameters for the electrical system.

An Example EO Result

Figure 15:
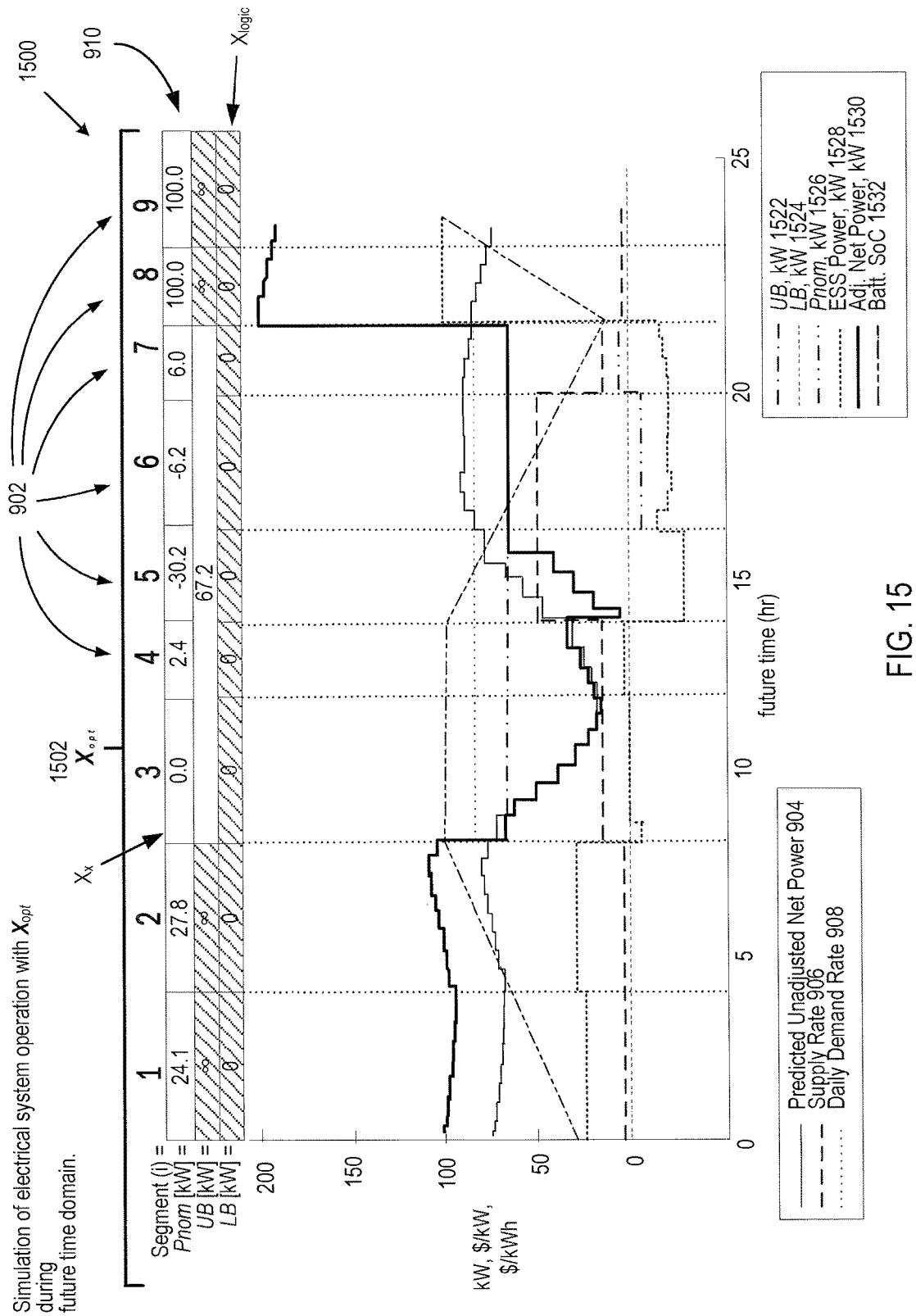
FIG. 15 is a graph illustrating an example result from an economic optimizer (EO) for a battery ESS.

FIG. 15 is a graph 1500 illustrating an example result from an EO for a small battery energy storage system, using the same example upcoming time domain, segmentation of the upcoming time domain into a plurality of segments 902, predicted unadjusted net power plot 904, supply rate plot 906, daily demand rate plot 908, and representation 910 of the control parameter set X as in FIG. 9.

The graph 1500 also includes plots for UB (kW) 1522, LB (kW) 1524, Pnom (kW) 1526, ESS power (kW) 1528, adjusted net power (kW) 1530, and battery SoC 1532.

In FIG. 15, as in FIG. 9, the future time domain is split into nine segments 902, and nine optimal sets of parameters 1502 were determined (e.g., a control parameter set $X_{opt}$ 910 that includes values for nine optimal sets of parameters, one optimal set of parameters for each segment 902). Daily demand charges are applicable and a net export of energy (e.g., to the grid) is not allowed in the illustrated example. An objective of the controller is to find an optimal sequence of electrical system control parameters.

The control parameter set X in this case is defined to include three parameters: Pnom, UB, and LB as described above. In this example, during execution of the optimization algorithm, the optimal values in the unshaded boxes ($X_x$) of the representation 910 of X are determined, $P_{nom}$ 1502 which is the battery inverter power (where charge values are positive and generation/discharge values are negative) during each time segment 902, and UB 1502 which is the upper limit on demand during each time segment 902). The date and time to apply each specific control parameter is part of the definition of X. The shaded values ($X_{logic}$, which includes LB and some UB values) in the representation 910 of X are determined by logic. For example, when no demand charge is applicable, the UB can be set to infinity. And since net export of power is not permitted in this example, LB can be set to zero. There is no need to determine optimal values for these shaded parameters when executing the optimization because their values are dictated by constraints and logic.

Applying the optimal values of X, the expected cost per day of operating the electrical system in the example of FIG. 15 is $209.42 per day. This total cost is the sum of the ToU supply cost ($248.52), the daily demand cost ($61.52), the cost of battery energy change ($−115.93), and the cost of battery degradation ($15.32).

As can be appreciated, in other embodiments, the EO may determine a set of control values for a set of control variables, instead of a control parameter set X. The EO may determine the set of control values to effectuate a change to the electrical system toward meeting a controller objective for economical optimization of the electrical system. The EO may then output the control values or the set of control variables for delivery directly to the electrical system. In such embodiment, the EO may be a primary component of the controller and the controller may not include a dynamic manager (e.g., a high speed controller).

Dynamic Manager or High Speed Controller (HSC)

Greater detail will now be provided about some elements of a dynamic manager, or an HSC, according to some embodiments of the present disclosure. Because the control parameter set X is passed to the high speed controller, the definition of the control parameter set X may be tightly linked to the HSC's control law. The interaction between an example HSC and control parameter set X is described below.

Storing a Control Plan

As already mentioned, the control parameter set X can contain multiple sets of parameters and dates and times that those sets of parameters are meant to be applied by the HSC. One embodiment of the present disclosure takes this approach. Multiple sets of parameters are included in X, each set of parameters with a date and time the set is intended to be applied to the electrical system being controlled. Furthermore, each controllable system within the electrical system can have a separate set of controls and date and time on which the set of controls is intended to be applied. The HSC commits the full control parameter set X to memory and applies each set of parameters therein to generate control variables to deliver to, and potentially effectuate a change to, the electrical system at the specified times. Stated differently, the HSC stores and schedules a sequence of optimal sets of parameters, each to be applied at an appropriate time. In other words, the HSC stores a control plan. This first task of storing and scheduling a sequence of optimal control parameter sets (e.g., a control plan) by the high speed controller provides distinct advantages over other control architectures.

For example, storing of a control plan by the HSC reduces the frequency that the computationally intensive (EO) portion of the controller is executed. This is because even if the first sequential time interval expires before the EO executes again, the HSC will switch to the next sequential control set at the appropriate time. In other words, the EO does not have to execute again before the first sequential time interval expires since multiple optimal control sets can be queued up in sequence.

As another example, storing of a control plan by the HSC enables operation (e.g., control of the electrical system) for significant periods of time without additional EO output. This may be important for example if the EO is executing in a remote processor such as a cloud computing environment and the HSC is running on a processor local to a building. If communication is lost for a period of time less than the future time domain, the HSC can continue to use the already-calculated optimal control parameter sets at the appropriate times. Although operation in such a manner during outage may not be optimal (because fresh EO executions are desirable as they take into account the latest data), this approach may be favored compared with use of a single invariant control set or shutting down.

Application of Presently Applicable Control Parameters

A second task of the HSC, according to one embodiment, is to control some or all of the electrical system components within the electrical system based on the presently applicable control parameter set. In other words, the HSC applies each set of parameters of a control parameter set X in conjunction with a control law to generate control variables to deliver to, and potentially effectuate a change to, the electrical system at appropriate times.

For an electrical system with a controllable battery ESS, this second task of the HSC may utilize four parameters for each time segment. Each of the four parameters may be defined as in Table 1 above. In one embodiment, these parameters are used by the HSC to control the battery inverter to charge or discharge the energy storage device. For a battery ESS, the typical rate at which the process variables are read and used by the HSC and new control variables are generated may be from 10 times per second to once per 15 minutes. The control variables (or the set of values for the set of control variables) for a given corresponding time segment may be provided to the electrical system at (e.g., before or during) the given corresponding time segment of the upcoming time domain.

As can be appreciated, in other embodiments, an entire control plan (e.g., a control parameter set X comprising a set of sets) may be processed by the HSC to determine a plurality of sets of control variables, each set of control variables for a corresponding time segment. The plurality of sets of control variables may be provided at once (e.g., before the upcoming time domain or no later than during a first time segment of the upcoming time domain). Or, each set of the plurality of sets may be provided individually to the electrical system at (e.g., before or during) the given corresponding time segment.

Another aspect of the HSC, according to one embodiment, is that the HSC can also be used to curtail a generator (such as a photovoltaic generator) if necessary to maintain the lower bound on electrical system power consumption specified by LB.

Figure 16:
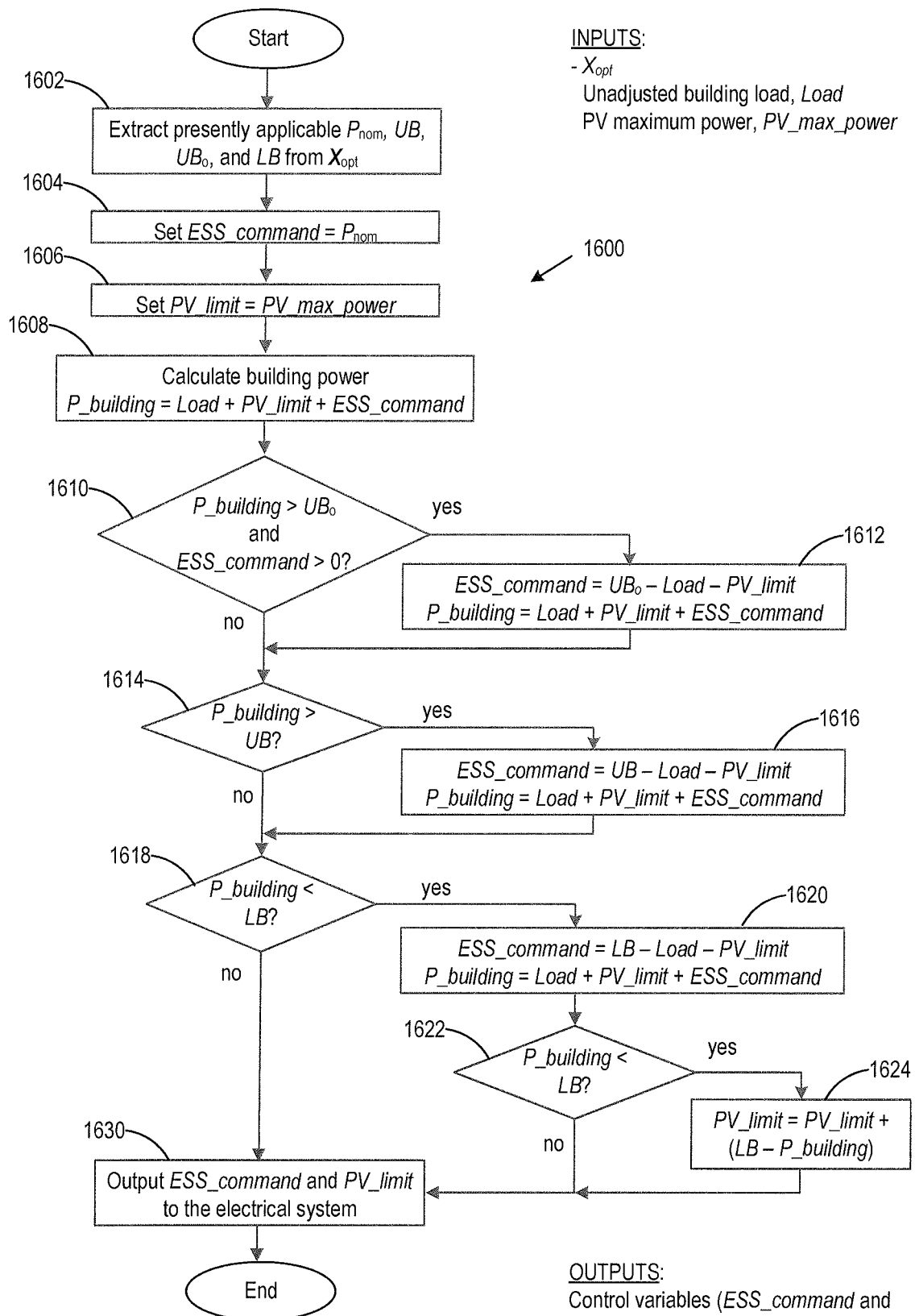
FIG. 16 is a method of a dynamic manager, according to one embodiment of the present disclosure.

FIG. 16 is a method 1600 of a dynamic manager, or HSC, according to one embodiment of the present disclosure, to use a set of optimal control parameters $X_{opt}$ in conjunction with a control law to determine values of a set of control variables to command the electrical system. A set of optimal control parameters ($X_{opt}$), a measurement of unadjusted building load (Load), and PV maximum power (PV_max_power) are received or otherwise available as inputs to the method 1600. The dynamic manager processes $X_{opt}$ to determine a set of control values to effectuate a change to the electrical system toward meeting an objective for economical optimization of the electrical system during an upcoming time domain. The output control variables are the ESS power command (ESS_command) and the photovoltaic limit (PV_limit), which are output to the building electrical system to command an ESS and a photovoltaic subsystem.

The presently applicable $P_{nom}$, UB, $UB_0$, and LB are extracted 1602 from $X_{opt}$. The ESS power command, ESS_command, is set 1604 equal to $P_{nom}$. The photovoltaic limit, PV_limit, is set 1606 equal to PV maximum power, PV_max_power. The building power, P_building, is calculated 1608 as a summation of the unadjusted building load, the photovoltaic limit, and the ESS power command (P_building=Load+PV_limit+ESS_command).

A determination 1610 is made whether the building power is greater than $UB_0$ (P_building>$UB_0$) and whether the ESS command is greater than zero (ESS_command>0). If yes, then variables are set 1612 as:
  ESS_command=$UB_0$−Load−PV_limit
  P_building=Load+PV_limit+ESS_command.

A determination 1614 is made whether building power is greater than UB (P_building>UB). If yes, then variables are set 1616 as:
  ESS_command=UB−Load−PV_limit
  P_building=Load+PV_limit+ESS_command.

A determination 1618 is made whether building power is less than LB (P_building<LB). If yes, then variables are set 1620 as:
  ESS_command=LB−Load−PV_limit
  P_building=Load+PV_limit+ESS_command,
and another determination 1622 is made whether building power remains less than LB (P_building<LB). If yes, then the photovoltaic limit PV_limit is set 1624 as:
  PV_limit+(LB−P_building).
Then the control variables ESS_command and PV_limit are output 1630 to the electrical system.

An Example HSC Result

Figure 17:
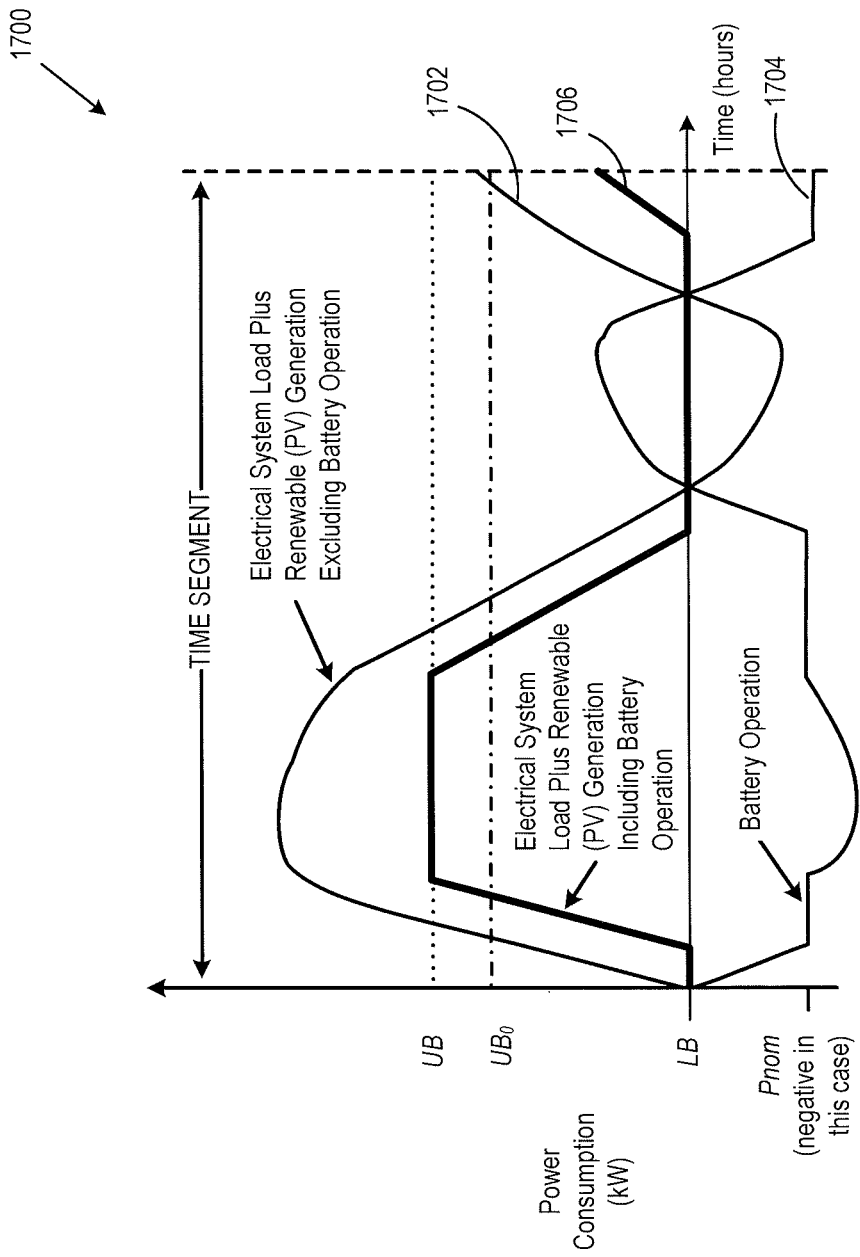
FIG. 17 is a graph showing plots for an example of application of a particular four-parameter control set during a time segment.

FIG. 17 is a graph 1700 showing plots for an example of application of a particular four-parameter control set during a time segment. The graph 1700 shows a value for each of UB, $UB_0$, LB, and $P_{nom}$, which are defined above in Table 1. A vertical axis is the power consumption (or rate of energy consumed), with negative values being generative. A first plot 1702 provides unadjusted values of power consumption (kW) for the electrical system load plus renewable (photovoltaic) generation and excluding battery operation, over the time segment. In other words, the first plot 1702 shows operation of the electrical system without benefit of a controllable ESS (battery) that is controlled by a controller, according to the present disclosure. A second plot 1704 provides values of power consumption (kW) for battery operation over the time segment. The second plot 1704 may reflect operation of an ESS as commanded by the controller. In other words, the second plot 1704 is the control variable for the ESS. The battery operation value may be the value of the control variable to be provided by the HSC to command operation of the ESS. A third plot 1706 provides values of power consumption (kW) for the electrical system load plus renewable (photovoltaic) generation and including battery operation, over the time segment. The third plot 1706 illustrates how the controlled ESS (or battery) affects the power consumption of the electrical system from the grid. Specifically, the battery in this example is controlled (e.g., by the battery operation value) to discharge to reduce the load of the electrical system on the grid and limit peak demand to the UB value when desired. Furthermore, this example shows LB being enforced by commanding the ESS to charge by an amount that limits the adjusted net power to be no less than LB when necessary. Furthermore, this example shows that the nominal ESS power (Pnom) is commanded to the extent possible while still meeting the requirements of UB, $UB_0$, and LB.

In other embodiments, the control parameter set X may have fewer or more parameters than the four described for the example embodiment above. For example, the control parameter set X may be comprised of only three parameters: Pnom, UB, and LB. Alternately, the control parameter set X may be comprised of only two parameters: Pnom and UB. Alternately, the control parameter set X may include only of UB or only of Pnom. Or, it may include any other combination of four or fewer parameters from the above list.

Battery Models

In a battery ESS, battery cost can be a significant fraction of the overall system cost and in many instances can be greater than 60% of the cost of the system. The cost of the battery per year is roughly proportional to the initial cost of the battery and inversely proportional to the lifetime of the battery. Also, any estimated costs of system downtime during replacement of a spent battery may be taken into account. A battery's condition, lifetime, and/or state of health (SoH) may be modeled and/or determined by its degradation rate (or rate of reduction of capacity and its capacity at end of life). A battery's degradation rate can be dependent upon many factors, including time, SoC, discharge or charge rate, energy throughput, and temperature of the battery. The degradation rate may consider capacity of the battery (or loss thereof). Other ways that a battery's condition, lifetime, and/or SoH may be evaluated may be based on a maximum discharge current of the battery or the series resistance of the battery.

Described herein are battery models based on battery degradation as a function of battery capacity as compared to initial capacity or capacity at the beginning of life of the battery. Stated otherwise, the disclosed battery models consider battery condition or state of health according to the battery capacity lost from the capacity at the beginning of life of the battery. As can be appreciated, other battery models may model battery condition according to another way, such as maximum discharge current of the battery, the series resistance of the battery, or the like.

In one embodiment, the battery degradation and its associated cost is included as a cost element in the cost function. By including battery degradation cost in the cost function, as the EO executes to find the minimum cost, the EO can effectively consider the contribution of battery degradation cost for each possible control parameter set X. In other words, the EO can take into account a battery degradation cost when determining (e.g., from a continuum of infinite control possibilities) an optimal control parameter set $X_{opt}$. To accomplish this, a parameterized model of battery performance, especially its degradation rate, can be developed and used in the cost function during the simulation of potential control solutions (e.g., sets of control parameters X). The battery parameters (or constants) for any battery type can be determined that provide a closest fit (or sufficiently close fit within a prescribed tolerance) between the model and the actual battery performance or degradation. Once the parameters are determined, the cost function can be initialized with configuration information containing those parameters so that it is able to use the model in its control simulation in some implementations.

In one embodiment, battery degradation is written in the form of a time or SoC derivative that can be integrated numerically as part of the cost function control simulation to yield battery degradation during the future time domain. In one embodiment, this degradation derivative can be comprised of two components: a wear component (or throughput component) and an aging component. The components can be numerically integrated vs. time using an estimate of the battery SoC at each time step in one embodiment.

Figure 18:
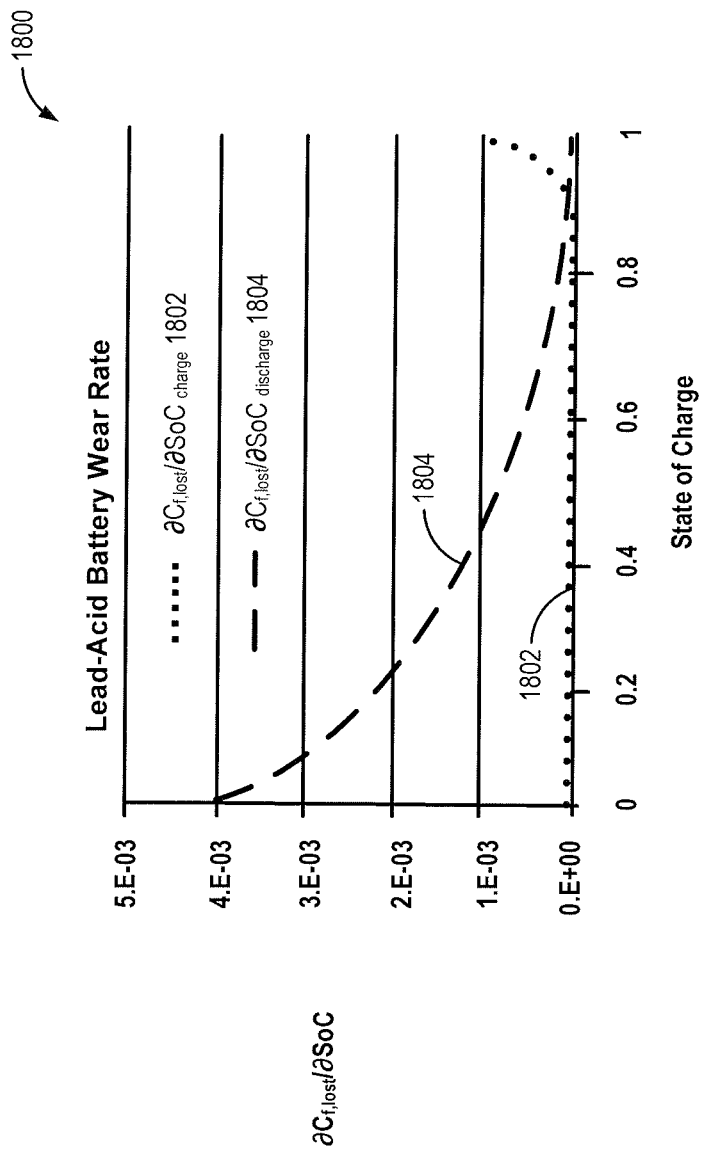
FIG. 18 is a graph providing a plot of the wear rate vs. state of charge for a specific battery degradation model, according to one embodiment of the present disclosure.
Figure 19:
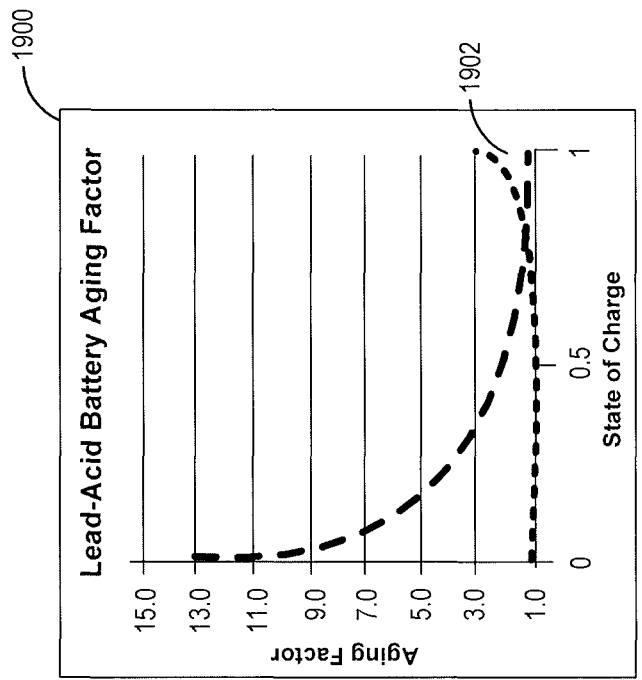
FIG. 19 is a graph providing a plot showing a relationship between state of charge and aging rate (or an aging factor) for a specific battery degradation model, according to one embodiment of the present disclosure.

Examples of components of a battery degradation model, according to one embodiment, that meet these criteria are illustrated by FIGS. 18 and 19. FIG. 18 shows the relationship of wear rate versus SoC for a lead acid battery, based on a battery degradation model that includes wear. FIG. 19 shows a relationship between SoC and aging rate (or aging factor) for a lead acid battery, based on a battery model that includes aging. Battery models that combine both wear and aging can then be fit to match a specific battery's cycle life similar to FIG. 20.

Formulating the battery degradation model as a time or SoC derivative is also beneficial because the model can be used to calculate battery degradation for any arbitrary battery operation profile. (A battery operation profile is a battery's SoC vs. time.) Calculating battery degradation is useful in simulation of the performance (both physical and economic) of a battery ESS. After a simulation produces a battery operation profile, the derivative-based degradation model can be integrated numerically over that profile to produce an accurate estimate of the battery degradation in one embodiment.

Other common degradation or "lifetime" models only provide degradation based on the number of cycles in the profile. With those models, the definition of a "cycle" is problematic, inconsistent, and difficult to use computationally for an arbitrary battery operation profile.

Note that other embodiments of wear and aging models, and their combinations, can be used in addition to those shown and described herein. For those other models, if the models are expressible as derivatives (and/or partial derivatives) with respect to time or with respect to battery SoC, they will also be afforded the advantages already mentioned and will be readily usable as a cost element in a cost function of an EO.

The graphs of FIGS. 18 and 19 illustrate different components of a battery degradation model, according to one embodiment of the present disclosure. The battery degradation model of the illustrated example may model a lead-acid battery and may include a wear component and an aging component. The wear component may include a function of the rate of charge or discharge of the battery, the SoC of the battery, and the temperature of the battery. The aging component may include a function of the battery state including the SoC of the battery and a temperature of the battery.

Consider one measure of a battery condition, a measure of battery degradation $C_f$, which is the maximum battery capacity divided by the maximum battery capacity at beginning of life (BoL). At BoL, $C_f=1.0$. As the battery degrades, $C_f$ decreases. At end of life (EoL), $C_f=C_{f,EoL}\cdot C_{f,EoL}$ is typically between 0.5 and 0.9 and often around 0.8. In some embodiments of present disclosure, changes in $C_f$ can be used to estimate the cost of operating the battery (e.g., battery degradation cost) during that future time domain as:

$$\text{BatteryCost}_{t_1\ldots t_2}=\text{BatteryCost}_{total}*(C_{f,t1}-C_{f,t2})/(1-C_{f,EOL})$$

where $\text{BatteryCost}_{total}$ a total battery cost (for example an initial or net present is cost), and $C_{f,t1}-C_{f,t2}$ is the change in $C_f$ between time $t_1$ and $t_2$. In other words, $C_{f,t1}-C_{f,t2}$ is a measure of degradation of the battery between times $t_1$ and $t_2$. The battery lifetime is that point at which $C_f$ reaches $C_{f,EOL}$, which is the manufacturer's failure limit (usually 0.8 or 80% of initial maximum capacity).

Determining the battery degradation cost for a time period may include multiplying the change in $C_f$ by a cost factor. The cost factor may be the total cost of the battery divided by the total decrease in $C_f$ at end of life, $\text{BatteryCost}_{total}/(1-C_{f,EOL})$. In other words, the cost factor may be determined as a lifetime cost of the battery divided by the amount of battery degradation resulting in end of life of the battery.

To determine the change in $C_f$ between times $t_1$ and $t_2$, two components (wear and aging) can be considered as two partial derivatives of $C_f$ with respect to SoC and t respectively. A battery's capacity change during some future time domain from $t=t_1$ to $t=t_2$ can be determined using calculus as:

$$C_{f,t1}-C_{f,t2}=-\int_{t=t_1}^{t=t_2}\left[\frac{\partial C_f}{\partial SoC}\frac{dSoC}{dt}+\frac{\partial C_f}{\partial t}\right]dt,$$

where the rate of change of $C_f$ due to wear (throughput), the "wear rate," is denoted $$\frac{\partial C_f}{\partial SoC},$$

the rate of change of $C_f$ due to aging, the "aging rate," is denoted $$\frac{\partial C_f}{\partial t},$$

and the rate of change of state of charge (denoted "SoC" and ranging from 0 to 1) versus time is denoted $$\frac{dSoC}{dt}.$$

This equation may be integrated numerically using many commonly known methods including the trapezoidal rule. The derivative $$\frac{dSoC}{dt}$$

can be obtained from the simulation performed by the cost function, and can be calculated as a discretized value $$\frac{\Delta SoC}{\Delta t}.$$

Regarding the rate of change of $C_f$ due to wear, an exponential model can be used that depends upon whether the battery is discharging, $$\frac{dSoC}{dt}<0,$$

or charging, $$\frac{dSoC}{dt}\geq 0.$$

For example, the wear rate can be expressed as, $$\frac{\partial C_f}{\partial SoC} = \begin{cases} -A*e^{-BSoC} - E & \frac{dSoC}{dt} < 0 \\ -C*e^{D(SoC-1)} - F & \frac{dSoC}{dt} \geq 0 \end{cases},$$

where A and B specify the rate of increase in degradation during discharging, E represents the baseline degradation during discharging, C and D specify the rate of increase in degradation during charging, and F represents the baseline degradation during charging.

FIG. 18 is a graph 1800 of the exponential battery wear model for a specific battery degradation model, according to one embodiment of the present disclosure. FIG. 18 provides plots 1802, 1804 of the negative of the "wear rate,"

$$\frac{\partial C_{f,loss}}{\partial SoC} = -\frac{\partial C_f}{\partial SoC},$$

versus SoC. Put another way, plots 1802 and 1804 represent the rate of battery capacity loss versus a change in the state of charge of the battery. A vertical axis of the graph 1800 shows the negative of the wear rate in dimensionless units. A horizontal axis of the graph 1800 shows a battery SoC, where 1.0=100% (fully charged state). One plot 1802 shows the negative of the wear rate during charging, and a second plot 1804 shows the negative of the wear rate during discharging. The plots 1802, 1804 are computed using the above corresponding equations with parameters (A through F) selected specifically to match a type of lead-acid battery. The parameters in this case are A=4e−3, B=5.63, C=9e−4, D=27.4, E=3e−5, and F=3e−5.

Regarding the rate of change of $C_f$ due to aging, an exponential model for the rate of change in fractional capacity versus time can be used. For example, the aging rate can be expressed as, $$\frac{\partial C_f}{\partial t} = \\ -G*[\text{Aging Factor}] = -G*\left[\left(1-(1-H)e^{-\frac{SoC}{I}}\right)*\left(1-(1-J)e^{\frac{(SoC-1)}{K}}\right)\right],$$

where G represents the nominal aging rate in units of fractional capacity lost (e.g., 2% per year) versus time. The Aging Factor, when multiplied by the nominal aging rate G and by −1, gives the aging rate. A 1.0 aging factor indicates the aging rate is at −G. Also, H and I define the rate of increase in aging rate as SoC approaches 0, and J and K define the rate of increase in aging rate as the SoC approaches 1.

FIG. 19 is a graph 1900 providing a plot 1902 showing a relationship between Aging Factor and SoC for a specific battery degradation model, according to one embodiment of the present disclosure. The vertical axis of the graph 1900 shows an Aging Factor. The horizontal axis of the graph 1900 shows the SoC of the battery being modeled. The plot 1902 reflects the values for the Aging Factor:

$$\left(1-(1-H)e^{-\frac{SoC}{I}}\right)*\left(1-(1-J)e^{\frac{(SoC-1)}{K}}\right)$$

where in this example the aging parameters are H=15.0, I=0.2, J=2.5, and K=0.02.

As noted above, a cost function, according to one embodiment, may sum multiple cost elements for operation of an electrical system, including the cost element BatteryCost$_{t1\ldots t2}$, or BatteryCost$_{t1\ldots t2}$*24 hr/(t$_2$−t$_1$) in embodiments where the cost function determines a cost per day and t$_1$ and t$_2$ have units of hours.

The model explained above can also be described in terms of capacity lost $C_{f,lost}$. The model includes both capacity lost due to battery wear (throughput), $C_{f,lost,wear}$, and capacity lost due to battery aging, $C_{f,lost,aging}$. In other words, capacity lost can be expressed as:

$$C_{f,lost} = C_{f,lost,wear} + C_{f,lost,aging}.$$

The battery end of life is that point at which $C_{f,lost}$ reaches 1 minus the manufacturer's failure limit (usually 0.2 or 20% of initial capacity, which again sets a failure point at 80% of original capacity).

Capacity lost due to battery wear (throughput), $C_{f,lost,wear}$, can be modeled with an exponential model for the rate of change in $C_{f,lost}$ versus SoC. For example, a discharge formulation of the loss of fractional capacity per unit change in fractional SoC applicable during a decreasing SoC can be expressed as, $$\frac{\partial C_{f,lost}}{\partial SoC_{discharge}} = A*e^{-BSoC} + E$$

and a charge formulation of the loss of fractional capacity per unit change in fractional SoC applicable during an increasing SoC can be expressed as, $$\frac{\partial C_{f,lost}}{\partial SoC_{charge}} = C*e^{D(SoC-1)} + F.$$

As before, SoC is the state of charge of the battery, A and B specify the rate of increase in degradation during discharging, E represents the baseline degradation during discharging, C and D specify the rate of increase in degradation during charging, and F represents the baseline degradation during charging. As noted previously, the graph 1800 of FIG. 18 provides plots 1802, 1804 of $$\frac{\partial C_{f,lost}}{\partial SoC} \text{ vs.}$$

SoC for this specific battery degradation model.

For a given battery SoC profile, the total capacity loss due to wear, $C_{f,lost,wear}$, between times $t_1$ and $t_2$ can be calculated with:

$$\frac{\partial C_{f,lost}}{\partial SoC}\frac{dSoC}{dt} = \begin{cases} -\frac{\partial C_{f,lost}}{\partial SoC_{discharge}}\frac{dSoC}{dt} & \frac{dSoC}{dt} < 0 \\ \frac{\partial C_{f,lost}}{\partial SoC_{charge}}\frac{dSoC}{dt} & \frac{dSoC}{dt} \geq 0 \end{cases}$$

$$C_{f,lost,wear} = \int_{t=t_1}^{t=t_2} \frac{\partial C_{f,lost}}{\partial SoC}\frac{dSoC}{dt} dt$$

Capacity lost due to battery aging, $C_{f,lost,aging}$, can be represented differentially by defining the rate of battery capacity loss versus time, or more specifically in one embodiment, the rate of change in fractional capacity lost versus time. In one example, this differential representation of battery capacity loss can take an exponential form as, $$\frac{\partial C_{f,lost}}{\partial t} = G*[\text{Aging Factor}] = G*\left[\left(1-(1-H)e^{-\frac{SoC}{I}}\right)*\left(1-(1-J)e^{\frac{(SoC-1)}{K}}\right)\right],$$

where, as before, G represents the nominal aging rate in units of fractional capacity lost (e.g., 2% per year) versus time. The Aging Factor, when multiplied by the nominal aging rate G and by −1, gives the aging rate. A 1.0 aging factor indicates the aging rate is at −G. Also, H and I define the rate of increase in aging rate as SoC approaches 0, and J and K define the rate of increase in aging rate as the SoC approaches 1.

For a given battery SoC profile, the total battery capacity loss due to aging, $C_{f,lost,aging}$, between times $t_1$ and $t_2$ can be calculated with:

$$C_{f,lost,aging} = \int_{t=t_1}^{t=t_2} \frac{\partial C_{f,lost}}{\partial t} dt$$

As noted previously, the graph 1900 of FIG. 19 provides a plot 1902 showing a relationship between SoC and aging rate (or an aging factor) for this specific battery degradation model.

Combining the two components (wear and aging) from the previous examples, a battery's capacity lost during some future time domain from $t=t_1$ to $t_2$ can be determined as:

$$C_{f,lost} =$$
$$C_{f,lost,wear} + C_{f,lost,aging} = \int_{t=t_1}^{t=t_2}\frac{\partial C_{f,lost}}{\partial SoC}\frac{dSoC}{dt}dt + \int_{t=t_1}^{t=t_2}\frac{\partial C_{f,lost}}{\partial t}dt =$$
$$\int_{t=t_1}^{t=t_2}\left[\frac{\partial C_{f,lost}}{\partial SoC}\frac{dSoC}{dt} + \frac{\partial C_{f,lost}}{\partial t}\right]dt$$

Once the battery capacity lost is determined over the future time domain by numerically integrating the above equation, the cost of operating the battery (e.g., a battery degradation cost) during that future time domain can be calculated as:

$$BatteryCost_{t_1...t_2} = BatteryCost_{total} * \frac{C_{f,lost}}{(1-C_{f,EOL})},$$

where $BatteryCost_{total}$ is a total battery cost (for example an initial or net present cost) and $C_{f,EoL}$ is the fractional battery capacity remaining at end of life. Stated otherwise, determining the battery degradation cost for a time period comprises multiplying the total battery degradation for the time period by a cost factor. The cost factor may be the total cost of the battery divided by the total fractional capacity loss during the battery's lifetime, $BatteryCost_{total}/(1-C_{f,EOL})$. In other words, the cost factor may be determined as a lifetime cost of the battery divided by the amount of battery degradation resulting in end of life of the battery.

Using the combined wear and aging model described above, coefficients can be found that result in a fit to a battery manufacturer's cycle life.

Figure 20:
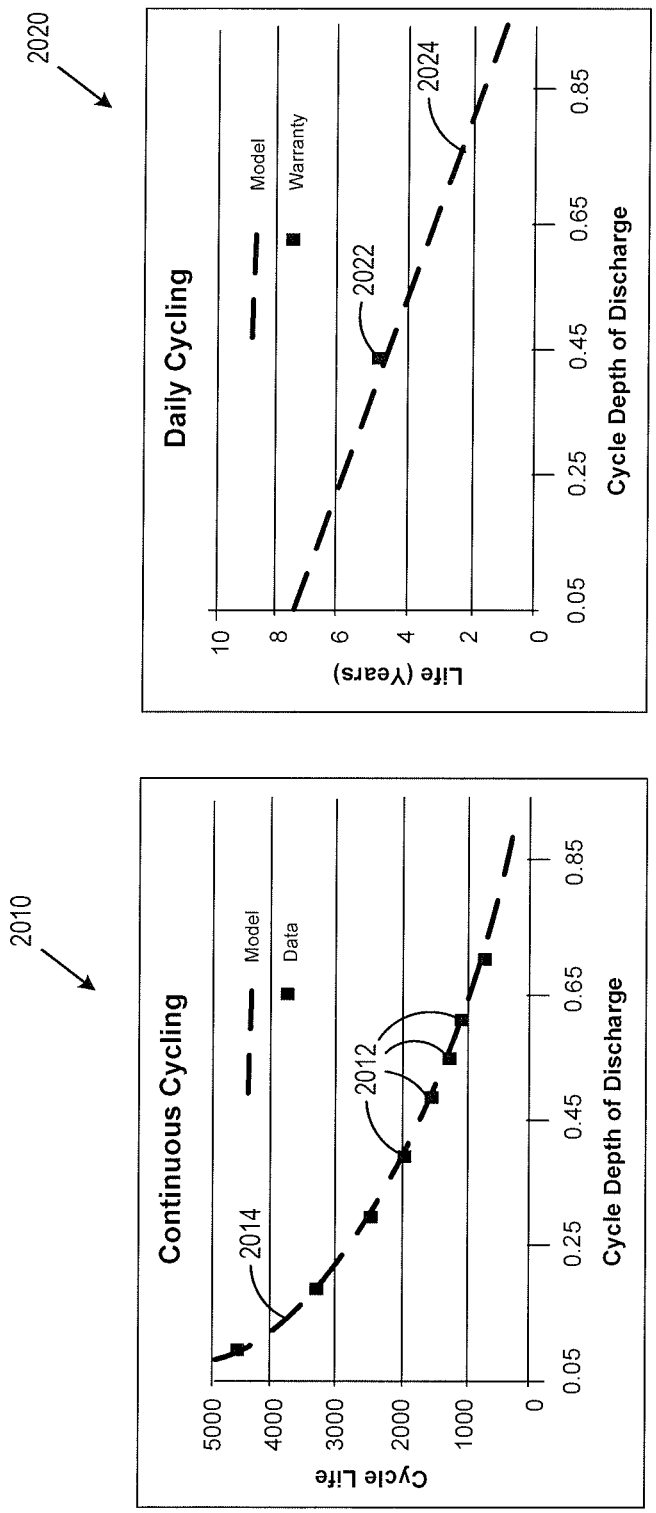
FIG. 20 is a pair of graphs that illustrate a battery's lifetime.

FIG. 20 is a pair of graphs 2010, 2020 that illustrate a battery's lifetime. Graph 2010 shows the manufacturer's data 2012 for battery cycle life (number of cycles) versus depth of discharge under continuous cycling conditions. Graph 2020 shows the manufacturer's data 2022 for battery lifetime (in years) versus depth of discharge assuming one cycle per day. The coefficients determined to match the data of this manufacturer's cycle life for the example battery may be:

A=4e−3, B=5.63, C=9e−4, D=27.4, E=3e−5, F=3e−5, G=1.95e−6 hr$^{-1}$, H=15.0, I=0.2, J=2.5, and K=0.02.

Graph 2010 includes a plot 2014 of the model with the above coefficients aligning with the manufacturer's data 2012 and providing a projected battery cycle life versus depth of discharge. Graph 2020 includes a plot 2024 of the model with the above coefficients aligning with the manufacturer's data 2022 and providing projected battery lifetime versus depth of discharge.

As can be appreciated, different coefficients and/or different battery degradation models may be used, depending on a type of battery deployed in an ESS, according to the present disclosure.

Other battery models may be used to estimate Coulombic and Ohmic efficiency or the maximum rates of charge and discharge. Similar to the degradation model described above, the efficiency and maximum charge and discharge rates may be parameterized with constants that achieve a substantial "fit" between the model and the expected battery performance. Once these battery performance models are defined and parameters are provided, they may be used in the cost function control simulation to better predict the outcome of application of various control parameter sets.

Apparatus Architectures

Figure 21:
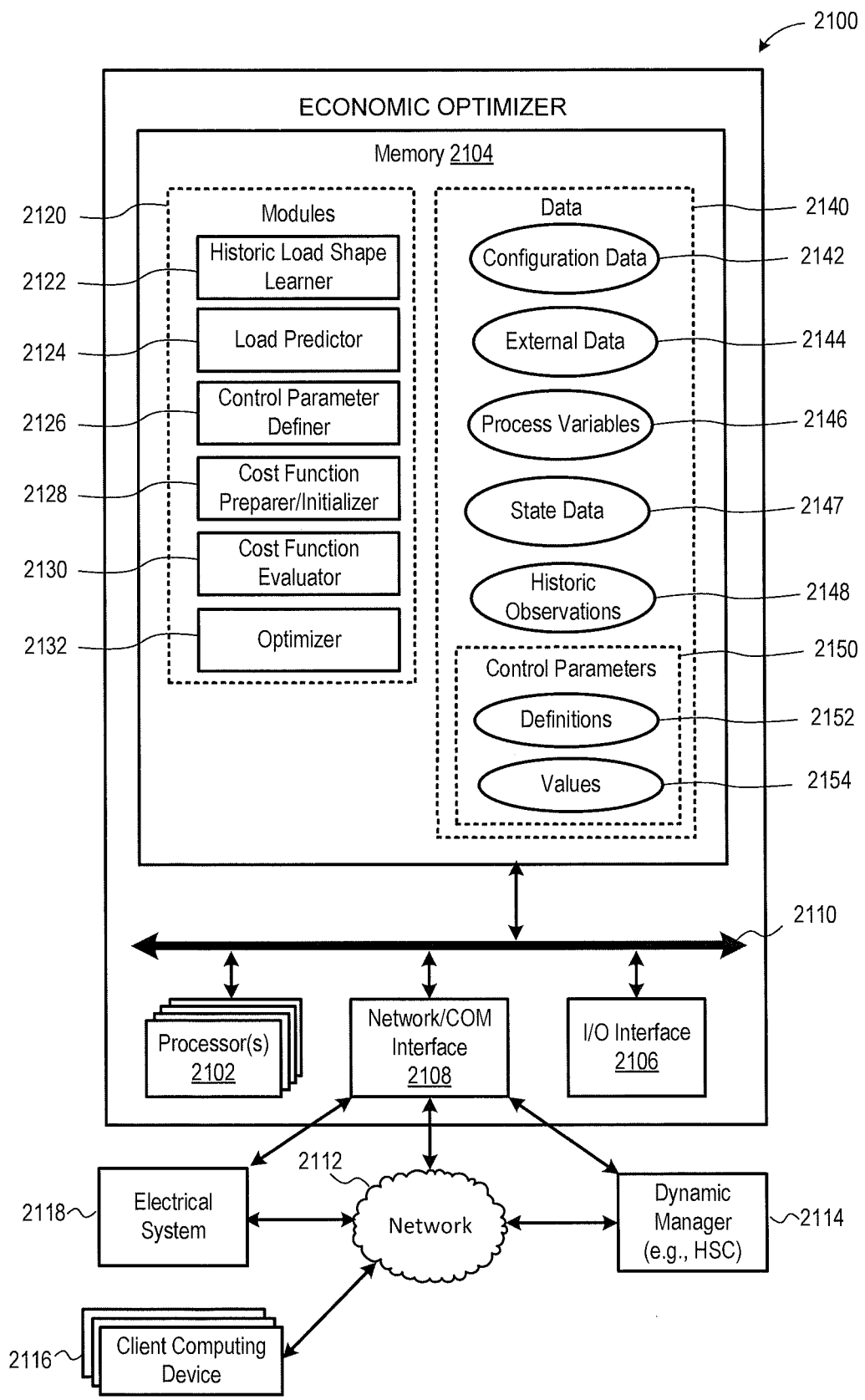
FIG. 21 is a diagram of an economic optimizer, according to one embodiment of the present disclosure.

FIG. 21 is a diagram of an EO 2100 according to one embodiment of the present disclosure. The EO 2100 may determine a control plan for managing control of an electrical system 2118 during an upcoming time domain and provide the control plan as output. The determined control plan may include a plurality of sets of parameters each to be applied for a different time segment within an upcoming time domain. The EO 2100 may determine the control plan based on a set of configuration elements specifying one or more constraints of the electrical system 2118 and defining one or more cost elements associated with operation of the electrical system. The EO 2100 may also determine the control plan based on a set of process variables that provide one or more measurements of a state of the electrical system 2118. The EO 2100 may include one or more processors 2102, memory 2104, an input/output interface 2106, a network/COM interface 2108, and a system bus 2110.

The one or more processors 2102 may include one or more general purpose devices, such as an Intel®, AMD®, or other standard microprocessor. The one or more processors 2102 may include a special purpose processing device, such as ASIC, SoC, SiP, FPGA, PAL, PLA, FPLA, PLD, or other customized or programmable device. The one or more processors 2102 perform distributed (e.g., parallel) processing to execute or otherwise implement functionalities of the present embodiments. The one or more processors 2102 may run a standard operating system and perform standard operating system functions. It is recognized that any standard operating systems may be used, such as, for example, Microsoft® Windows®, Apple® MacOS®, Disk Operating System (DOS), UNIX, IRJX, Solaris, SunOS, FreeBSD, Linux®, ffiM® OS/2® operating systems, and so forth.

The memory 2104 may include static RAM, dynamic RAM, flash memory, one or more flip-flops, ROM, CD-ROM, DVD, disk, tape, or magnetic, optical, or other computer storage medium. The memory 2104 may include a plurality of program modules 2120 and a data 2140.

The program modules 2120 may include all or portions of other elements of the EO 2100. The program modules 2120 may run multiple operations concurrently or in parallel by or on the one or more processors 2102. In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, subsystems and/or the like.

The system memory 2104 may also include the data 2140. Data generated by the EO 2100, such as by the program modules 2120 or other modules, may be stored on the system memory 2104, for example, as stored program data 2140. The data 2140 may be organized as one or more databases.

The input/output interface 2106 may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

The network/COM interface 2108 may facilitate communication or other interaction with other computing devices (e.g., a dynamic manager 2114) and/or networks 2112, such as the Internet and/or other computing and/or communications networks. The network/COM interface 2108 may be equipped with conventional network connectivity, such as, for example, Ethernet (IEEE 802.3), Token Ring (IEEE 802.5), Fiber Distributed Datalink Interface (FDDI), or Asynchronous Transfer Mode (ATM). Further, the network/COM interface 2108 may be configured to support a variety of network protocols such as, for example, Internet Protocol (IP), Transfer Control Protocol (TCP), Network File System over UDP/TCP, Server Message Block (SMB), Microsoft® Common Internet File System (CIFS), Hypertext Transfer Protocols (HTTP), Direct Access File System (DAFS), File Transfer Protocol (FTP), Real-Time Publish Subscribe (RTPS), Open Systems Interconnection (OSI) protocols, Simple Mail Transfer Protocol (SMTP), Secure Shell (SSH), Secure Socket Layer (SSL), and so forth. The network/COM interface 2108 may be any appropriate communication interface for communicating with other systems and/or devices.

The system bus 2110 may facilitate communication and/or interaction between the other components of the system, including the one or more processors 2102, the memory 2104, the input/output interface 2106, and the network/COM interface 2108.

The modules 2120 may include a historic load shape learner 2122, a load predictor 2124, a control parameter definer 2126, a cost function preparer/initializer 2128, a cost function evaluator 2130, and an optimizer 2132.

The historic load shape learner 2122 may compile or otherwise gather historic trends to determine a historic profile or an average load shape that may be used for load prediction. The historic load shape learner 2122 may determine and update and an avg_load_shape array and an avg_load_shape_time_of_day array by recording load observations and using an approach to determine a suitable average of the historic load observations after multiple periods of time. The historic load shape learner 2122 may utilize a process or an approach to determining the historic average profile such as described above with reference to FIG. 8.

The load predictor 2124 may predict a load on the electrical system 2118 during an upcoming time domain. The load predictor 2124 may utilize a historic profile or historic load observations provided by the historic load shape learner 2122. The load predictor 2124 may utilize a load prediction method such as described above with reference to FIGS. 7 and 8.

The control parameter definer 2126 may generate, create, or otherwise define a control parameter set X, in accordance with a control law. The created control parameters 2150 may include a definition 2152 and a value 2154 and may be stored as data 2140.

The cost function preparer/initializer 2128 prepares or otherwise obtains a cost function to operate on the control parameter set X. The cost function may include the one or more constraints and the one or more cost elements associated with operation of the electrical system 2118. The cost function preparer/initializer 2128 pre-calculates certain values that may be used during iterative evaluation of the cost function involved with optimization.

The cost function evaluator 2130 evaluates the cost function based on the control parameter set X. Evaluating the cost function simulates operation of the electrical system for a given time period under a given set of circumstances set forth in the control parameter set X and returns a cost of operating the electrical system during the given time period.

The optimizer 2128 may execute a minimization of the cost function by utilizing an optimization algorithm to find the set of values for the set of control variables. Optimization (e.g., minimization) of the cost function may include iteratively utilizing the cost function evaluator 2130 to evaluate the cost function with different sets of values for a control parameter set X until a minimum cost is determined. In other words, the algorithm may iteratively change values for the control parameter set X to identify an optimal set of values in accordance with one or more constraints and one or more cost elements associated with operation of the electrical system.

The data 2140 may include configuration data 2142, external data 2144, process variables 2146, state data 2147, historic observations 2148, and control parameters 2150 (including definitions 2152 and values 2154).

The configuration data 2142 may be provided to, and received by, the EO 2100 to communicate constraints and characteristics of the electrical system 2118.

The external data 2144 may be received as external input (e.g., weather reports, changing tariffs, fuel costs, event data), which may inform the determination of the optimal set of values.

The process variables 2146 may be received as feedback from the electrical system 2118. The process variables 2146 are typically measurements of the electrical system 2118 state and are used to, among other things, determine how well objectives of controlling the electrical system 2118 are being met.

The state data 2147 would be any EO state information that may be helpful to be retained between one EO iteration and the next. An example is avg_load_shape.

The historic observations 2148 are the record of process variables that have been received. A good example is the set of historic load observations that may be useful in a load predictor algorithm.

As noted earlier, the control parameter definer may create control parameters 2150, which may include a definition 2152 and a value 2154 and may be stored as data 2140. The cost function evaluator 2130 and/or the optimizer 2132 can determine values 2154 for the control parameters 2150.

The EO 2100 may provide one or more control parameters 2150 as a control parameter set X to the dynamic manager 2114 via the network/COM interface 2108 and/or via the network 2112. The dynamic manager 2114 may then utilize the control parameter set X to determine values for a set of control variables to deliver to the electrical system 2118 to effectuate a change to the electrical system 2118 toward meeting one or more objectives (e.g., economic optimization) for controlling the electrical system 2118.

In other embodiments, the EO 2100 may communicate the control parameter set X directly to the electrical system 2118 via the network/COM interface 2108 and/or via the network 2112. In such embodiments, the electrical system 2118 may process the control parameter set X directly to determine control commands, and the dynamic manager 2114 may not be included.

In still other embodiments, the EO 2100 may determine values for a set of control variables (rather than for a control parameter set X) and may communicate the set of values for the control variables directly to the electrical system 2118 via the network/COM interface 2108 and/or via the network 2112.

One or more client computing devices 2116 may be coupled via the network 2112 and may be used to configure, provide inputs, or the like to the EO 2100, the dynamic manager 2114, and/or the electrical system 2118.

Figure 22:
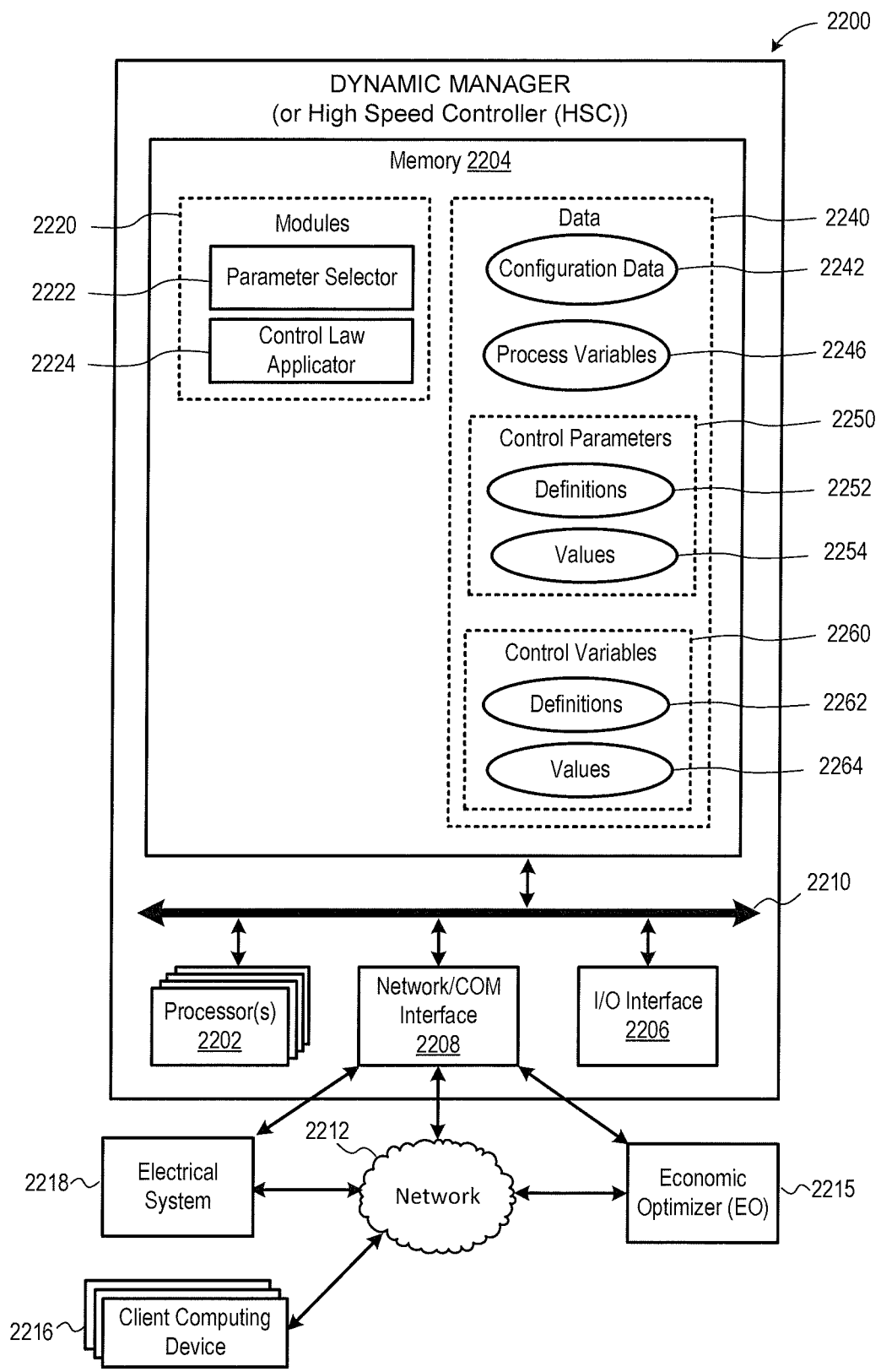
FIG. 22 is a diagram of a dynamic manager, according to one embodiment of the present disclosure.

FIG. 22 is a diagram of a dynamic manager 2200, according to one embodiment of the present disclosure. The dynamic manager 2200, according to one embodiment of the present disclosure, is a second computing device that is separate from an EO 2215, which may be similar to the EO 2100 of FIG. 21. The dynamic manager 2200 may operate based on input (e.g., a control parameter set X) received from the EO 2215. The dynamic manager 2200 may determine a set of control values for a set of control variables for a given time segment of the upcoming time domain and provide the set of control values to an electrical system 2218 to effectuate a change to the electrical system 2218 toward meeting an objective (e.g., economical optimization) of the electrical system 2218 during an upcoming time domain. The dynamic manager 2200 determines the set of control values based on a control law and a set of values for a given control parameter set X. The dynamic manager 2200 may include one or more processors 2202, memory 2204, an input/output interface 2206, a network/COM interface 2208, and a system bus 2210.

The one or more processors 2202 may include one or more general purpose devices, such as an Intel®, AMD®, or other standard microprocessor. The one or more processors 2202 may include a special purpose processing device, such as ASIC, SoC, SiP, FPGA, PAL, PLA, FPLA, PLD, or other customized or programmable device. The one or more processors 2202 perform distributed (e.g., parallel) processing to execute or otherwise implement functionalities of the present embodiments. The one or more processors 2202 may run a standard operating system and perform standard operating system functions. It is recognized that any standard operating systems may be used, such as, for example, Microsoft® Windows®, Apple® MacOS®, Disk Operating System (DOS), UNIX, IRJX, Solaris, SunOS, FreeBSD, Linux®, ffiM® OS/2® operating systems, and so forth.

The memory 2204 may include static RAM, dynamic RAM, flash memory, one or more flip-flops, ROM, CD-ROM, DVD, disk, tape, or magnetic, optical, or other computer storage medium. The memory 2204 may include a plurality of program modules 2220 and a program data 2240.

The program modules 2220 may include all or portions of other elements of the dynamic manager 2200. The program modules 2220 may run multiple operations concurrently or in parallel by or on the one or more processors 2202. In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, and/or the like.

The system memory 2204 may also include data 2240. Data generated by the dynamic manager 2200, such as by the program modules 2220 or other modules, may be stored on the system memory 2204, for example, as stored program data 2240. The stored program data 2240 may be organized as one or more databases.

The input/output interface 2206 may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

The network/COM interface 2208 may facilitate communication with other computing devices and/or networks 2212, such as the Internet and/or other computing and/or communications networks. The network/COM interface 2208 may couple (e.g., electrically couple) to a communication path (e.g., direct or via the network) to the electrical system 2218. The network/COM interface 2208 may be equipped with conventional network connectivity, such as, for example, Ethernet (IEEE 802.3), Token Ring (IEEE 802.5), Fiber Distributed Datalink Interface (FDDI), or Asynchronous Transfer Mode (ATM). Further, the network/COM interface 2208 may be configured to support a variety of network protocols such as, for example, Internet Protocol (IP), Transfer Control Protocol (TCP), Network File System over UDP/TCP, Server Message Block (SMB), Microsoft® Common Internet File System (CIFS), Hypertext Transfer Protocols (HTTP), Direct Access File System (DAFS), File Transfer Protocol (FTP), Real-Time Publish Subscribe (RTPS), Open Systems Interconnection (OSI) protocols, Simple Mail Transfer Protocol (SMTP), Secure Shell (SSH), Secure Socket Layer (SSL), and so forth.

The system bus 2210 may facilitate communication and/or interaction between the other components of the system, including the one or more processors 2202, the memory 2204, the input/output interface 2206, and the network/COM interface 2208.

The modules 2220 may include a parameter selector 2222 and a control law applicator 2224.

The parameter selector may pick which set of parameters to be used from the control parameter set X, according to a given time segment.

The control law applicator 2224 may process the selected set of parameters from the control parameter set X and convert or translate the individual set of parameters into control variables (or values thereof). The control law applicator 2224 may apply logic and/or a translation process to determine a set of values for a set of control variables based on a given set of parameters (from a control parameter set X) for a corresponding time segment. For example, the control law applicator 2224 may apply a method and/or logic as shown in FIG. 16.

The data 2240 may include configuration data 2242, process variables 2246, control parameters 2250 (including definitions 2252 and values 2254), and/or control variables 2260 (including definitions 2262 and values 2264).

The configuration data 2242 may be provided to, and received by, the dynamic manager 2200 to communicate constraints and characteristics of the electrical system 2118.

The process variables 2246 may be received as feedback from the electrical system 2218. The process variables 2246 are typically measurements of the electrical system 2218 state and are used to, among other things, determine how well objectives of controlling the electrical system 2218 are being met. Historic process variables 2246 may be utilized by the HSL for example to calculate demand which may be calculated as average building power over the previous 15 or 30 minutes. The dynamic manager 2200 can determine the set of control values for the set of control variables based on the process variables 2246.

The control parameters 2250 may comprise a control parameter set X that includes one or more sets of parameters each for a corresponding time segment of an upcoming time domain. The control parameters 2250 may additionally, or alternately, provide a control plan for the upcoming time domain. The control parameters 2250 may be received from an EO 2215 as an optimal control parameter set $X_{opt}$.

The control variables 2260 may be generated by the parameter interpreter 2222 based on an optimal control parameter set $X_{opt}$.

The dynamic manager 2200 may receive the optimal control parameter set $X_{opt}$ from the EO 2215 via the network/COM interface 2208 and/or via the network 2212. The dynamic manager 2200 may also receive the process variables from the electrical system 2218 via the network/COM interface 2208 and/or via the network 2212.

The dynamic manager 2200 may provide the values for the set of control variables to the electrical system 2218 via the network/COM interface 2208 and/or via the network 2212.

One or more client computing devices 2216 may be coupled via the network 2212 and may be used to configure, provide inputs, or the like to the EO 2215, the dynamic manager 2200, and/or the electrical system 2218.

Example Cases of Energy Costs

Figure 23:
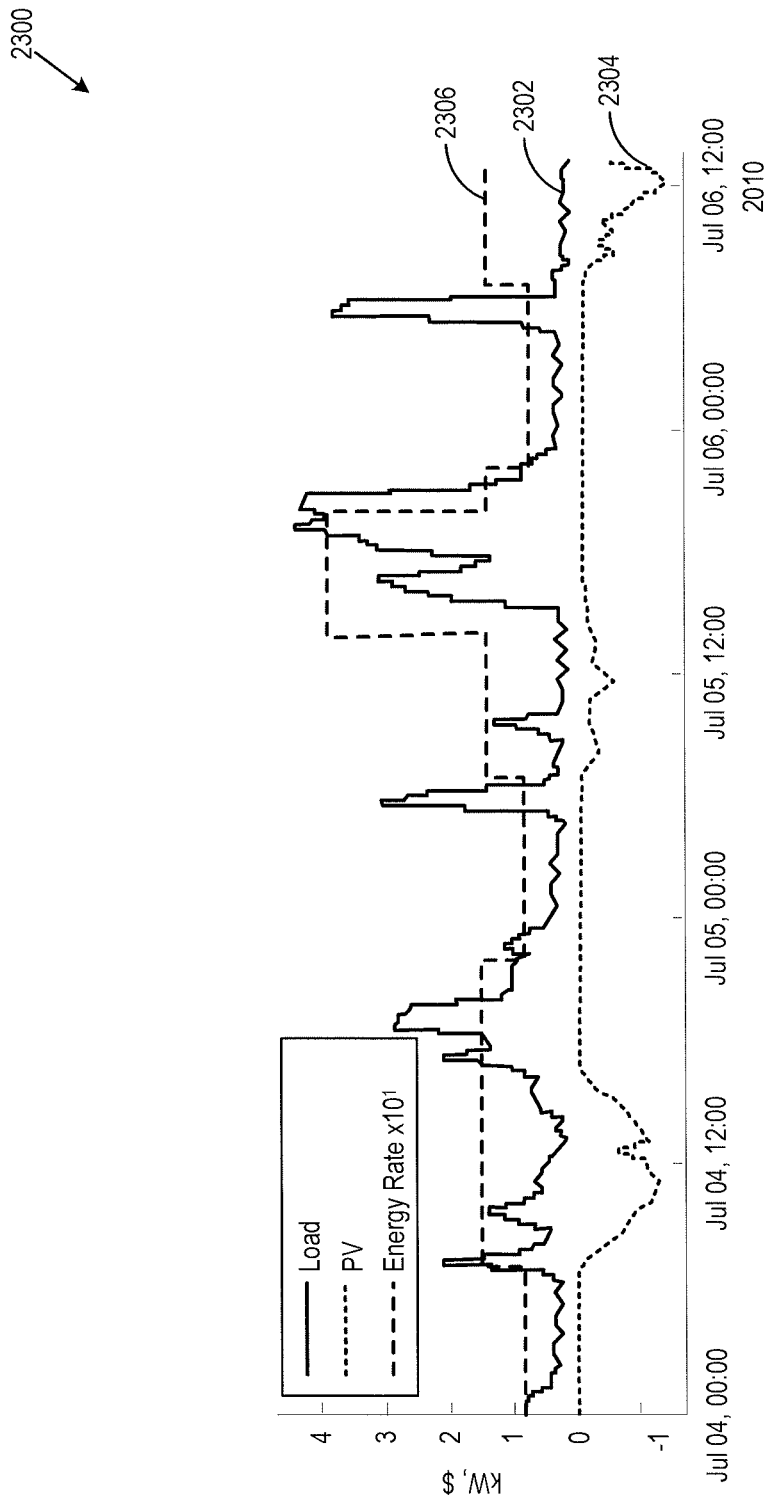
FIG. 23 is a graph illustrating how Time-of-Use (ToU) supply charges impact energy costs of a customer.

FIG. 23 is a graph 2300 illustrating how Time-of-Use (ToU) supply charges impact energy costs of a customer. ToU supply charges are time-specific charges customers pay for electrical energy consumed. The graph 2300 includes a plot 2302 of the load and a plot 2304 of a photovoltaic contribution. The graph 2300 includes a plot 2306 of ToU supply (or energy) rate. As can be seen in the illustrated example, ToU supply charges can vary by time of day, day of week, and season (summer vs. winter). ToU supply charges are calculated based on the NET energy consumed during specific meter read intervals (often 15 or 30 minutes). In the illustrated example, the supply rates are as follows:

Peak M-F 2 pm-8 pm $0.39/kWh,
Off-Peak 10p-7 am $0.08/kWh,
Shoulder $0.15/kWh.

In the example, based on the load, the photovoltaic generation, and the supply rates, the Supply Charge on July 05 is approximately: 12.2*0.39+1.6*0.08+4.1*0.15=$5.50.

FIG. 24 is a graph 2400 illustrating how demand charges impact energy costs of a customer. Demand charges are electrical distribution charges that customers pay based on their maximum demand (kW) during a specified window of time. The graph 2400 includes a plot 2402 of the load and a plot 2404 of the demand. The graph 2400 also includes a plot 2406 of the demand rate. Demand charges are typically calculated monthly but can also be daily. The maximum is often only taken for certain hours of the day. In the illustrated embodiment, a daily demand rate from 8:00 am to 10:00 pm on weekdays is $0.84/kW (daily). The peak demand on May 21 is 416 kW. Accordingly the Demand Charge=416*0.84=$349.

Figure 25:
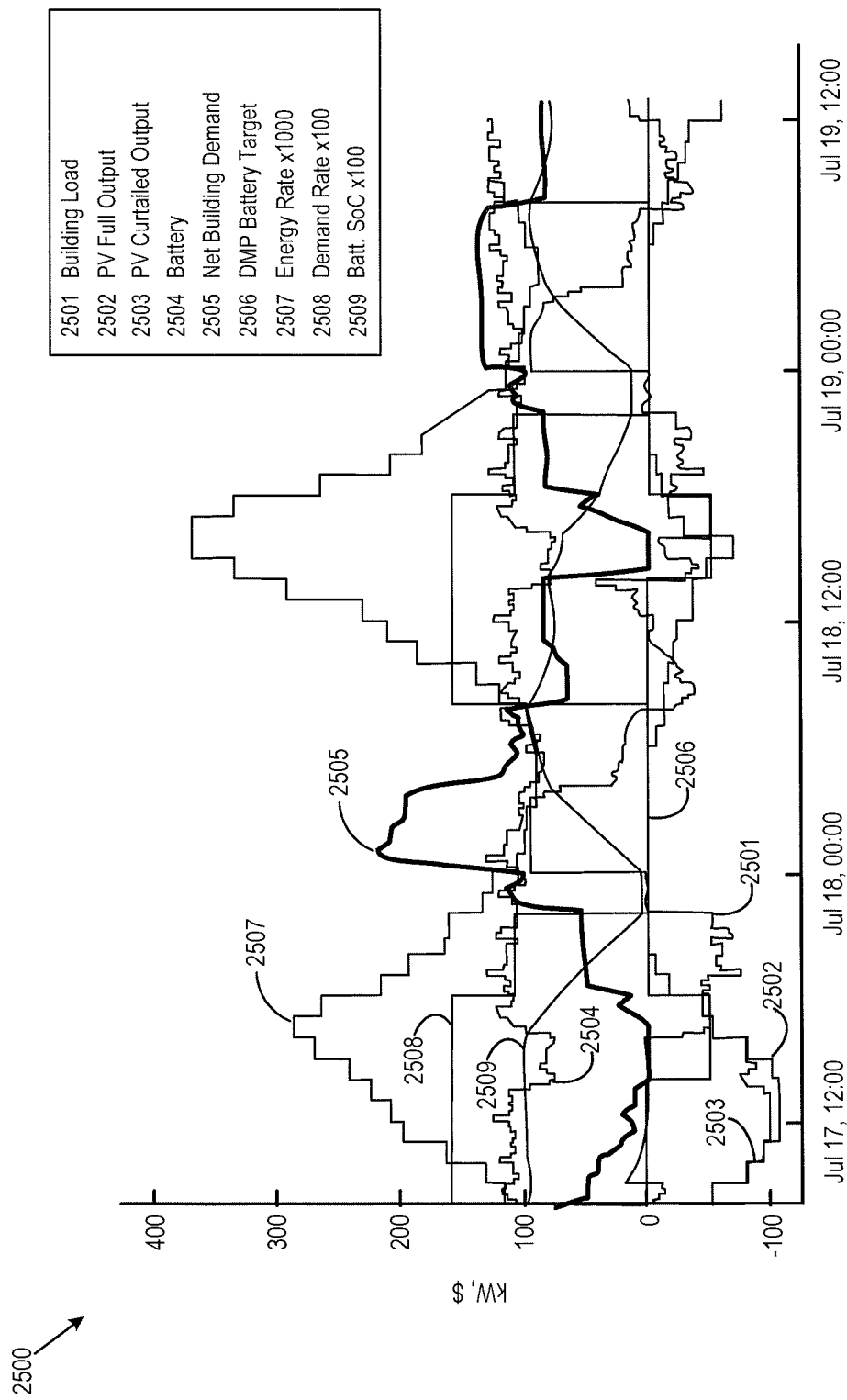
FIG. 25 is a graph illustrating the challenge of maximizing a customer's economic returns for a wide range of system configurations, building load profiles, and changing utility tariffs.

FIG. 25 is a graph 2500 illustrating the challenge of maximizing a customers' economic returns for a wide range of system configurations, building load profiles, and changing utility tariffs. The graph 2500 reflects consideration of a number of factors, including:

ToU Supply Charges (seasonal, hourly, for any number of time windows)

Demand Charges (daily, monthly, for any number of time windows)

Utilization of Renewable Generation (e.g., PV, CHP)

Contracted or Incentive Maneuvers (e.g., DMP and Demand Response)

Minimum Import Constraints

Battery Performance, Degradation Rate, and Cost.

The graph 2500 includes a plot 2501 for building load, a plot 2502 for PV full output, a plot 2503 for PV curtailed output, a plot 2504 for battery, a plot 2505 for net building demand, a plot 2506 for DMP battery power target, a plot 2507 for an energy supply rate (×1000), a plot 2508 for demand rate (×100), and a plot 2509 for the battery SoC (×100).

An EO according to one embodiment of the present disclosure optimizes overall energy economics by blending these factors (and any other factors) simultaneously in real time.

Updating Model Data and Making Predictions

As discussed above with reference to FIGS. 5-7, load and generation predictions may be used when the cost function is evaluated. More detail will here be discussed regarding load and generation predictions.

Figure 26:
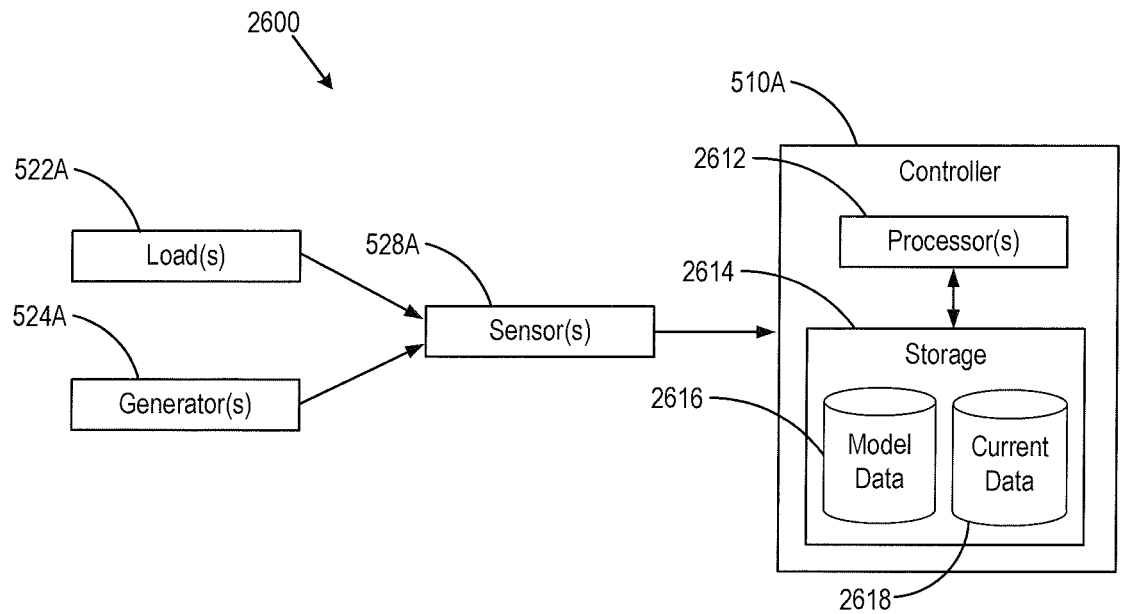
FIG. 26 is a simplified block diagram illustrating an electrical power system, according to one embodiment of the present disclosure.

FIG. 26 is a simplified block diagram illustrating an example of an electrical power system 500A, similar to the electrical power system 500 of FIG. 5. For example, the electrical power system 500A includes one or more loads 522A (sometimes referred to herein as "loads" 522A) operably coupled to one or more sensors 528A (sometimes referred to herein as "sensors" 528A), and a controller 510A operably coupled to the sensors 528A. In some embodiments, the electrical power system 500A may include one or more generators 524A (sometimes referred to herein as "generators" 524A) operably coupled to the sensors 528. The loads 522A, the generators 524A, the sensors 528A, and the controller 510A may be similar to the loads 522, the generators 524, the sensors 528, and the controller 510 discussed above with reference to FIG. 5.

The controller 510A includes one or more processors 2612 (sometimes referred to herein as "processors" 2612) operably coupled to one or more data storage devices 2614 (sometimes referred to herein as "storage" 2614). The storage 2614 is configured to store model data 2616 indicating, for time points of a time period of operation (e.g., one day) of the electrical power system 500A, a model load power for the loads 522A, a model generator power for the generators 524A, or a combination of the model load power and the model generator power. As used herein, the terms "model data," "model load power," and "model generator power" refer to models of typical data (e.g., data indicating typical load power consumed by the loads 522A, typical generator power provided by the generators 524A). This typical data may be produced (e.g., by the processors 2612) using actual measured data measured by the sensors 528A (e.g., average daily load/generator data), may be theoretical data provided by a user of the electrical power system 500A, theoretically estimated data based on estimated power consumption/generation, or combinations thereof. A combination of the model load power and the model generator power may comprise a "net" (e.g., summation) of the model load power and the model generator power, or may comprise a dual model with a representation or model for the model load power and a representation or model for the model generator power. By way of non-limiting example, the processors 2612 may produce or update the model data 2616 using the method 2700 of FIG. 27.

In some embodiments, the model data 2616 includes an aggregation of a plurality of sets of previous data, each of the plurality of sets of previous data including data indicating, for time points of a different previous time period of operation of the electrical power system 500A, a previous load power consumed by the loads 522A, a previous generator power provided by the generators, or a combination of the previous load power and the previous generator power. In some embodiments, the aggregation of the plurality of sets of previous data includes an average of the plurality of sets of previous data. In some embodiments, the average of the plurality of sets of previous data includes a weighted average of the plurality of sets of previous data. In some embodiments, the model data 2616 includes a user defined estimate of a typical load power for the loads 522A, a typical generator power for the generators 524A, or a combination of the typical load power and the typical generator power for the time points of the time period. Many other methods are contemplated for generating the model data 2616. By way of non-limiting example, the model data 2616 may be generated using an output error model, AutoRegressive Moving Average (ARMA) models, other model generation techniques known in the art, or combinations thereof.

The processors 2612 are configured to determine, based on information received from the sensors, current data 2618 including a current load power consumed by the loads 522A, a current generator power provided by the generators 524A, or a combination of the current load power and the current generator power. The current data 2618 may be determined for time points of a current time period of operation of the electrical power system 500A. The current time period corresponds to the time period of the model data 2616.

The processors 2612 are also configured to modify (e.g., update) the model data 2616 by aggregating the model data 2616 with the current data 2618. In some embodiments, the processors 2612 are configured to aggregate the model data 2616 with the current data 2618 by determining a weighted average between the model data 2616 and the current data 2618. In some embodiments, the model data 2616 is weighted more heavily than the current data 2618 in the weighted average. By way of non-limiting example, an IIR filter may be used to update the model data 2616. An expression for the IIR filter may be given as follow:

$$\text{Data}_{Model}(n+1,i) = a_1 \text{Data}_{model}(n,i) + a_2 \text{Data}_{Current}(i)$$

where $\text{Data}_{Model}(n+1,i)$ is the updated model data 2616, $\text{Data}_{Model}(n,i)$ is the model data 2616 prior to being updated, $\text{Data}_{Current}(i)$ is the current data 2618, and $a_1$ and $a_2$ are coefficients of the IIR filter. As a specific non-limiting example, the model data 2616 may be weighed more heavily than the current data 2618 by selecting $a_1 > a_2$ (e.g., $a_1 = 0.95$ and $a_2 = 0.05$).

With the model data 2616 weighed more heavily than the current data 2618 in updating the model data 2616, the model data 2616 may be resilient to non-recurring artifacts of any given current data 2618. If, however, the behavior of the loads 522A and/or the generators 524A manifests recurrent changes, the model data 2616 will gradually incorporate that behavior over several updates of the model data 2616. For example, if $a_1 = 0.95$ and $a_2 = 0.05$, it would take approximately twenty consecutive recurrences (e.g., days) of a changed behavior of the loads 522A and/or the generators 524A for that behavior to show up in 60% of its strength in the model data 2616.

In some embodiments, a number of the time points of the period of time corresponding to the model data 2616 may be different from a number of the time points of the current period of time corresponding to the current data 2628. In such embodiments, the processor 2612 may be configured to interpolate the current data 2618 to include the same number of time points as the model data 2616 before aggregating the model data 2616 with the current data 2618. Moreover, in some embodiments, the time points corresponding to the model data 2616, the time points corresponding to the current data 2618, or a combination thereof may be spaced at non-uniform time intervals. In some embodiments, the time points of the model data 2616, the current data 2618, or a combination thereof may be uniformly spaced at intervals from anywhere between five (5) minutes to 120 minutes.

The processors 2612 may also, as discussed above, determine a set of control values for a set of control variables to effectuate a change to operation of the electrical power system 500A based, at least in part, on the model data.

Figure 27:
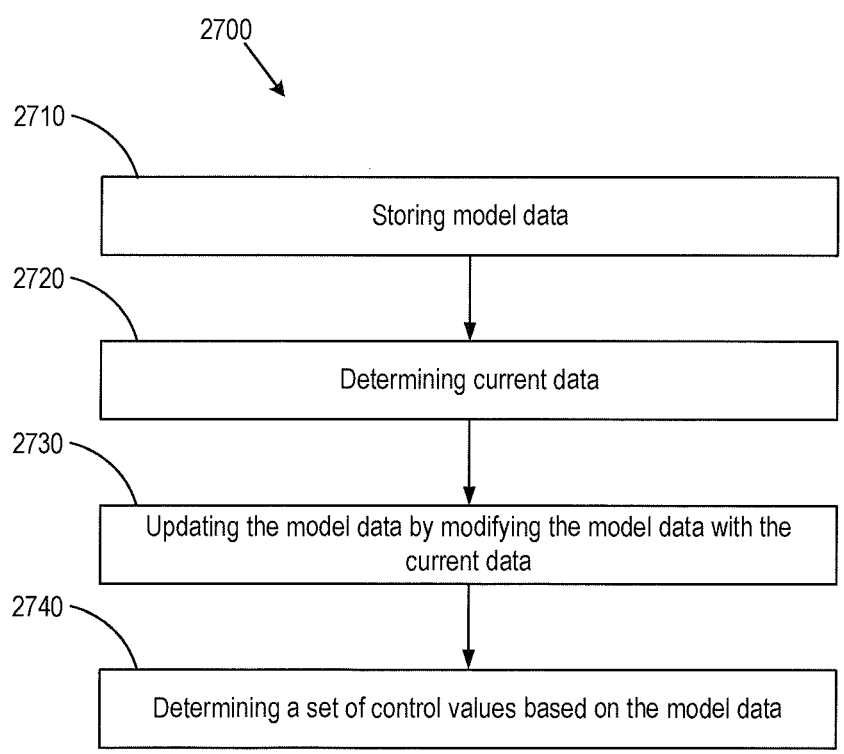
FIG. 27 is a simplified flowchart illustrating a method of operating an electrical power system, according to one embodiment of the present disclosure.

FIG. 27 is a simplified flowchart illustrating a method 2700 of operating an electrical power system (e.g., the electrical power system 500A of FIG. 26). Referring to FIGS. 26 and 27 together, the method includes storing 2710 model data 2616 indicating, for time points of a time period of operation of the electrical power system 500A, a model load power for the loads 522A of the electrical power system 500A, a model generator power for the generators 524A of the electrical power system 500A, or a combination of the model load power and the model generator power.

The method 2700 also includes determining 2720, based on information received from the sensors 528A of the electrical power system 500A, current data 2618 including a current load power consumed by the loads 522A of the electrical power system 500A, a current generator power provided by the generators 524A of the electrical power system 500A, or a combination of the current load power and the current generator power for time points of a current time period of operation of the electrical power system. The current time period can correspond to the time period of the model data 2616. By way of non-limiting example, the current time period may be a current day.

The method 2700 further includes updating 2730 the model data 2616 by modifying (e.g., updating) the model data 2616 with the current data 2618. In some embodiments, updating the model data 2616 includes determining a weighted average between the model data 2616 and the current data 2618 (e.g., using an IIR filter). In some embodiments, determining a weighted average between the model data 2616 and the current data 2618 includes weighing the model data 2616 more heavily than the current data 2618 in the weighted average.

The method 2700 also includes determining 2740 a set of control values (e.g., for a set of control variables) to effectuate a change to operation of the electrical power system 500A based, at least in part, on the model data 2616, as discussed above.

Referring once again to FIG. 26, the model data 2616 may be used to predict behavior of the loads 522A, the generators 524A, or a combination thereof. An example of a method 700 for predicting this behavior is discussed above with reference to FIG. 7. For example, before current data 2618 for the entire period of time corresponding to the model data 2616 has been recorded, future data predicted for the current data may be generated using the method 700 of FIG. 7. For example, the processor 2712 may be configured to determine, based on information received from the sensors 528A, the current data 2618 for time points of the current time period corresponding to an early portion of the time period of the model data 2616. The processor 2612 may also be configured to fit the early portion of the model data 2616 to the current data to produce predicted data. A future portion of the predicted data corresponds to time points occurring in the future with reference to the current data 2618. The processor 2612 may further be configured to determine a set of control values (e.g., for a set of control variables) to effectuate a change to operation of the electrical power system based, at least in part, on the future portion of the predicted data.

In practice, the prediction of the future portion of the predicted data may share some similarities with applying a Kalman filter. For example, the prediction takes into account both model data 2616 and innovations in the form of the current data 2618. The prediction may also involve weighting of the model data 2616 and the current data 2618 in updating the model data 2616, and weighted regressions that favor more recent samples or older samples of the current data 2618. As a result, behavior of the predictions may be somewhat similar to what may be observed if the predictions instead were made using a Kalman filter. The processor 2612, however, may perform the predictions without using a linearized model in the form of $x(k+1)=A*x(k)+B*u$, as is used in Kalman filter implementations. Rather, the processor 2612 may instead use a table of historic average values that represents the model data 2618, which may be an evolution of load power and/or generator power that may not be expressed in linear equation form.

Example Embodiments

The following are some example embodiments within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below (and the above disclosed embodiments) are not combinable, it is contemplated within the scope of the disclosure that such examples and embodiments are combinable.

Example 1: A controller of an electrical power system, the controller comprising: a data storage device configured to store model data indicating, for time points of a time period of operation of the electrical power system, a model load power consumed by one or more loads of the electrical power system, a model generator power provided by one or more generators of the electrical power system, or a combination of the model load power and the model generator power; and a processor operably coupled to the data storage device and configured to: determine, based on information received from one or more sensors of the electrical power system, current data including a current load power consumed by the one or more loads of the electrical power system, a current generator power provided by the one or more generators of the electrical power system, or a combination of the current load power and the current generator power for time points of a current time period of operation of the electrical power system, the current time period corresponding to the time period of the model data stored by the data storage device; modify the model data by aggregating the model data with the current data; and determine a set of control values for a set of control variables to effectuate a change to operation of the electrical power system based, at least in part, on the model data.

Example 2: The controller of Example 1, wherein the model data includes an aggregation of a plurality of sets of previous data, each of the plurality of sets of previous data including data indicating, for time points of a different previous time period of operation of the electrical power system, a previous load power consumed by the one or more loads, a previous generator power provided by the one or more generators, or a combination of the previous load power and the previous generator power.

Example 3: The controller of Example 2, wherein the aggregation of the plurality of sets of previous data includes an average of the plurality of sets of previous data.

Example 4: The controller of Example 3, wherein the average of the plurality of sets of previous data includes a weighted average of the plurality of sets of previous data.

Example 5: The controller of Example 1, wherein the model data includes a user defined estimate of a typical load power consumed by the one or more loads of the electrical power system, a typical generator power provided by the one or more generators of the electrical power system, or a combination of the typical load power and the typical generator power for the time points of the time period.

Example 6: The controller of Example 1, wherein the processor is configured to aggregate the model data with the current data by determining a weighted average between the model data and the current data.

Example 7: The controller of Example 5, wherein the model data is weighted more heavily than the current data in the weighted average.

Example 8: The controller of Example 1, wherein: a number of the time points of the period of time corresponding to the model data is different from a number of the time points of the current period of time corresponding to the current data; and the processor is configured to interpolate the current data to include the same number of time points as the model data before aggregating the model data with the current data.

Example 9: The controller of Example 1, wherein at least one of the time points or the current time points are spaced at non-uniform time intervals.

Example 10: The controller of Example 1, wherein at least one of the time points or the current time points are spaced at uniformly spaced intervals comprising a range of five (5) minute to 120 minute intervals.

Example 11: The controller of Example 1, wherein the processor is configured to aggregate the model data with the current data using an infinite impulse response (IIR) filter.

Example 12: The controller of Example 11, wherein a coefficient of the IIR filter multiplied by the model data is 0.95 and a coefficient of the IIR filter multiplied by the current data is 0.05.

Example 13: The controller of Example 1, wherein the time period and the current time period each correspond to one day.

Example 14: An electrical power system, comprising: one or more loads; one or more sensors operably coupled to the one or more loads and configured to measure power consumed by the one or more loads; and a controller operably coupled to the one or more sensors, the controller configured to: store model data indicating, for time points of a time period of operation of the electrical power system, a model load power consumed by the one or more loads; determine, based on information received from the one or more sensors, current data indicating a current load power consumed by the one or more loads for time points of a current time period of operation of the electrical power system, the current time period corresponding to the time period of the model data stored by the data storage device; update the model data based, at least in part, on the current data; and determine a set of control values for a set of control variables to effectuate a change to operation of the electrical power system based, at least in part, on the model data.

Example 15: The electrical power system of Example 14, further comprising: one or more generators operably coupled to the one or more sensors and configured to provide power; wherein: the one or more sensors are configured to measure the power provided by the one or more generators; the model data also indicates, for the time points of the time period, a model generator power provided by the one or more generators; and the current data also indicates a current generator power provided by the one or more generators for the time points of the current time period.

Example 16: The electrical power system of Example 15, wherein the one or more generators include one or more of a solar photovoltaic (PV) system, a wind generator, a combined heat and power (CHP) system, or a diesel generator.

Example 17: The electrical power system of Example 14, wherein the one or more loads include one or more of an air conditioning system, a motor, or an electric heater.

Example 18: A method of operating an electrical power system, the method comprising: storing model data indicating, for time points of a time period of operation of the electrical power system, a model load power consumed by one or more loads of the electrical power system, a model generator power provided by one or more generators of the electrical power system, or a combination of the model load power and the model generator power; determining, based on information received from one or more sensors of the electrical power system, current data including a current load power consumed by the one or more loads of the electrical power system, a current generator power provided by the one or more generators of the electrical power system, or a combination of the current load power and the current generator power for time points of a current time period of operation of the electrical power system, the current time period corresponding to the time period of the model data; updating the model data by modifying the model data with the current data; and determine a set of control values for a set of control variables to effectuate a change to operation of the electrical power system based, at least in part, on the model data.

Example 19: The method of Example 18, wherein updating the model data includes determining a weighted average between the model data and the current data.

Example 20: The method of Example 19, wherein determining a weighted average between the model data and the current data includes weighing the model data more heavily than the current data in the weighted average.

Example 21: A controller of an electrical power system, the controller comprising: a data storage device configured to store model data indicating, for time points of a time period of operation of the electrical power system, a model load power consumed by one or more loads of the electrical power system; and a processor operably coupled to the data storage device and configured to: determine, based on information received from one or more sensors of the electrical power system, current data including a current load power consumed by the one or more loads for time points of a current time period of operation of the electrical power system, the current time period corresponding to an early portion of the time period of the model data stored by the data storage device; fit the model data to the current data to produce predicted data, a future portion of the predicted data corresponding to time points occurring after the early portion of the time period of the model data; and determine a set of control values for a set of control variables to effectuate a change to operation of the electrical power system based, at least in part, on the future portion of the predicted data.

Example 22: The controller of Example 21, wherein the processor is configured to fit the model data to the current data to produce the predicted data by performing a least squares regression to determine a scale and offset of the model data that minimize a sum of squares of error between the model data and the current data.

Example 23: The controller of Example 21, wherein the least squares regression comprises a weighted least squares regression that favors more recent samples of the current data than older samples of the current data.

Example 24: The controller of Example 21, wherein the processor is configured to interpolate the model data to have a same time step length between samples as the current data.

Example 25: The controller of Example 24, wherein the processor is configured to interpolate the model data using a linear interpolation.

Example 26: The controller of Example 24, wherein the processor is configured to interpolate the model data using a nonlinear interpolation.

Example 27: The controller of Example 21, wherein an amount of time corresponding to the early portion of the time period is about three (3) hours to about eighteen (18) hours.

Example 28: The controller of Example 21, wherein: the model data indicates a plurality of different load power profiles of power consumed by the one or more loads of the electrical power system; and the processor is configured to select one of the different load power profiles that fits the current data better than the others of the different load power profiles to fit to the current data to produce the predicted data.

Example 29: The controller of Example 28, wherein one of the different load power profiles corresponds to a weekday and another of the different load power profiles corresponds to a weekend day.

Example 30: The controller of Example 21, wherein: the model data also indicates a model generator power provided by one or more generators of the electrical power system for the time points of the time period of operation of the electrical power system; and the processor is configured to determine, based on the information received from the one or more sensors of the electrical power system, current generator data of the current data including a current generator power provided by the one or more generators for the time points of the current time period of operation of the electrical power system.

Example 31: The controller of Example 21, wherein the time period of operation of the electrical power system corresponding to the model data spans about twenty-four (24) hours.

Example 32: An electrical power system, comprising: one or more loads; one or more sensors operably coupled to the one or more loads and configured to measure power consumed by the one or more loads; and a controller operably coupled to the one or more sensors, the controller configured to: store model data indicating, for time points of a time period of operation of the electrical power system, a model load power consumed by the one or more loads; determine, based on information received from the one or more sensors, current data including a current load power consumed by the one or more loads for time points of a current time period of operation of the electrical power system, the current time period corresponding to an early portion of the time period of the model data stored by the data storage device; fit the model data to the current data to produce predicted data, a future portion of the predicted data corresponding to time points occurring after the early portion of the time period of the model data; and determine a set of control values for a set of control variables to effectuate a change to operation of the electrical power system based, at least in part, on the future portion of the predicted data.

Example 33: The electrical power system of Example 32, further comprising: one or more generators operably coupled to the one or more sensors and configured to provide power; wherein: the one or more sensors are configured to measure power provided by the one or more loads; the model data also indicates, for the time points of the time period, a model generator power provided by the one or more generators; and the current data also indicates a current generator power provided by the one or more generators for the time points of the current time period.

Example 34: The electrical power system of Example 33, wherein the one or more generators include one or more of a solar photovoltaic (PV) system, a wind generator, a combined heat and power (CHP) system, or a diesel generator.

Example 35: The electrical power system of Example 32, wherein the one or more loads include one or more of an air conditioning system, a motor, or an electric heater.

Example 36: A method of operating an electrical power system, the method comprising: storing current data indicating power consumed by one or more loads at a first plurality of different points of time over a previous number of hours of operation; interpolating model data indicating a historic average power consumed by the one or more loads at a second plurality of different points of time over a time span to have an interval of discretization that is the same as that of the current data, a subset of the time span corresponding to the previous number of hours of operation; determining a scale and an offset of the interpolated model data that fits a subset of the interpolated model data corresponding to the subset of the time span to the current data; scaling and offsetting the interpolated model data to produce predicted data, a future portion of the predicted data comprising future data; and determining a set of control values for a set of control variables to effectuate a change to operation of the electrical power system based, at least in part, on the future data.

Example 37: The method of Example 36, wherein storing current data indicating power consumed by one or more loads at a first plurality of different points of time over a previous number of hours of operation comprises storing the current data indicating the power consumed by the one or more loads over a period of about three (3) to eighteen (18) hours.

Example 38: The method of Example 36, wherein interpolating model data includes interpolating the model data from having the interval of discretization between five (5) minutes and 120 minutes.

Example 39: The method of Example 36, wherein interpolating model data includes linearly interpolating the model data.

Example 40: The method of Example 36, wherein determining a scale and an offset of the interpolated model data comprises performing a weighted least squares regression that favors more recent observations of the current data.

Example 41: A load learning engine of a controller of an electrical power system, comprising: a data storage device configured to store model data indicating, for time points of a time period of operation of the electrical power system, a model load power of one or more loads of the electrical power system, a model generator power of one or more generators of the electrical power system, or a combination of the model load power and the model generator power; and a processor operably coupled to the data storage device and configured to: determine, based on information received from one or more sensors of the electrical power system, current data including a current load power of the one or more loads of the electrical power system, a current generator power of the one or more generators of the electrical power system, or a combination of the current load power and the current generator power for time points of a current time period of operation of the electrical power system, the current time period corresponding to the time period of the model data stored by the data storage device; update the model data by aggregating the model data with the current data; and communicate updated model data for the controller to determine a set of control values to effectuate a change to operation of the electrical power system based on the updated model data.

Example 42: A control system to control an electrical power system, comprising: one or more sensors operably coupled to one or more loads of the electrical power system and configured to measure power consumed by the one or more loads; and a controller operably coupled to the one or more sensors, the controller configured to: store model data indicating, for time points of a time period of operation of the electrical power system, a model load power consumed by the one or more loads; determine, based on information received from the one or more sensors, current data indicating a current load power consumed by the one or more loads for time points of a current time period of operation of the electrical power system, the current time period corresponding to the time period of the model data stored by the data storage device; update the model data based, at least in part, on the current data; and communicate one or more control values to effectuate a change to operation of the electrical power system, the one or more control values determined, at least in part, based on the model data.

Example 43: A method of learning behavior of an electrical power system, the method comprising: storing model data indicating, for time points of a time period of operation of the electrical power system, a model load power consumed by one or more loads of the electrical power system, a model generator power provided by one or more generators of the electrical power system, or a combination of the model load power and the model generator power; determining, based on information received from one or more sensors of the electrical power system, current data including a current load power consumed by the one or more loads of the electrical power system, a current generator power provided by the one or more generators of the electrical power system, or a combination of the current load power and the current generator power for time points of a current time period of operation of the electrical power system, the current time period corresponding to the time period of the model data; and updating the model data by modifying the model data with the current data.

Example 44: A control system to control an electrical power system, comprising: one or more sensors operably coupled to one or more loads and configured to measure power consumed by the one or more loads; and a controller operably coupled to the one or more sensors, the controller configured to: store model data indicating, for time points of a time period of operation of the electrical power system, a model load power consumed by the one or more loads; determine, based on information received from the one or more sensors, current data including a current load power consumed by the one or more loads for time points of a current time period of operation of the electrical power system, the current time period corresponding to an early portion of the time period of the model data stored by the data storage device; fit the model data to the current data to produce predicted data, a future portion of the predicted data corresponding to time points occurring after the early portion of the time period of the model data; and communicate a set of control values to effectuate a change to operation of the electrical power system, the set of control values determined, at least in part, based on the future portion of the predicted data.

Example 45: A method of predicting behavior of an electrical power system, the method comprising: storing current data indicating power consumed by one or more loads at a first plurality of different points of time over a previous number of hours of operation; interpolating model data indicating a historic average power consumed by the one or more loads at a second plurality of different points of time over a time span to have an interval of discretization that is the same as that of the current data, a subset of the time span corresponding to the previous number of hours of operation; determining a scale and an offset of the interpolated model data that fits a subset of the interpolated model data corresponding to the subset of the time span to the current data; and scaling and offsetting the interpolated model data to produce predicted data, a future portion of the predicted data comprising future data.

The described features, operations, or characteristics may be arranged and designed in a wide variety of different configurations and/or combined in any suitable manner in one or more embodiments. Thus, the detailed description of the embodiments of the systems and methods is not intended to limit the scope of the disclosure, as claimed, but is merely representative of possible embodiments of the disclosure. In addition, it will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable storage medium having stored instructions thereon that may be used to program a computer (or other electronic device) to perform processes described herein. The computer-readable storage medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of medium/machine-readable medium suitable for storing electronic instructions.

As used herein, a software module or component may include any type of computer instruction or computer executable code located within a memory device and/or computer-readable storage medium. A software module may, for instance, comprise one or more physical or logical blocks of computer instructions, which may be organized as a routine, program, object, component, data structure, etc., that performs one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

The foregoing specification has been described with reference to various embodiments, including the best mode. However, those skilled in the art appreciate that various modifications and changes can be made without departing from the scope of the present disclosure and the underlying principles of the invention. Accordingly, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection.

Principles of the present disclosure may be reflected in a computer program product on a tangible computer-readable storage medium having computer-readable program code means embodied in the storage medium. Any suitable computer-readable storage medium may be utilized, including magnetic storage devices (hard disks, floppy disks, and the like), optical storage devices (CD-ROMs, DVDs, Blu-Ray discs, and the like), flash memory, and/or the like. These computer program instructions may be loaded onto a general purpose computer, special purpose computer, or other programmable data processing apparatus to produce a machine, such that the instructions that execute on the computer or other programmable data processing apparatus create means for implementing the functions specified. These computer program instructions may also be stored in a computer-readable memory that can direct a computer or other programmable data processing apparatus to function in a particular manner, such that the instructions stored in the computer-readable memory produce an article of manufacture including instruction means which implement the function specified. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified.

Principles of the present disclosure may be reflected in a computer program implemented as one or more software modules or components. As used herein, a software module or component (e.g., engine, system, subsystem) may include any type of computer instruction or computer-executable code located within a memory device and/or computer-readable storage medium. A software module may, for instance, comprise one or more physical or logical blocks of computer instructions, which may be organized as a routine, a program, an object, a component, a data structure, etc., that perform one or more tasks or implement particular data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Suitable software to assist in implementing the invention is readily provided by those of skill in the pertinent art(s) using the teachings presented here and programming languages and tools, such as Java, Pascal, C++, C, database languages, APIs, SDKs, assembly, firmware, microcode, and/or other languages and tools.

Embodiments as disclosed herein may be computer-implemented in whole or in part on a digital computer. The digital computer includes a processor performing the required computations. The computer further includes a memory in electronic communication with the processor to store a computer operating system. The computer operating systems may include, but are not limited to, MS-DOS, Windows, Linux, Unix, AIX, CLIX, QNX, OS/2, and Apple. Alternatively, it is expected that future embodiments will be adapted to execute on other future operating systems.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Various operational steps, as well as components for carrying out operational steps, may be implemented in alternate ways depending upon the particular application or in consideration of any number of cost functions associated with the operation of the system, e.g., one or more of the steps may be deleted, modified, or combined with other steps.

While the principles of this disclosure have been shown in various embodiments, many modifications of structure, arrangements, proportions, the elements, materials and components, used in practice, which are particularly adapted for a specific environment and operating requirements, may be used without departing from the principles and scope of this disclosure. These and other changes or modifications are intended to be included within the scope of the present disclosure.

The scope of the present invention should, therefore, be determined only by the following claims.

The invention claimed is:

1. A controller of an electrical power system, the controller comprising:
   a data storage device configured to store model data indicating, for sub-intervals within a period, a typical load power for one or more loads of the electrical power system; and
   a processor operably coupled to the data storage device, the processor to:
      receive observed power data indicating, for one or more of the sub-intervals corresponding with the model data, a measured load power of the electrical power system;
      incorporate the observed power data into the model data;
      determine a scaling factor and offset parameters to minimize an error quantity between the model data and the observed power data when the model data and the observed power data are in phase;
      apply the scaling factor and the offset parameters to a typical model data to produce adjusted model data;
      forecast a future power data point corresponding to a future time point based on the sub-interval of the adjusted model data corresponding to the future time point; and
      provide, using at least the future power data point, a variable to control the electrical power system.

2. The controller of claim 1, wherein the period is one day.

3. The controller of claim 1, wherein incorporating the observed power data into the model data comprises averaging all data points from the stored actual measured power data within a same sub-interval.

4. The controller of claim 1, wherein incorporating of the observed power data into the typical model data comprises application of a first-order infinite impulse response filter.

5. The controller of claim 1, wherein the error quantity comprises the sum of the squares of the difference between the adjusted model data and the observed power data.

6. The controller of claim 1, wherein forecasting the future power data point involves transforming the adjusted model data at the future time point based on one or more of:
   a time difference between the future time point and a most recent electrical system power measurement, and
   a difference between the adjusted model data and the model data.

7. A method for controlling an electrical power system, the method comprising:
   storing model data indicating, for sub-intervals within a period, a typical load power for one or more loads of the electrical power system; and
   receiving observed power data indicating, for one or more of the sub-intervals corresponding with the model data, a measured load power of the electrical power system;
   incorporating the observed power data into the model data;
   determining a scaling factor and offset parameters to minimize an error quantity between the model data and the observed power data when the model data and the observed power data are in phase;
   applying the scaling factor and the offset parameters to a typical model data to produce adjusted model data;
   forecasting a future power data point corresponding to a future time point based on the sub-interval of the adjusted model data corresponding to the future time point; and
   providing, based at least on the future power data point, a variable to control the electrical power system.

8. The method of claim 7, wherein the period is one day.

9. The method of claim 7, wherein incorporating the observed power data into the model data comprises averaging all data points from the stored actual measured power data within a same sub-interval.

10. The method of claim 7, wherein incorporating of the observed power data into the typical model data comprises application of a first-order infinite impulse response filter.

11. The method of claim 7, wherein the error quantity comprises the sum of the squares of the difference between the adjusted model data and the observed power data.

12. The method of claim 7, wherein forecasting the future power data point involves transforming the adjusted model data at the future time point based on one or more of:
   a time difference between the future time point and a most recent electrical system power measurement, and
   a difference between the adjusted model data and the model data.

13. A non-transitory computer-readable storage medium, the computer-readable storage medium including instructions that when executed by a computer, cause the computer to:
   store model data indicating, for sub-intervals within a period, a typical load power for one or more loads of the electrical power system; and
   receive observed power data indicating, for one or more of the sub-intervals corresponding with the model data, a measured load power of the electrical power system;
   incorporate the observed power data into the model data;
   determine a scaling factor and offset parameters to minimize an error quantity between the model data and the observed power data when the model data and the observed power data are in phase;
   apply the scaling factor and the offset parameters to a typical model data to produce adjusted model data;
   forecast a future power data point corresponding to a future time point based on the sub-interval of the adjusted model data corresponding to the future time point; and
   provide, based at least on the future power data point, a variable to control the electrical power system.

14. The non-transitory computer-readable storage medium of claim 13, wherein the period is one day.

15. The non-transitory computer-readable storage medium of claim 13, wherein incorporating the observed power data into the model data comprises averaging all data points from the stored actual measured power data within a same sub-interval.

16. The non-transitory computer-readable storage medium of claim 13, wherein incorporating of the observed power data into the typical model data comprises application of a first-order infinite impulse response filter.

17. The non-transitory computer-readable storage medium of claim 13, wherein the error quantity comprises the sum of the squares of the difference between the adjusted model data and the observed power data.

18. The non-transitory computer-readable storage medium of claim 13, wherein forecasting the future power data point involves transforming the adjusted model data at the future time point based on one or more of:
   a time difference between the future time point and a most recent electrical system power measurement, and
   a difference between the adjusted model data and the model data.

* * * * *